(12) United States Patent
Eguchi

(10) Patent No.: US 8,133,749 B2
(45) Date of Patent: Mar. 13, 2012

(54) SEMICONDUCTOR DEVICE AND METHOD FOR MANUFACTURING THE SAME

(75) Inventor: Shingo Eguchi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 103 days.

(21) Appl. No.: 12/429,201

(22) Filed: Apr. 24, 2009

(65) Prior Publication Data

US 2009/0267225 A1     Oct. 29, 2009

(30) Foreign Application Priority Data

Apr. 25, 2008  (JP) ................................. 2008-114882
Apr. 25, 2008  (JP) ................................. 2008-114883

(51) Int. Cl.
  *H01L 21/84*          (2006.01)
(52) U.S. Cl. .................. 438/30; 438/151; 257/E21.561; 257/347
(58) Field of Classification Search .......... 438/151–166, 438/30; 257/E21.561, 347
  See application file for complete search history.

(56) References Cited

U.S. PATENT DOCUMENTS

| | | |
|---|---|---|
| 5,075,166 A | 12/1991 | Sikorski et al. |
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 6,118,502 A | 9/2000 | Yamazaki et al. |
| 6,127,199 A * | 10/2000 | Inoue et al. ..................... 438/30 |
| 6,224,965 B1 | 5/2001 | Haas et al. |
| 6,376,333 B1 | 4/2002 | Yamazaki et al. |
| 6,403,221 B1 | 6/2002 | Nakamura et al. |
| 6,509,217 B1 * | 1/2003 | Reddy ............................ 438/153 |
| 6,762,508 B1 | 7/2004 | Kiso et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |

(Continued)

FOREIGN PATENT DOCUMENTS

EP          0939441           9/1999

(Continued)

OTHER PUBLICATIONS

Invitation to pay additional fees (Application No. PCT/JP2009/057940), International Searching Authority, dated Jun. 2, 2009.

(Continued)

*Primary Examiner* — Richard A. Booth
(74) *Attorney, Agent, or Firm* — Eric J. Robinson; Robinson Intellectual Property Law Office, P.C.

(57) ABSTRACT

In a semiconductor integrated circuit sandwiched between a pair of a first impact resistance layer and a second impact resistance layer, an impact diffusion layer is provided between the semiconductor integrated circuit and the second impact resistance layer. By provision of the impact resistance layer against the external stress and the impact diffusion layer for diffusing the impact, force applied to the semiconductor integrated circuit per unit area is reduced, so that the semiconductor integrated circuit is protected. The impact diffusion layer preferably has a low modulus of elasticity and high breaking modulus.

41 Claims, 22 Drawing Sheets

U.S. PATENT DOCUMENTS

| | | |
|---|---|---|
| 7,487,373 B2 | 2/2009 | Koyama |
| 2003/0032210 A1 | 2/2003 | Takayama et al. |
| 2003/0071953 A1 | 4/2003 | Yamazaki et al. |
| 2004/0016939 A1 | 1/2004 | Akiba et al. |
| 2004/0229404 A1 | 11/2004 | Kiso et al. |
| 2005/0070038 A1 | 3/2005 | Yamazaki et al. |
| 2005/0085034 A1 | 4/2005 | Akiba et al. |
| 2005/0162578 A1 | 7/2005 | Yamazaki et al. |
| 2005/0233122 A1 | 10/2005 | Nishimura et al. |
| 2006/0011288 A1 | 1/2006 | Watanabe et al. |
| 2007/0004125 A1 | 1/2007 | Watanabe et al. |
| 2007/0044303 A1 | 3/2007 | Yamano |
| 2007/0077691 A1 | 4/2007 | Watanabe |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0093464 A1 | 4/2008 | Dairiki et al. |
| 2008/0179679 A1* | 7/2008 | Grudowski et al. ........... 257/351 |
| 2008/0224941 A1 | 9/2008 | Sugiyama et al. |
| 2008/0303140 A1 | 12/2008 | Ohtani et al. |

FOREIGN PATENT DOCUMENTS

| | | |
|---|---|---|
| EP | 1092739 | 4/2001 |
| EP | 1589797 | 10/2005 |
| EP | 1758438 | 2/2007 |
| EP | 1970951 | 9/2008 |
| JP | 05-190582 | 7/1993 |
| JP | 08-250745 | 9/1996 |
| JP | 08-288522 | 11/1996 |
| JP | 09-156265 A | 6/1997 |
| JP | 10-092980 | 4/1998 |
| JP | 10-211784 A | 8/1998 |
| JP | 2000-231619 | 8/2000 |
| JP | 2001-277726 | 10/2001 |
| JP | 2003-141486 A | 5/2003 |
| JP | 2003-174153 | 6/2003 |
| JP | 2004-118255 | 4/2004 |
| JP | 2004-362341 | 12/2004 |
| JP | 2006-139802 | 6/2006 |
| JP | 2007-123859 A | 5/2007 |
| WO | WO-96/09158 | 3/1996 |
| WO | WO 01/01740 | 1/2001 |
| WO | WO 04/001848 | 12/2003 |
| WO | WO-2006/038438 A | 4/2006 |
| WO | WO-2007/043285 A | 4/2007 |

OTHER PUBLICATIONS

International Search Report (Application No. PCT/JP2009/057940) Dated Aug. 4, 2009.

Written Opinion (Application No. PCT/JP2009/057940) Dated Aug. 4, 2009.

* cited by examiner

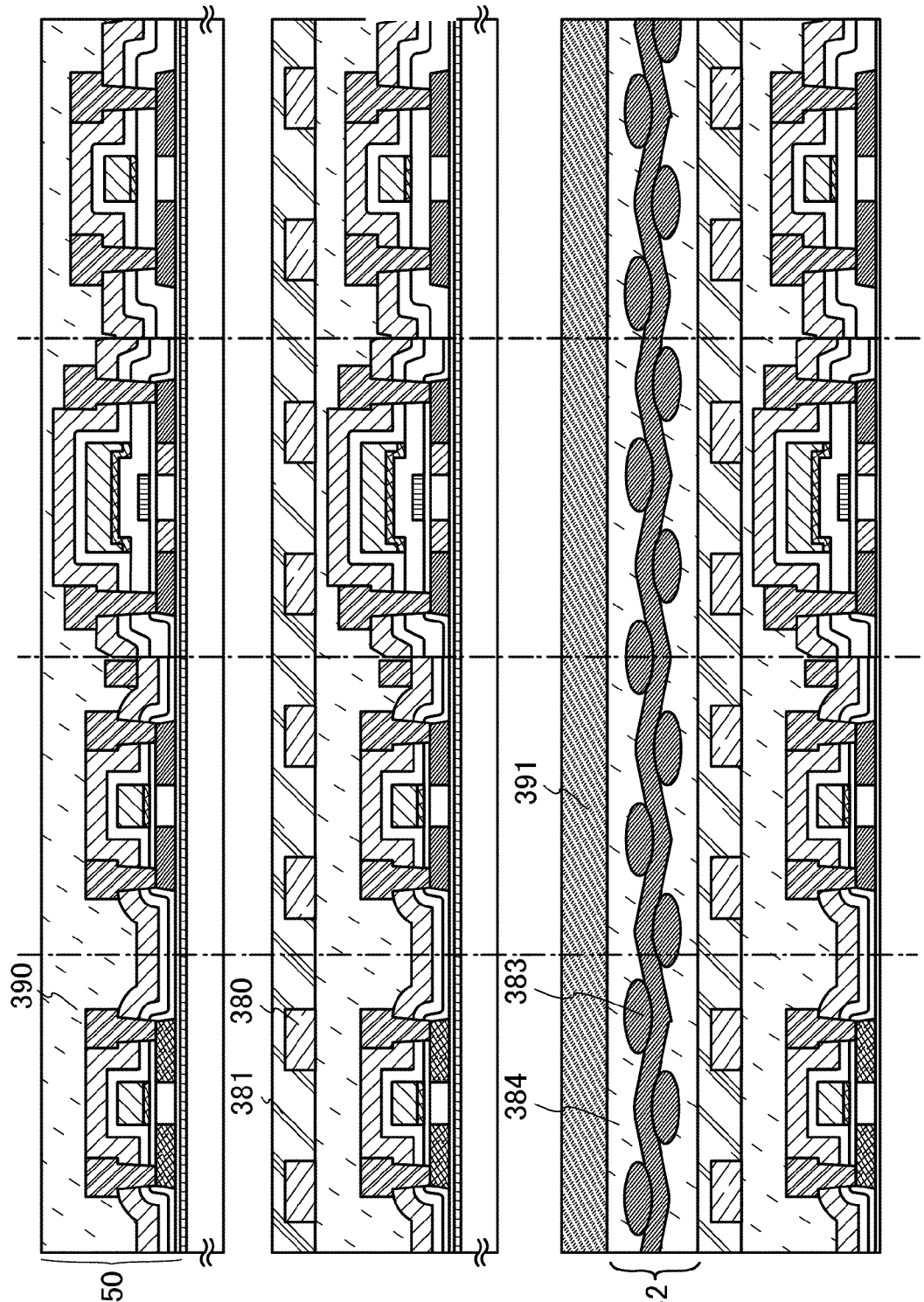

270  271   253           254

SEMICONDUCTOR DEVICE AND METHOD FOR MANUFACTURING THE SAME

TECHNICAL FIELD

The present invention relates to semiconductor devices and methods for manufacturing the same.

BACKGROUND ART

It is important to increase strength against stress from the outside, for semiconductor integrated circuit chips (also referred to as IC chips) with which reduction in thickness and size is attempted.

In order to increase the strength of the chips, a variety of methods for reinforcing the chips are proposed (see Reference 1: Japanese Published Patent Application No. 2006-139802). For example, in Reference 1, a method in which a chip is sandwiched between reinforcement metal plates and covered with a sealing resin to be hardened is reported.

DISCLOSURE OF INVENTION

However, there is a problem in that a semiconductor device becomes to be thick and to have a larger size by provision of the reinforcement metal plates.

Accordingly, an object of an embodiment of the present invention is to provide a highly reliable semiconductor device which has strength while reduction in thickness and size is achieved. Another object of an embodiment of the present invention is to manufacture a semiconductor device with a high yield by preventing defects of a shape and characteristics in a manufacture process.

An impact resistance layer against force applied from the outside (also referred to as external stress) and an impact diffusion layer for diffusing the force are provided in the semiconductor device. With the impact resistance layer and the impact diffusion layer, force which is applied locally can be reduced, so that damage and deterioration in characteristics of the semiconductor device can be prevented.

In the semiconductor device, a semiconductor integrated circuit is sandwiched between a pair of impact resistance layers and a pair of impact diffusion layers. The semiconductor integrated circuit is formed over a substrate, bonded to an impact resistance layer, and then separated from the substrate. In this specification, a surface generated, on the semiconductor integrated circuit, by separating the semiconductor integrated circuit from the substrate is referred to as a separation surface. The separation surface of the semiconductor integrated circuit is in contact with an impact diffusion layer (a second impact diffusion layer), and the other surface of the semiconductor integrated circuit is in contact with an impact resistance layer (a first impact resistance layer). A first impact diffusion layer is provided on an outer side (on the side opposite to the side where the semiconductor integrated circuit is provided) of the first impact resistance layer, and a second impact resistance layer is provided on an outer side (on the side opposite to the side where the semiconductor integrated circuit is provided) of the second impact diffusion layer.

In a semiconductor device, a semiconductor integrated circuit is sandwiched between a pair of impact resistance layers, and an impact diffusion layer is provided in contact with the semiconductor integrated circuit. Alternatively, the semiconductor integrated circuit may be sandwiched between a pair of impact resistance layers and a pair of impact diffusion layers. A first impact diffusion layer is provided on an outer side (on the side opposite to the side where the semiconductor integrated circuit is provided) of a first impact resistance layer, and a second impact resistance layer is provided on an outer side (on the side opposite to the side where the semiconductor integrated circuit is provided) of a second impact diffusion layer.

The semiconductor integrated circuit is formed over a substrate, bonded to the impact resistance layer, and then separated from the substrate. In this specification, a surface generated, on the semiconductor integrated circuit, by separating the semiconductor integrated circuit from the substrate is referred to as a separation surface. The separation surface of the semiconductor integrated circuit is in contact with the impact diffusion layer (the second impact diffusion layer), and the other surface of the semiconductor integrated circuit is in contact with the impact resistance layer (the first impact resistance layer).

As the impact resistance layer, a structure body in which a fibrous body is impregnated with an organic resin can be used. The impact resistance layer preferably has a modulus of elasticity of 13 GPa or higher and a modulus of rupture of lower than 300 MPa.

As the impact diffusion layer, it is preferable to use a material having a low modulus of elasticity and high breaking strength, and a film with rubber elasticity is preferably used. The impact diffusion layer preferably has a modulus of elasticity of from 5 GPa to 12 GPa and a modulus of rupture of 300 MPa or higher.

The impact diffusion layer is preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. By provision of the impact diffusion layer formed from a high-strength material having elasticity, a load such as local pressing force is diffused through the whole of a layer and absorbed, so that damage of the semiconductor device can be prevented.

More specifically, as the impact diffusion layer, an aramid resin, a polyethylene naphthalate (PEN) resin, a polyether sulfone (PES) resin, a polyphenylene sulfide (PPS) resin, a polyimide (PI) resin, or the like can be used.

In this specification, the term "transfer" (also referred to as transpose) indicates to separate a semiconductor integrated circuit formed over a substrate from the substrate and move the semiconductor integrated circuit to another substrate. In other words, the term "transfer" indicates to move a position where the semiconductor integrated circuit is provided to another substrate.

An embodiment of a semiconductor device according to the present invention includes a semiconductor integrated circuit sandwiched between a pair of a first impact resistance layer and a second impact resistance layer and an impact diffusion layer between the semiconductor integrated circuit and the second impact resistance layer. The impact diffusion layer has a lower modulus of elasticity and higher breaking strength than the first impact resistance layer and the second impact resistance layer.

Another embodiment of a semiconductor device according to the present invention includes a semiconductor integrated circuit sandwiched between a pair of a first impact resistance layer and a second impact resistance layer, an impact diffusion layer between the semiconductor integrated circuit and the second impact resistance layer, and an adhesive layer between the semiconductor integrated circuit and the impact diffusion layer. The impact diffusion layer has a lower modulus of elasticity and higher breaking strength than the first impact resistance layer and the second impact resistance layer.

Another embodiment of a semiconductor device according to the present invention includes a semiconductor integrated circuit sandwiched between a pair of a first impact resistance layer and a second impact resistance layer, a first impact diffusion layer on a surface, which is opposite to a surface where the semiconductor integrated circuit is provided, of the first impact resistance layer, and a second impact diffusion layer between the semiconductor integrated circuit and the second impact resistance layer. The first impact diffusion layer and the second impact diffusion layer have a lower modulus of elasticity and higher breaking strength than the first impact resistance layer and a second impact resistance layer.

Another embodiment of a semiconductor device according to the present invention includes a semiconductor integrated circuit sandwiched between a pair of a first impact resistance layer and a second impact resistance layer, a first impact diffusion layer on a surface, which is opposite to a surface where the semiconductor integrated circuit is provided, of the first impact resistance layer, a second impact diffusion layer between the semiconductor integrated circuit and the second impact resistance layer, and an adhesive layer between the semiconductor integrated circuit and the second impact diffusion layer. The first impact diffusion layer and the second impact diffusion layer have a lower modulus of elasticity and higher breaking strength than the first impact resistance layer and the second impact resistance layer.

In the above-described structures, the semiconductor device may be provided with an antenna which receives or transmits a signal from/to the outside. For example, an antenna may be provided between the semiconductor integrated circuit and the first impact resistance layer. In addition, a protective layer may be provided over the semiconductor integrated circuit, and for example, an inorganic insulating layer may be formed as the protective layer so as to cover the antenna provided over the integrated circuit.

Another embodiment of a method for manufacturing a semiconductor device according to the present invention includes the following steps: a semiconductor integrated circuit is formed over a substrate with a separation layer interposed between the substrate and the semiconductor integrated circuit; a first impact resistance layer is bonded to the semiconductor integrated circuit; the semiconductor integrated circuit is separated from the substrate; a second impact resistance layer and an impact diffusion layer are bonded; and the impact diffusion layer which is bonded to the second impact resistance layer is bonded to the semiconductor integrated circuit which is separated from the substrate. The impact diffusion layer has a lower modulus of elasticity and higher breaking strength than the first impact resistance layer and the second impact resistance layer.

Another embodiment of a method for manufacturing a semiconductor device according to the present invention includes the following steps: a semiconductor integrated circuit is formed over a substrate with a separation layer interposed between the substrate and the semiconductor integrated circuit; a first impact resistance layer is bonded to the semiconductor integrated circuit by heat and pressure treatment; the semiconductor integrated circuit is separated from the substrate; a second impact resistance layer and an impact diffusion layer are bonded by heat and pressure treatment; and the impact diffusion layer which is bonded to the second impact resistance layer is bonded to the semiconductor integrated circuit which is separated from the substrate with an adhesive layer. The impact diffusion layer has a lower modulus of elasticity and higher breaking strength than the first impact resistance layer and the second impact resistance layer.

Another embodiment of a method for manufacturing a semiconductor device according to the present invention includes the following steps: a semiconductor integrated circuit is formed over a substrate with a separation layer interposed between the substrate and the semiconductor integrated circuit; a first impact resistance layer is bonded to the semiconductor integrated circuit; a first impact diffusion layer is bonded to the first impact resistance layer; the semiconductor integrated circuit is separated from the substrate; a second impact resistance layer and a second impact diffusion layer are bonded; and the second impact diffusion layer which is bonded to the second impact resistance layer is bonded to the semiconductor integrated circuit which is separated from the substrate. The first impact diffusion layer and the second impact diffusion layer have a lower modulus of elasticity and higher breaking strength than the first impact resistance layer and the second impact resistance layer.

Another embodiment of a method for manufacturing a semiconductor device according to the present invention includes the following steps: a semiconductor integrated circuit is formed over a substrate with a separation layer interposed between the substrate and the semiconductor integrated circuit; a first impact resistance layer is formed over the semiconductor integrated circuit; a first impact diffusion layer is formed over the first impact resistance layer; the semiconductor integrated circuit, the first impact resistance layer, and the first impact diffusion layer are bonded to each other by heat and pressure treatment; the semiconductor integrated circuit is separated from the substrate; a second impact resistance layer and a second impact diffusion layer are bonded by heat and pressure treatment; and the second impact diffusion layer which is bonded to the second impact resistance layer is bonded to the semiconductor integrated circuit which is separated from the substrate with an adhesive layer. The first impact diffusion layer and the second impact diffusion layer have a lower modulus of elasticity and higher breaking strength than the first impact resistance layer and the second impact resistance layer.

Note that in the present invention, the term "semiconductor device" indicates general devices which can function using semiconductive properties. A device that has a circuit including a semiconductor element (such as a transistor, a memory element, or a diode), and a semiconductor device such as a chip having a processor circuit can be manufactured with use of the present invention.

With a pair of impact resistance layers which sandwich a semiconductor integrated circuit, and an impact diffusion layer provided to be stacked on the semiconductor integrated circuit, a highly reliable semiconductor device which has strength while reduction in thickness and size is achieved can be provided. Further, a semiconductor device can be manufactured with a high yield by preventing defects of a shape and characteristics in a manufacture process.

BRIEF DESCRIPTION OF DRAWINGS

FIGS. 7A to 7C illustrate a method for manufacturing a semiconductor device.

BEST MODE FOR CARRYING OUT THE INVENTION

Figure 1A:
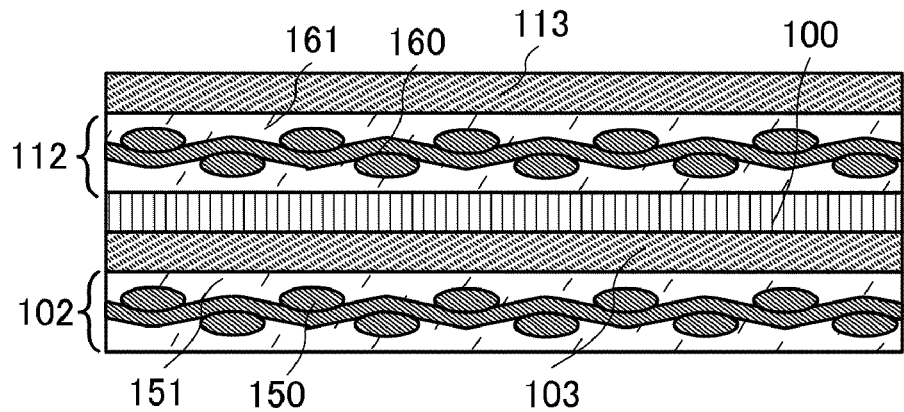
FIGS. 1A to 1C illustrate a semiconductor device.

Embodiments according to the present invention will be described in detail with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments described below. Identical portions or portions having similar functions are marked by same reference numerals throughout the drawings so as to omit repeated explanation.

Embodiment 1

In this embodiment, a highly reliable semiconductor device and a method for manufacturing a semiconductor device with a high yield will be described in detail with reference to FIGS. 1A to 1C, FIGS. 2A and 2B, and FIGS. 3A to 3D.

In a semiconductor device of this embodiment, a semiconductor integrated circuit is separated from a substrate which is used for formation of the semiconductor integrated circuit and sandwiched between impact resistance layers having flexibility. Note that, the substrate over which the semiconductor integrated circuit is formed is also referred to as a formation substrate. Accordingly, the semiconductor integrated circuit is formed over the formation substrate with a separation layer interposed therebetween.

Figure 1B:
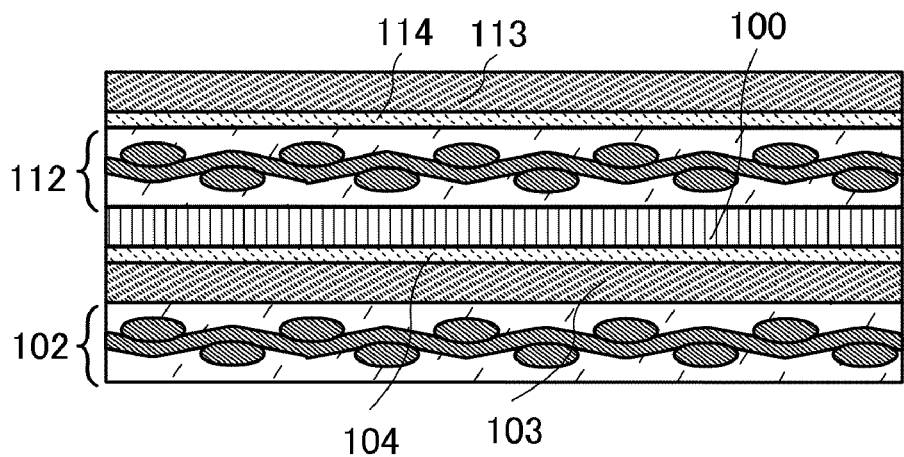

FIGS. 1A and 1B each illustrate a semiconductor device of this embodiment. In FIG. 1A, a semiconductor integrated circuit 100 is sandwiched between a first impact resistance layer 112 and a first impact diffusion layer 113, and a second impact resistance layer 102 and a second impact diffusion layer 103. The second impact diffusion layer 103 is provided between the semiconductor integrated circuit 100 and the second impact resistance layer 102. As for the first impact resistance layer 112 and the second impact resistance layer 102, a structure body in which a fibrous body is impregnated with an organic resin is used. The first impact resistance layer 112 has a structure body in which a fibrous body 160 is impregnated with an organic resin 161, and the second impact resistance layer 102 has a structure body in which a fibrous body 150 is impregnated with an organic resin 151.

A separation surface of the semiconductor integrated circuit 100 is in contact with the second impact diffusion layer 103 and the other surface is in contact with the first impact resistance layer 112. The first impact diffusion layer 113 is provided on an outer side (the side opposite to the side where the semiconductor integrated circuit 100 is provided) of the first impact resistance layer 112, and the second impact resistance layer 102 is provided on an outer side (the side opposite to the side where the semiconductor integrated circuit 100 is provided) of the second impact diffusion layer 103.

Figure 1C:
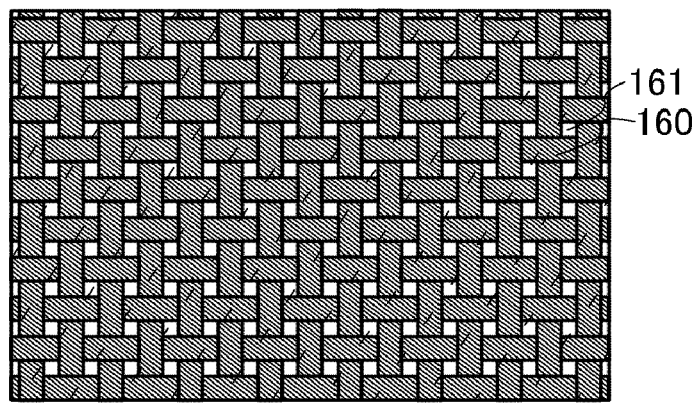

FIG. 1C illustrates a top view of a woven fabric as the fibrous body 160 which is woven using yarn bundles for warp yarns and weft yarns.

As illustrated in FIG. 1C, the fibrous body 160 is woven using warp yarns spaced at regular intervals and weft yarns spaced at regular intervals. Such a fibrous body which is woven using the warp yarns and the weft yarns has regions without the warp yarns and the weft yarns. In such a fibrous body 160, the organic resin 161 is further impregnated, whereby adhesion between the fibrous body 160 and the semiconductor integrated circuit can be further increased.

Further, in the fibrous body 160, density of the warp yarns and weft yearns may be high and the proportion of a region without the warp yearns and the weft yearns may be low.

Such a structure body that the fibrous body 160 is impregnated with the organic resin 161 is also called a prepreg. A prepreg is specifically formed in a following manner: after a fibrous body is impregnated with a varnish in which a matrix resin is diluted with an organic solvent, drying is performed so that the organic solvent is volatilized and the matrix resin is semi-cured. The thickness of the structure body is preferably from 10 µm to 100 µm, more preferably from 10 µm to 30 µm. When a structure body with such a thickness is used, a thin semiconductor device capable of being curved can be manufactured. In addition, the impact resistance layer preferably has a modulus of elasticity of 13 GPa or higher and a modulus of rupture of lower than 300 MPa. For example, as the impact resistance layer, a prepreg with a modulus of elasticity of from 13 GPs to 15 GPa and a modulus of rupture of 140 MPa can be used.

Note that the structure body in which the fibrous body is impregnated with the organic resin may be formed by stacking a plurality of layers. In this case, the structure body may be formed by stacking a plurality of structure bodies in each of which a fibrous body with a single layer is impregnated with an organic resin or impregnating a plurality of fibrous bodies which are stacked with an organic resin. In stacking a plurality of structure bodies in each of which a fibrous body with a single layer is impregnated with an organic resin, another layer may be interposed between the structure bodies.

A thermosetting resin such as an epoxy resin, an unsaturated polyester resin, a polyimide resin, a bismaleimide-triazine resin, or a cyanate resin can be used for the organic resin 161. Alternatively, a thermoplastic resin such as a polyphenylene oxide resin, a polyetherimide resin, or a fluorine resin can be used for the organic resin 161. Further alternatively, a plurality of resins selected from the above-described thermosetting resin and thermoplastic resin may be used as the organic resin 161. By using the above-described organic resin, the fiber body can be fixed to the semiconductor integrated circuit by heat treatment. The higher the glass transition temperature of the organic resin 161 is, the less the organic resin 161 is broken by local pressing force, which is preferable.

Highly thermally-conductive filler may be dispersed in the organic resin 161 or the yarn bundles of fibers. As the highly thermally-conductive filler, aluminum nitride, boron nitride, silicon nitride, alumina, or the like can be given. As the highly thermally-conductive filler, a metal particle such as silver or copper can also be given. When the highly thermally-conductive filler is included in the organic resin or the yarn bundles of fibers, heat generated in the semiconductor integrated circuit can be easily released to the outside. Accordingly, thermal storage in the semiconductor device can be suppressed, and breakdown of the semiconductor device can be reduced.

The fibrous body 160 is a woven fabric or a nonwoven fabric which uses high-strength fiber of an organic compound or an inorganic compound and disposed so that the high-strength fiber can overlap with each other. A high-strength fiber is specifically a fiber with a high modulus of elasticity in tensile or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, and a carbon fiber can be given. As the glass fiber, a glass fiber using E glass, S glass, D glass, Q glass, and the like can be given. Note that the fibrous body 160 may be formed from one kind of the above-described high-strength fibers or a plurality of the above-described high-strength fibers.

The fibrous body 160 may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Use of a yarn bundle having an elliptical shape or a flat shape in cross section in this manner can make a thickness of the fibrous body 160 small. Accordingly, the structure body can be made thin, and thus, a thin semiconductor device can be manufactured.

In the drawings of this embodiment, the fibrous body 160 is illustrated as a woven fabric which is plain-woven using a yarn bundle having an elliptical shape in cross section.

Further, in order to enhance permeability of an organic resin into the inside of the yarn bundle of fibers, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

Further, as the impact diffusion layers (the first impact diffusion layer and the second impact diffusion layer), it is preferable to use a material with a low modulus of elasticity and high breaking strength: i.e., a film having rubber elasticity is preferably used. The impact diffusion layers preferably have a modulus of elasticity of from 5 GPa to 12 GPa and a modulus of rupture of 300 MPa or higher.

The impact diffusion layers are preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. By provision of the impact diffusion layers formed from a high-strength material with elasticity, a load such as local pressing force is diffused through the whole of a layer and absorbed, so that damage of the semiconductor device can be prevented.

More specifically, as the impact diffusion layers, an aramid resin, a polyethylene naphthalate (PEN) resin, a polyether sulfone (PES) resin, a polyphenylene sulfide (PPS) resin, a polyimide (PI) resin, or the like can be given. In this embodiment, an aramid resin film (with a modulus of elasticity of 10 GPa and a breaking strength of 480 MPa) is used as the impact diffusion layers.

FIG. 1B illustrates an example in which the semiconductor integrated circuit 100 and the second impact diffusion layer 103 are bonded to each other with an adhesive layer 104 and the first impact resistance layer 112 and the first impact diffusion layer 113 are bonded to each other with an adhesive layer 114. In this embodiment, an aramid film is used as the second impact diffusion layer 103 and an acrylic resin is used as the adhesive layer 104. It is preferable that the adhesive layer 104 make the impact diffusion layer and the semiconductor integrated circuit be bonded to each other, and a thermosetting resin, an ultraviolet cured resin, an acrylic resin, an urethane resin, an epoxy resin, a silicone resin, or the like can be used therefor. In a case where the first impact resistance layer 112 and the first impact diffusion layer 113 are bonded to each other by heat and pressure treatment, the adhesive layer 114 is not necessarily used. The adhesive layer may have a thickness of from 3 μm to 15 μm.

Figure 2A:
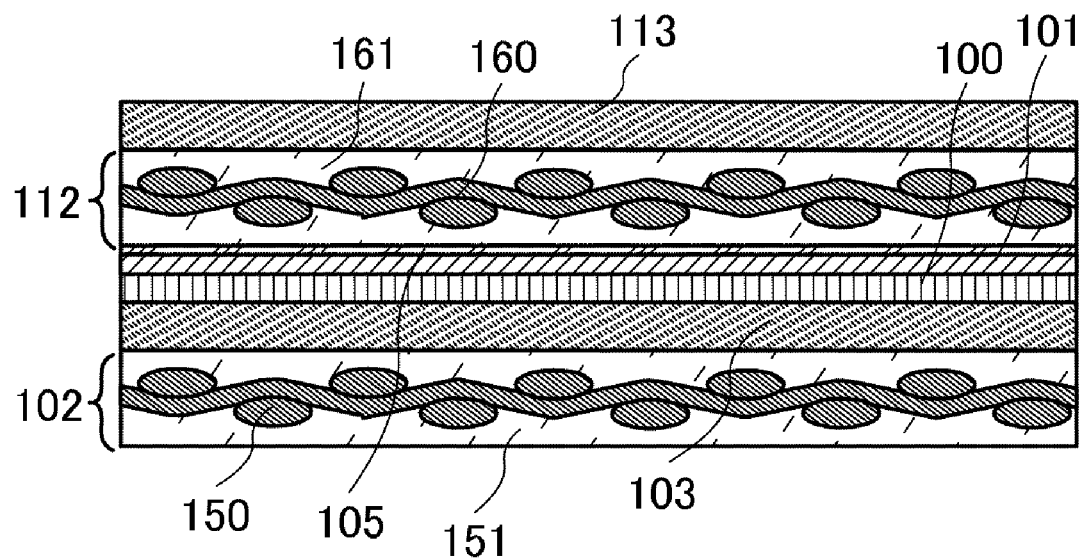
FIGS. 2A and 2B illustrate a semiconductor device.
Figure 2B:
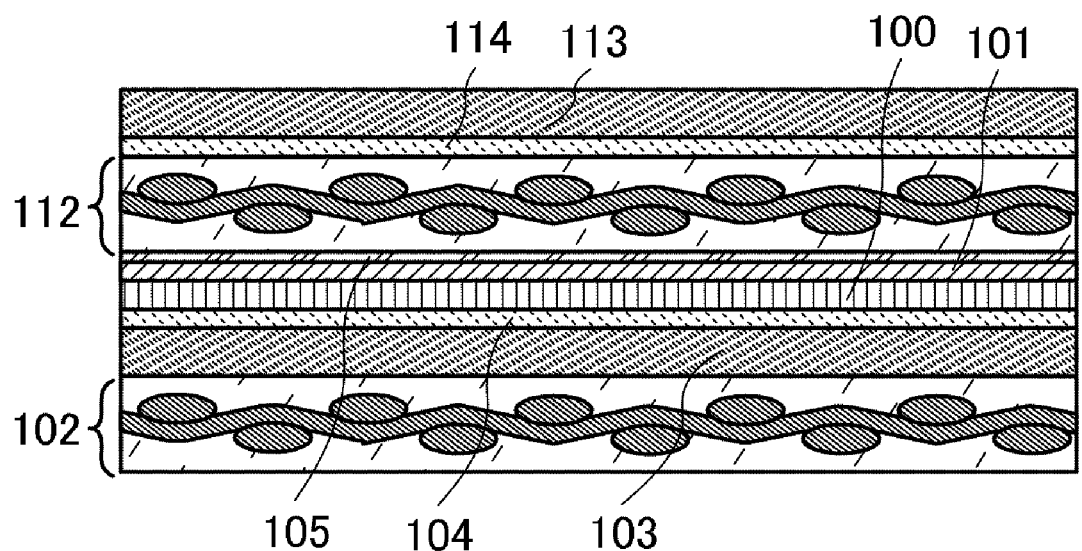

Further, a protective layer may be formed over the semiconductor integrated circuit. FIGS. 2A and 2B each illustrate an example in which an inorganic insulating layer 105 is formed as a protective layer over the semiconductor integrated circuit 100. Further, in FIGS. 2A and 2B, an antenna 101 is formed over the semiconductor integrated circuit 100, and the inorganic insulating layer 105 is formed thereover. Since the antenna 101 is covered with the inorganic insulating layer 105, oxidation of a conductive layer serving as the antenna can be prevented.

The inorganic insulating layer 105 is formed using an inorganic compound to have a single layer or a stacked layer by a sputtering method, a plasma CVD method, a coating method, a printing method, or the like. As a typical example of the inorganic compound, oxidized silicon or nitrided silicon is given. As a typical example of oxidized silicon and nitrided silicon, silicon oxide, silicon oxynitride, silicon nitride, silicon nitride oxide, or the like can be given.

Moreover, the inorganic insulating layer 105 may have a layered structure. For example, a layered structure may be formed by stacking an inorganic compound. Typically, the inorganic insulating layer 105 may be formed by stacking silicon oxide, silicon nitride oxide, and silicon oxynitride.

A method for manufacturing a semiconductor device is described with reference to FIGS. 3A to 3D. The semiconductor integrated circuit 100 is formed over a substrate 110 having an insulating surface, which is a formation substrate, with a separation layer 111 interposed therebetween (see FIG. 3A).

As the substrate 110 which is a formation substrate, a glass substrate, a quartz substrate, a sapphire substrate, a ceramic substrate, a metal substrate having an insulating layer over a surface thereof, or the like can be used. Furthermore, a plastic substrate which can withstand the processing temperature of this embodiment may be used. Through the manufacture steps of the semiconductor device, the formation substrate can be selected as appropriate depending on the steps to be performed.

The separation layer 111 is formed by a sputtering method, a plasma CVD method, a coating method, a printing method, or the like, with a single layer or a stacked layer using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) and silicon (Si); or an alloy material or a compound material containing any of the aforementioned elements as its main component. A crystalline structure of a layer containing silicon may be any one of an amorphous structure, a microcrystalline structure, or a polycrystalline structure. Note that a coating method includes a spin-coating method, a droplet discharge method, and a dispenser method in its category here.

In the case where the separation layer 111 has a single-layer structure, a tungsten layer, a molybdenum layer, or a layer containing a mixture of tungsten and molybdenum is preferably formed. Instead, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds, for example, to an alloy of tungsten and molybdenum.

In the case where the separation layer 111 has a layered structure, it is preferable to form, as a first layer, a tungsten layer, a molybdenum layer, or a layer containing a mixture of tungsten and molybdenum, and form, as a second layer, oxide, nitride, oxynitride, or nitride oxide of tungsten, molybdenum, or a mixture of tungsten and molybdenum.

In the case where the separation layer 111 has a layered structure of a layer containing tungsten and a layer containing tungsten oxide, the layer containing tungsten may be formed first and an insulating layer formed of oxide may be formed on the layer containing tungsten so that a layer containing tungsten oxide can be formed at an interface between the tungsten layer and the insulating layer. Further, the surface of the tungsten layer may be subjected to thermal oxidation treatment, oxygen plasma treatment, or treatment using a strong oxidizing solution such as ozone water to form a layer containing an oxide of tungsten. The plasma treatment or heat treatment may be performed in an atmosphere of oxygen, nitrogen, dinitrogen monoxide, an elementary substance of dinitrogen monoxide, or a mixed gas of the gas and another gas. The same applies to the case of forming a layer containing a nitride, an oxynitride and a nitride oxide of tungsten. After a layer containing tungsten is formed, a silicon nitride layer, a silicon oxynitride layer and a silicon nitride oxide layer may be formed thereover.

In accordance with the above step, the separation layer 111 is formed so as to be in contact with the substrate 110: however, the present invention is not limited thereto. An insulating layer to be a base may be formed so as to be in contact with the substrate 110, and the separation layer 111 may be provided to be in contact with the insulating layer.

The semiconductor integrated circuit 100 and the impact resistance layer 112 are bonded, and the semiconductor integrated circuit 100 is separated from the substrate 110 by using the separation layer 111. Thus, the semiconductor integrated circuit 100 is provided on the first impact resistance layer 112 side (see FIG. 3B).

In this embodiment, as the first impact resistance layer 112, the structure body in which the fibrous body 160 is impregnated with the organic resin 161 is used. The structure body is heated and subjected to pressure bonding so that the organic resin of the structure body is plasticized or cured. In the case where the organic resin is an organic plastic resin, the organic resin which is plasticized is then cured by cooling to room temperature. By heating and pressure bonding, the organic resin is uniformly spread so as to be in close contact with the semiconductor integrated circuit, and is cured. A step in which the structure body is subjected to pressure bonding is performed under an atmospheric pressure or a reduced pressure.

Note that a transfer step in which the semiconductor integrated circuit is transferred to another substrate can be performed by using, as appropriate, the following method: a method in which a separation layer is formed between a substrate and a semiconductor integrated circuit, a metal oxide film is provided between the separation layer and the semiconductor integrated circuit, and the metal oxide film is weakened by crystallization, thereby separating the semiconductor integrated circuit; a method in which an amorphous silicon film containing hydrogen is provided between a substrate having high heat resistance and a semiconductor integrated circuit, and the amorphous silicon film is irradiated with a laser beam or etched to remove the amorphous silicon film, thereby separating the semiconductor integrated circuit; a method in which a separation layer is formed between a substrate and a semiconductor integrated circuit, a metal oxide film is provided between the separation layer and the semiconductor integrated circuit, the metal oxide film is weakened by crystallization, part of the separation layer is etched away using a solution or a halogen fluoride gas such as $NF_3$, $BrF_3$, or $ClF_3$, and separation is performed at the weakened metal oxide film; a method in which a substrate over which a semiconductor integrated circuit is formed is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with a laser beam so that nitrogen, oxygen, or hydrogen contained in the separation layer is emitted as a gas, thereby promoting separation between a semiconductor integrated circuit and a substrate.

By combining the above-described separation methods, the transfer step can be more easily performed. That is, separation can be conducted with physical force (e.g., by a machine or the like) after making it easier for the separation layer and the semiconductor integrated circuit to be separated from each other by conducting laser beam irradiation, etching the separation layer by using a gas or a solution, and/or mechanically removing the separation layer using a keen knife or scalpel.

Alternatively, the semiconductor integrated circuit may be separated from the formation substrate by making liquid permeate to an interface between the separation layer and the semiconductor integrated circuit.

The second impact resistance layer 102 has a structure body in which the fibrous body 150 is impregnated with the organic resin 151, which is similar to the first impact resistance layer 112. The structure body is heated and subjected to pressure bonding, so that the second impact diffusion layer 103 and the second impact resistance layer 102 are bonded. The adhesive layer 104 is provided on a surface, which is opposite to a surface where the second impact resistance layer 102 is provided, of the second impact diffusion layer 103.

Figure 3A:
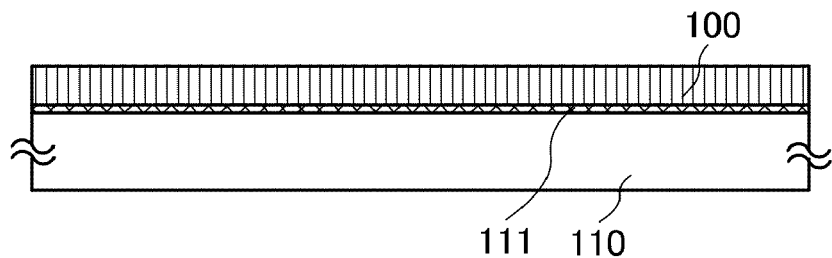
FIGS. 3A to 3D illustrate a method for manufacturing a semiconductor device.
Figure 3B:
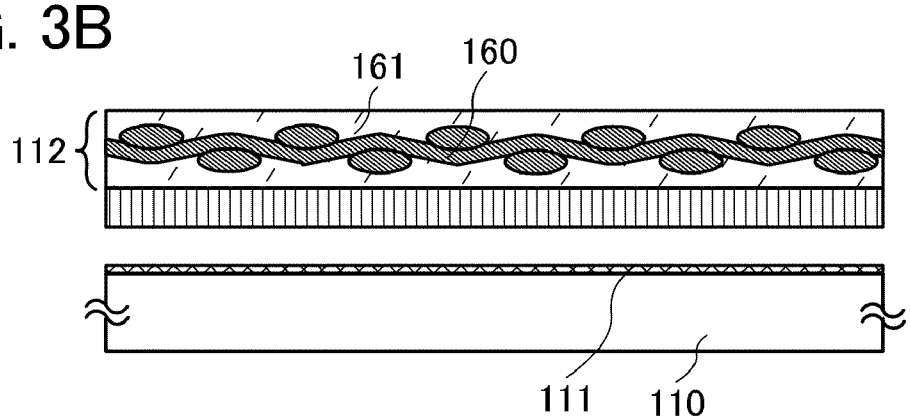
Figure 3C:
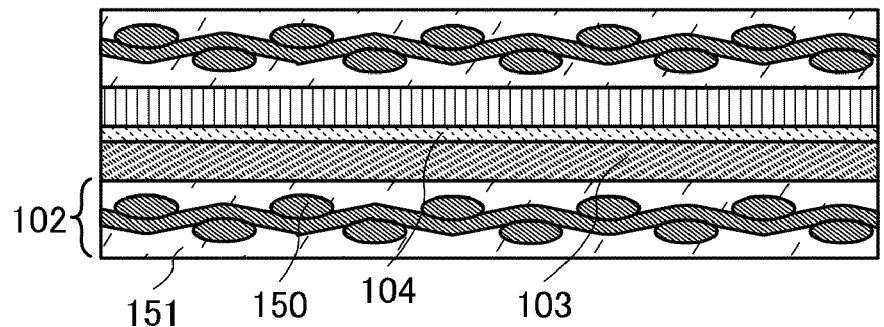

The adhesive layer 104 is bonded to an exposed separation surface of the semiconductor integrated circuit 100, so that a semiconductor device which has the semiconductor integrated circuit 100 sandwiched between the first impact resistance layer 112 and the second impact resistance layer 102 and the second impact diffusion layer 103 can be formed (see FIG. 3C).

Figure 3D:
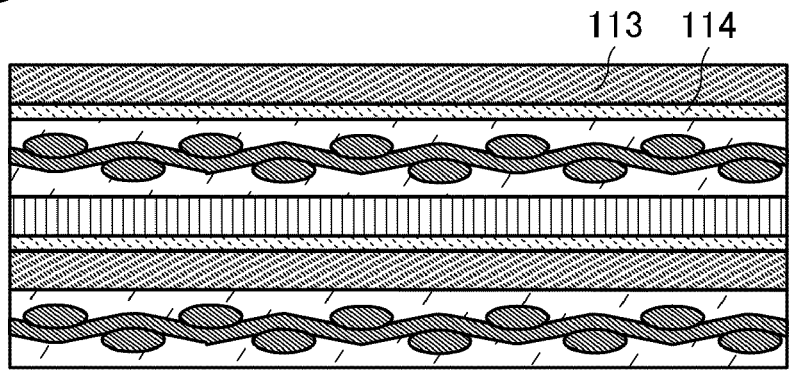

Furthermore, the first impact diffusion layer 113 is bonded to a surface, which is opposite to a surface where the semiconductor integrated circuit 100 is provided, of the first impact resistance layer 112 with the adhesive layer 114 interposed therebetween (see FIG. 3D).

Figure 16A:
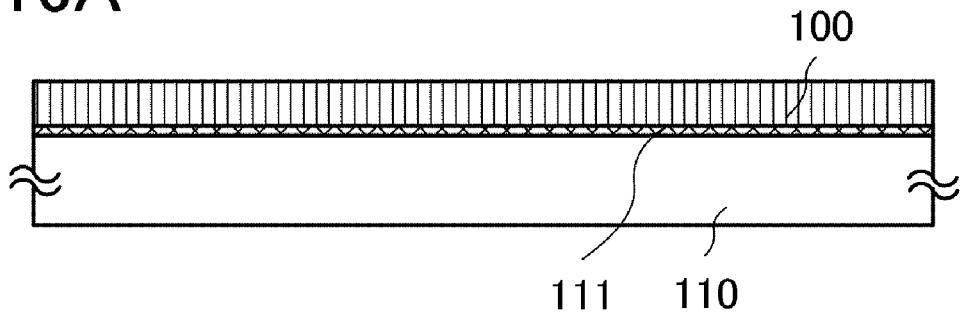
FIGS. 16A to 16C illustrate a method for manufacturing a semiconductor device.
Figure 16B:
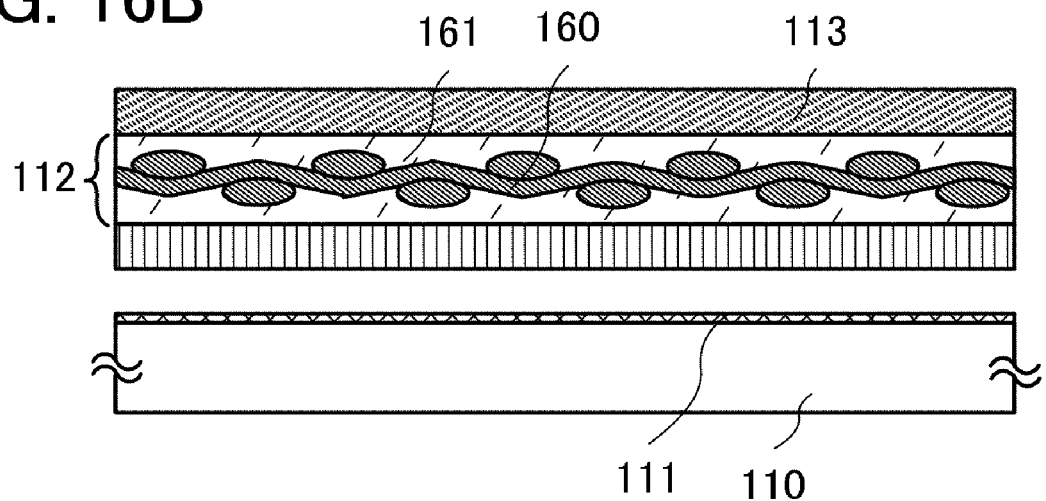
Figure 16C:
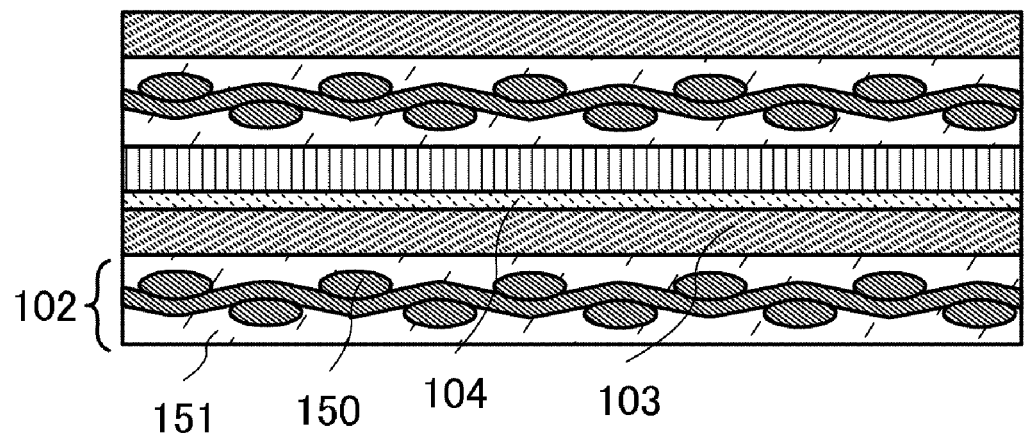

As illustrated in FIGS. 16A to 16C, the first impact diffusion layer 113 may be bonded to the first impact resistance layer 112 at the same time as the step in which the first impact resistance layer 112 and the semiconductor integrated circuit 100 are bonded to each other.

Similarly to FIG. 3A, the semiconductor integrated circuit 100 is formed over the substrate 110 having an insulating surface, which is a formation substrate, with the separation layer 111 interposed therebetween (see FIG. 16A).

The first impact resistance layer 112 and the first impact diffusion layer 113 are stacked over the semiconductor integrated circuit 100, and heat and pressure treatment are performed, so that the first impact resistance layer 112 and the first impact diffusion layer 113 are bonded to the semiconductor integrated circuit 100 and separated from the substrate 110 by using the separation layer 111 (see FIG. 16B). The bonding step of the semiconductor integrated circuit 100 and the first impact resistance layer 112 and the bonding step of the first impact resistance layer 112 and the first impact diffusion layer 113 may be performed concurrently or separately.

The second impact diffusion layer 103 on which the second impact resistance layer 102 is stacked is bonded to the separation surface of the semiconductor integrated circuit 100 with use of the adhesive layer 104, so that a semiconductor device is formed (see FIG. 16C).

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers which sandwich the semiconductor integrated circuit, and a pair of the impact diffusion layers, a highly reliable semiconductor device which has strength while reduction in thickness and size is achieved can be provided.

Embodiment 2

In this embodiment, a highly reliable semiconductor device and a method for manufacturing a semiconductor device with a high yield will be described in detail with reference to FIGS. 4A to 4C and FIGS. 5A to 5C. Here, as an example of a semiconductor device, a complementary metal oxide semiconductor (CMOS) will be described.

Figure 4A:
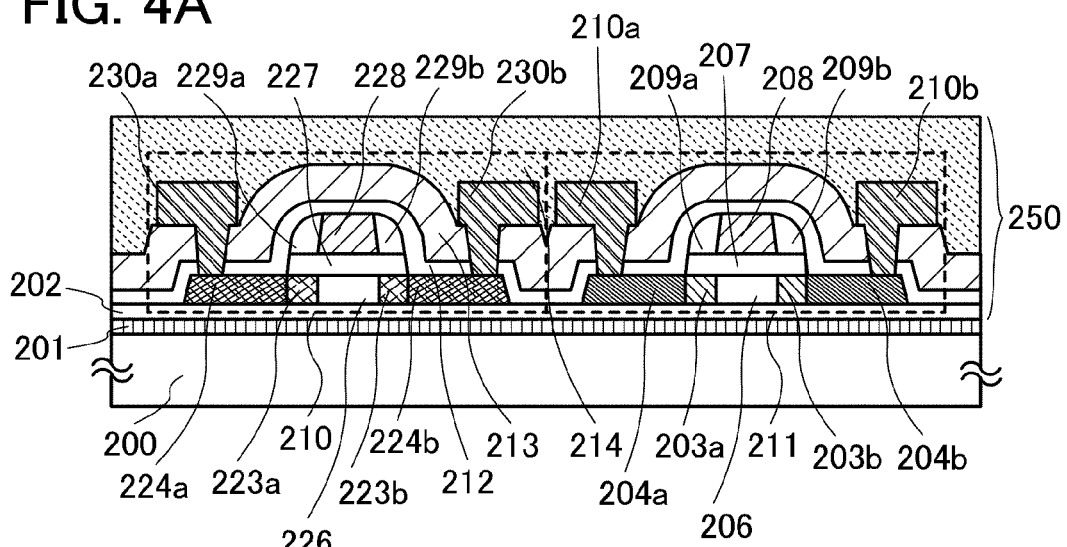
FIGS. 4A to 4C illustrate a method for manufacturing a semiconductor device.

A transistor 210 and a transistor 211 are formed over a substrate 200 having an insulating surface, which is a formation substrate, with a separation layer 201 and a base insulating layer interposed therebetween, and an insulating film 212, an insulating film 213, and an insulating film 214 are provided thereover, whereby a semiconductor integrated circuit 250 is formed (see FIG. 4A).

The transistor 210 is a thin film transistor which includes source and drain regions 224a and 224b, impurity regions 223a and 223b which contains an impurity at lower concentration than the source and drain regions 224a and 224b, a channel formation region 226, a gate insulating layer 227, a gate electrode layer 228, and insulating layers 229a and 229b having a sidewall structure. The source and drain regions 224a and 224b are in contact with wiring layers 230a and 230b serving as source and drain electrode layers, respectively, and electrically connected thereto. In this embodiment, the transistor 210 is a p-channel thin film transistor which contains an impurity element (e.g., boron (B), aluminum (Al), gallium (Ga), or the like) imparting p-type conductivity to the source and drain regions 224a and 224b and the impurity regions 223a and 223b which are LDD (lightly doped drain) regions.

The transistor 211 is a thin film transistor which includes source and drain regions 204a and 204b, impurity regions 203a and 203b which contain an impurity at lower concentration than the source and drain regions 204a and 204b, a channel formation region 206, a gate insulating layer 207, a gate electrode layer 208, and insulating layers 209a and 209b having a sidewall structure. The source and drain regions 204a and 204b are in contact with wiring layers 210a and 210b serving as source and drain electrode layers, respectively, and electrically connected thereto. In this embodiment, the transistor 211 is an n-channel thin film transistor which contains an impurity element (e.g., phosphorus (P), arsenic (As), or the like) imparting n-type conductivity to the source and drain regions 204a and 204b and the impurity regions 203a and 203b which are LDD regions.

As a first impact resistance layer 262, a structure body in which a fibrous body 280 is impregnated with an organic resin 281 is used. The semiconductor integrated circuit 250 and the first impact resistance layer 262 are bonded, and with use of a separation layer 201, the semiconductor integrated circuit 250 is separated from the substrate 200. Thus, the semiconductor integrated circuit 250 is provided on the first impact resistance layer 262 side (see FIGS. 4B and 4C).

A second impact resistance layer 252 has a structure body in which a fibrous body 270 is impregnated with an organic resin 271 is used, which is similar to the first impact resistance layer 262. The structure body is heated and subjected to pressure bonding, so that a second impact diffusion layer 253 and the second impact resistance layer 252 are bonded (see FIG. 5A). An adhesive layer 254 is provided on a surface, which is opposite to a surface where the second impact resistance layer 252 is provided, of the second impact diffusion layer 253.

Figure 5A:
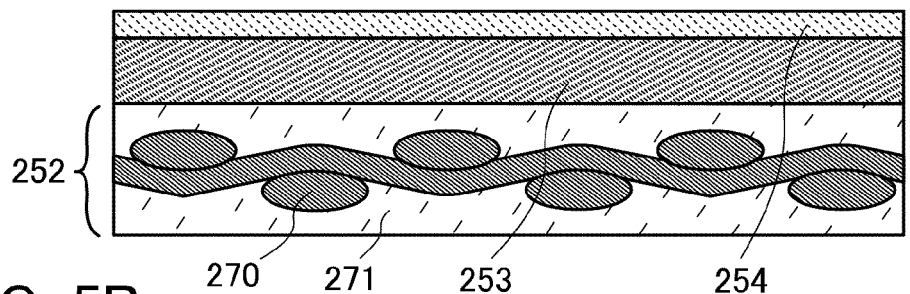
FIGS. 5A to 5C illustrate a method for manufacturing a semiconductor device.
Figure 5B:
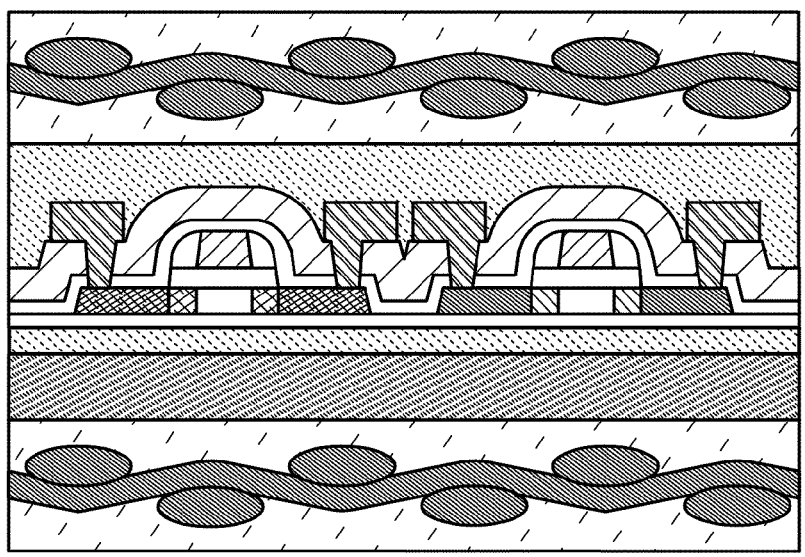
Figure 5C:
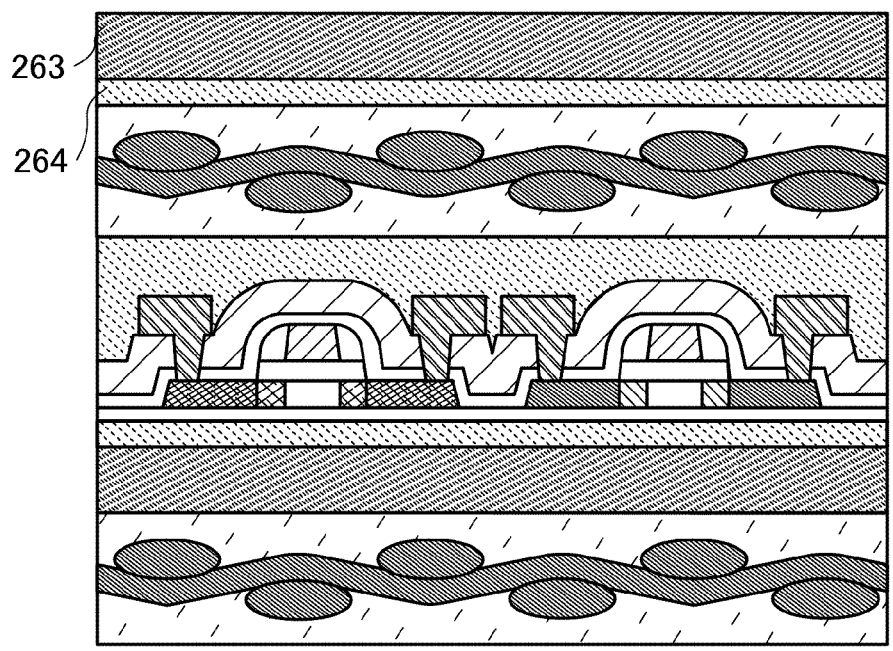

The adhesive layer 254 is bonded to the exposed separation surface of the semiconductor integrated circuit 250 (see FIG. 5B). Further, a first impact diffusion layer 263 is bonded to a surface, which is opposite to a surface where the semiconductor integrated circuit 250 is provided, of the first impact resistance layer 262, with use of an adhesive layer 264. Thus, a semiconductor device can be manufactured, which has the semiconductor integrated circuit 250 sandwiched between the first impact resistance layer 262 and the first impact diffusion layer 263, and the second impact resistance layer 252 and the second impact diffusion layer 253 (see FIG. 5C).

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With the pair of the impact resistance layers which sandwich the semiconductor integrated circuit, and the impact diffusion layers which are provided to be stacked on the semiconductor integrated circuit, a highly reliable semiconductor device which has strength while reduction in thickness and size is achieved can be provided.

The semiconductor device manufactured in this embodiment can be a semiconductor device having flexibility by provision of flexible impact resistance layers and an impact diffusion layer therein.

As a material for forming a semiconductor layer included in the transistors 210 and 211, an amorphous semiconductor (hereinafter also referred to as AS) formed using a semiconductor material gas typified by silane or germane by a vapor phase growth method or a sputtering method, a polycrystalline semiconductor formed by crystallizing the amorphous semiconductor by utilizing light energy or thermal energy, a microcrystalline (also referred to as semiamorphous or microcrystal) semiconductor (hereinafter also referred to as SAS), or the like can be used. The semiconductor layer can be formed by a sputtering method, an LPCVD method, a plasma CVD method, or the like.

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single-crystalline silicon. That is, the peak of the Raman spectrum of the microcrystalline silicon exists between 520 cm$^{-1}$ which represents single crystal silicon and 480 cm$^{-1}$ which represents amorphous silicon. The semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor layer can be obtained.

The microcrystalline semiconductor layer can be formed by a high-frequency plasma CVD method with a frequency of several tens to several hundreds of megahertz or a microwave plasma CVD apparatus with a frequency of 1 GHz or more. The microcrystalline semiconductor layer can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements of helium, argon, krypton, and neon in addition to silicon hydride and hydrogen, the microcrystalline semiconductor layer can be formed. In that case, the flow ratio of hydrogen to silicon hydride is set to be 5:1 to 200:1, preferably 50:1 to 150:1, more preferably 100:1.

Hydrogenated amorphous silicon can be typically cited as the amorphous semiconductor, while polysilicon or the like can be typically cited as crystalline semiconductor. Examples of polysilicon (polycrystalline silicon) include so-called high-temperature polysilicon that contains polysilicon as a main component and is formed at a process temperature of 800° C. or higher, so-called low-temperature polysilicon that contains polysilicon as a main component and is formed at a process temperature of 600° C. or lower, polysilicon obtained by crystallizing amorphous silicon by using an element that promotes crystallization or the like, and the like. Naturally, as described above, a microcrystalline semiconductor or a semiconductor which includes a crystalline phase in a portion of a semiconductor layer can be used.

As a material of the semiconductor, as well as an element of silicon (Si), germanium (Ge), or the like, a compound semiconductor such as GaAs, InP, SiC, ZnSe, GaN, or SiGe can be used. Further, zinc oxide (ZnO), tin oxide ($SnO_2$), or the like which is an oxide semiconductor can be used. In the case of using ZnO for the semiconductor layer, $Y_2O_3$, $Al_2O_3$, $TiO_2$, a stacked layer thereof, or the like may be used for the gate insulating layer, and ITO, Au, Ti, or the like may be used for the gate electrode layer, the source electrode layer, and the drain electrode layer. In addition, In, Ga, or the like can be added into ZnO.

In the case of using a crystalline semiconductor layer for the semiconductor layer, the crystalline semiconductor layer may be formed by various methods (such as a laser crystallization method, a thermal crystallization method, or a thermal crystallization method using an element which promotes crystallization, such as nickel). Also, a microcrystalline semiconductor, which is an SAS, can be crystallized by performing irradiation with a laser beam to increase its crystallinity. In the case where the element promoting crystallization is not introduced, hydrogen is released until the concentration of hydrogen contained in an amorphous silicon layer becomes $1 \times 10^{20}$ atoms/cm$^3$ or less by heating the amorphous silicon layer at a temperature of 500° C. for one hour under a nitrogen atmosphere before irradiating the amorphous silicon layer with a laser beam. This is because the amorphous silicon layer is damaged when the amorphous silicon layer containing a high amount of hydrogen is irradiated with a laser beam.

There is no particularly limitation on a technique for introducing a metal element into an amorphous semiconductor layer as long as it is a technique capable of providing the metal element on a surface or the inside of the amorphous semiconductor layer. For example, a sputtering method, a CVD method, a plasma processing method (including a plasma CVD method), an adsorption method, or a method for coating with a solution of metal salt, can be used. In the above mentioned processes, the method using a solution is convenient and has an advantage of easily adjusting the concentration of a metal element. In addition, in order to improve the wettability of the surface of the amorphous semiconductor layer to spread an aqueous solution on the whole surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

The crystallization may be performed by adding an element which promotes crystallization (also referred to as a catalyst element or a metal element) to an amorphous semiconductor layer and performing a heat treatment (at 550° C. to 750° C. for 3 minutes to 24 hours) in a crystallization step in which the amorphous semiconductor layer is crystallized to form a crystalline semiconductor layer. The element which promotes the crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization from the crystalline semiconductor layer, a semiconductor layer containing an impurity element is formed to be in contact with the crystalline semiconductor layer so as to serve as gettering sink. The impurity element may be an impurity element imparting n-type conductivity, an impurity element imparting p-type conductivity, or a rare gas element. For example, one or plural elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation treatment. The heat treatment or the laser light irradiation treatment may be carried out several times, separately.

Also, a crystalline semiconductor layer may be formed over a substrate directly by a plasma method. Alternatively, the crystalline semiconductor layer may be selectively formed over a substrate by using a plasma method.

The gate insulating layers 207 and 227 may be formed using silicon oxide, or may be formed with a layered structure of silicon oxide and silicon nitride. The gate insulating layers 207 and 227 may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability. For example, dinitrogen monoxide ($N_2O$) is diluted with Ar by 1 to 3 times (flow ratio) and a microwave (2.45 GHz) with a power of 3 kW to 5 kW is applied at a pressure of 10 Pa to 30 Pa to oxidize or nitride surface of the semiconductor layer. By this treatment, an insulating film having a thickness of 1 nm to 10 nm (preferably 2 nm to 6 nm) is formed. Further, dinitrogen monoxide ($N_2O$) and silane ($SiH_4$) are introduced, and a silicon oxynitride film is formed by a vapor deposition method by application of a microwave (2.45 GHz) power of 3 kW to 5 kW at a pressure of 10 Pa to 30 Pa; accordingly, the gate insulating layer is formed. The combination of the solid phase reaction and the reaction by the vapor deposition method can form a gate insulating layer with a low interface state density and an excellent withstand voltage.

As the gate insulating layers 207 and 227, a high dielectric constant material such as zirconium dioxide, hafnium oxide, titanium dioxide, or tantalum pentoxide may be used. When a high dielectric constant material is used for the gate insulating layers 207 and 227, gate leak current can be reduced.

The gate electrode layers 208 and 228 can be formed by a CVD method, a sputtering method, a droplet discharge method, or the like. The gate electrode layers may be formed using an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Alternatively, a semiconductor film typified by a polycrystalline silicon film doped with an impurity element such as phosphorus, or an AgPdCu alloy may be used. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon alloy (Al—Si) with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film.

A light-transmitting material having a transmitting property to visible light can also be used for the gate electrode layers 208 and 228. As the light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

If etching processing is required to form the gate electrode layers 208 and 228, a mask may be formed and dry etching or wet etching may be performed. By using an ICP (inductively coupled plasma) etching method and controlling etching conditions (e.g., the amount of electric power applied to a coiled electrode, the amount of electric power applied to an electrode on a substrate side, or the electrode temperature on the substrate side) as appropriate, the electrode layer can be etched into a tapered shape. Note that as an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be used as appropriate.

The insulating layers 209a, 209b, 229a, and 229b having a sidewall structure may be formed in a self-aligning manner by forming an insulating layer, which covers the gate electrode layers and the semiconductor layers, and processing the insulating layer by anisotropic etching of an RIE (reactive ion etching) method. Here, there is no particular limitations on the insulating layer, but the insulating layer is preferably formed using silicon oxide which is formed by reacting TEOS (tetraethyl orthosilicate), silane, or the like and oxygen, nitrous oxide, or the like and which has favorable step coverage. The insulating layer can be formed by a thermal CVD method, a plasma CVD method, a normal-pressure CVD method, a bias ECRCVD method, a sputtering method, or the like.

Although a single gate structure is described in this embodiment, a multi-gate structure such as a double-gate structure may also be employed. In this case, gate electrode layers may be provided above and below the semiconductor layer or a plurality of gate electrode layers may be provided only on one side (above or below) of the semiconductor layer.

Alternatively, a structure in which a silicide is provided for a source region and a drain region of a transistor may be employed. A silicide is formed by forming a conductive film over the source and drain regions of the semiconductor layer and making silicon in the source and drain regions, which are partly exposed, of the semiconductor layer and the conductive film react by heat treatment, a GRTA method, an LRTA method, or the like. Alternatively, a silicide may be formed by light irradiation using a laser beam or a lamp. As a material used for a conductive film for forming the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

The wiring layers 210a, 210b, 230a, and 230b serving as the source and drain electrode layers can be formed by depositing a conductive film by a PVD method, a CVD method, an evaporation method, or the like, and then, etching the conductive film into desired shapes. Alternatively, the wiring layers can be formed selectively at a predetermined place by a printing method, an electroplating method, or the like. Further, a reflow method and a damascene method may be used as well. As a material of the wiring layers 210a, 210b, 230a, and 230b, a metal such as Ag, Au, Cu, Ni, Pt, Pd, Ir, Rh, W, Al, Ta, Mo, Cd, Zn, Fe, Ti, Zr, or Ba; or a semiconductor such as Si or Ge or an alloy thereof, or nitride thereof may be used. Further, a light-transmitting material can also be used.

When the wiring layers are formed using the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

Silicon oxide, silicon nitride, silicon oxynitride, aluminum oxide, aluminum nitride, aluminum oxynitride, or another inorganic insulating material can be used for the insulating films 212, 213, and 214.

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers which sandwich the semiconductor integrated circuit, and a pair of the impact diffusion layers, a highly reliable semiconductor device which has strength while reduction in thickness and size is achieved can be provided.

According to an embodiment of the semiconductor device of the present invention, not to mention a field-effect transistor, a memory element which uses a semiconductor layer can be employed as a semiconductor element; accordingly, a semiconductor device which can satisfy functions required for various applications can be manufactured and provided.

Embodiment 3

In this embodiment, an example of a semiconductor device having a memory, as a semiconductor device which achieves higher integration and further reduction in thickness and size, and a manufacturing method thereof will be described with reference to FIGS. 6A to 6E, FIGS. 7A to 7C, and FIGS. 8A and 8B.

A semiconductor device of this embodiment includes a memory including a memory cell array and a driver circuit portion which drives the memory cell array.

A separation layer 301 is formed over a substrate 300 which is a formation substrate having an insulating surface, and an insulating film 302 serving as a base film is formed over the separation layer 301.

Next, a semiconductor film is formed over the insulating film 302. The semiconductor film may be formed by a sputtering method, an LPCVD method, a plasma CVD method or the like to be 25 to 200 nm thick (preferably, 30 to 150 nm thick).

In this embodiment, an amorphous semiconductor film is formed over the insulating film 302, and the amorphous semiconductor film is crystallized by laser beam irradiation; accordingly, a semiconductor film that is a crystalline semiconductor film is formed.

The semiconductor film obtained as described above may be doped with the slight amount of impurity elements (boron or phosphorus) selectively for controlling threshold voltage of a thin film transistor. This doping of impurity elements may be performed on an amorphous semiconductor film before crystallization. When the amorphous semiconductor film is doped with impurity elements, the impurities can be activated by heat treatment for crystallization later. Further, a defect and the like generated in the doping can be improved as well.

Next, the semiconductor film is processed into a desired shape using a mask. In this embodiment, after an oxide film formed on the semiconductor film is removed, another oxide film is formed. Then, a photomask is formed, and processing treatment using photolithography is performed, so that semiconductor layers 303, 304, 305, and 306 are formed. For end portions of the semiconductor layers, inclination angles (taper angles) may be provided.

The etching may be carried out by either plasma etching (dry etching) or wet etching. For treating a large-sized substrate, plasma etching is suitable. As an etching gas, a gas containing fluorine or chlorine, such as $CF_4$, $NF_3$, $Cl_2$, or $BCl_3$ is used, and an inert gas such as He or Ar may be appropriately added thereto. Alternatively, localized electric discharge is possible when the etching is employed by atmospheric pressure discharge, and thus etching can be performed without forming a mask over an entire substrate.

An insulating film 310 is formed over the semiconductor layer 305. The insulating film 310 may be formed using silicon oxide or a layered structure of silicon oxide and silicon nitride. The insulating film 310 may be formed by deposition of the insulating layer by a plasma CVD method or a low pressure CVD method. It is preferable that the insulating layer be subjected to solid-phase oxidation or solid-phase nitriding by plasma treatment to form the insulating film 310. This is because an insulating layer which is formed through oxidation or nitridation of the semiconductor layer (typically, a silicon layer) by plasma treatment has a dense film quality, high withstand voltage, and high reliability. The insulating film 310 is used as a tunnel insulating layer for injecting charges into a charge accumulation layer 311; therefore, a strong insulating layer is preferred. This insulating film 310 is preferably formed to have a thickness of 1 nm to 20 nm, and preferably 3 nm to 6 nm.

The insulating film 310 is preferably formed by plasma treatment in such a way that, for example, a silicon oxide layer is formed with a thickness of 3 nm to 6 nm over the semiconductor layer by plasma treatment under an oxygen atmosphere, and a nitrogen-plasma-treated layer is formed by treating the surface of the silicon oxide layer with nitrogen plasma under a nitrogen atmosphere. Specifically, first, a silicon oxide layer with a thickness of 3 nm to 6 nm is formed over the semiconductor layer by plasma treatment under an oxygen atmosphere. Then, a nitrogen-plasma-treated layer with a high concentration of nitrogen is formed over the surface or in the vicinity of the surface of the silicon oxide layer by performance of plasma treatment under a nitrogen atmosphere successively. Note that the surface vicinity refers to a depth of approximately 0.5 nm to 1.5 nm from a surface of the silicon oxide layer. For example, by conducting plasma treatment under a nitrogen atmosphere, a structure is obtained in which the silicon oxide layer contains 20 at. % to 50 at. % nitrogen in a region from the surface to a depth of about 1 nm.

A surface of a silicon layer as a typical example of the semiconductor layer is oxidized by plasma treatment, whereby a dense oxide layer that has no distortion in an interface can be formed. In addition, through nitridation by plasma treatment of the oxide layer, oxygen on a portion of a surface is substituted for by nitrogen and a nitrogen layer is formed, whereby the layer can be made even denser. Consequently, an insulating layer which is high in withstand voltage can be formed.

In any event, through use of the aforementioned solid phase oxidation or solid phase nitridation by plasma treatment, even if a glass substrate with a heat resistance temperature of 700° C. or lower is used, an insulating layer equal to a thermal oxidation film that is formed at a temperature of from 950° C. to 1050° C. can be obtained. Thus, a tunnel insulating layer having high reliability can be formed as the tunnel insulating layer of a nonvolatile memory element.

The charge accumulation layer 311 is formed over the insulating film 310. This charge accumulation layer 311 may be provided to have a single layer or a layered structure.

The charge accumulation layer 311 can be a floating gate formed of a layer or particles of a semiconductor material or a conductive material. As the semiconductor material, silicon, silicon germanium, or the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), and tungsten (W); an alloy containing the above element as its main component; an alloy film in which the above elements are combined (typically, an Mo—W alloy film or an Mo—Ta alloy film); or a silicon film given conductivity can be used. Under the conductive layer formed using such a material, a nitride such as tantalum nitride, tungsten nitride, titanium nitride, or molybdenum nitride; or a silicide such as tungsten silicide, titanium silicide, or molybdenum silicide may be formed. Furthermore, a layered structure of the above-described semiconductor materials, conductive materials, or the semiconductor material and the conductive material may be employed. For example, a layered structure of a silicon layer and a germanium layer may be employed.

Alternatively, the charge accumulation layer 311 can be formed as an insulating layer having a trap that holds charges. As a typical example of such a material, a silicon compound and a germanium compound are given. As the silicon compound, silicon nitride, silicon oxynitride, silicon oxynitride to which hydrogen is added, or the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, masks for covering the semiconductor layers 303, 304, and 306 are formed. An impurity element imparting n-type conductivity is added using the masks and the charge accumulation layer 311 as a mask to form an n-type impurity region 362a and an n-type impurity region 362b. In this embodiment, phosphorus (P) which is an impurity element imparting n-type conductivity is used as the impurity element. Here, the impurity element imparting n-type conductivity is added so that the n-type impurity region 362a and the n-type impurity region 362b contain the impurity element at a concentration of about $1\times10^{17}$ atoms/cm$^3$ to $5\times10^{18}$ atoms/cm$^3$. After that, the masks covering the semiconductor layers 303, 304, and 306 are removed.

An oxide film over the semiconductor layer 306 is removed, and a gate insulating layer 309 covering the semiconductor layer 305, the semiconductor layer 306, the insulating film 310, and the charge accumulation layer 311 is formed. When the gate insulating layer 309 has a large thickness in a memory cell array, the thin film transistor and the memory element can have high resistance against high voltage; accordingly reliability can be improved.

Note that although the gate insulating layer 309 formed over the semiconductor layer 305 serves as a control insulating layer in a memory element which is completed later, the insulating layer 309 formed over the semiconductor layer 306 serves as a gate insulating layer of a thin film transistor. Therefore, the layer is called the gate insulating layer 309 in this specification.

Figure 6A:
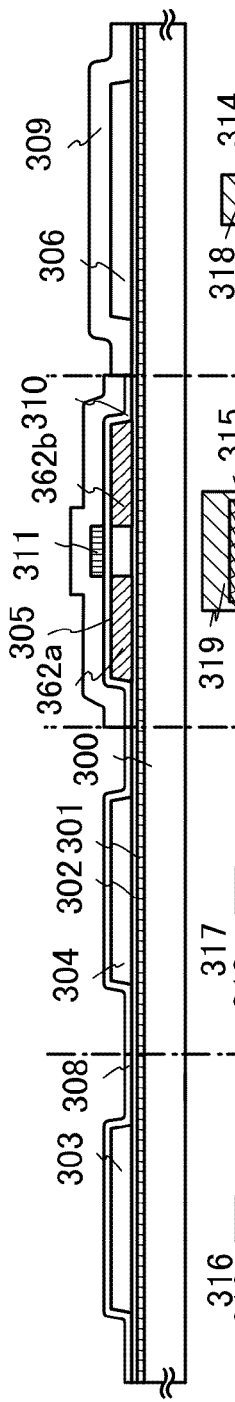
FIGS. 6A to 6E illustrate a method for manufacturing a semiconductor device.

Oxide films over the semiconductor layers 303 and 304 are removed, and a gate insulating layer 308 covering the semiconductor layer 303 and the semiconductor layer 304 are formed (see FIG. 6A). The gate insulating layer 308 can be formed by a plasma CVD method, a sputtering method, or the like. The thickness of the gate insulating layer 308 of a thin film transistor provided in the driver circuit portion is from 1 nm to 10 nm, more preferably about 5 nm. When the gate insulating layer 308 is to be thinned, the transistor in the driver circuit portion can be made to operate with low voltage at high speed.

The gate insulating layer 308 may be formed using silicon oxide or a layered structure of silicon oxide and silicon nitride. The gate insulating layer 308 may be formed by depositing an insulating film by a plasma CVD method or a low pressure CVD method or may be formed by solid phase oxidation or solid phase nitridation by plasma treatment. This is because a gate insulating layer formed by oxidizing or nitriding a semiconductor layer by plasma treatment is dense, and has high dielectric strength and excellent reliability.

As the gate insulating layer 308, a high dielectric constant material may be used. When a high dielectric constant material is used for the gate insulating layer 308, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. Note that a rare gas element such as argon is preferably included in a reactive gas and is preferably mixed in the insulating film to be formed in order to form a dense insulating film with few gate leak current at a low film-formation temperature.

Next, a first conductive film having a thickness of 20 nm to 100 nm and a second conductive film having a thickness of 100 nm to 400 nm, each of which serves as a gate electrode layer, are stacked over the gate insulating layers 308 and 309. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), chromium (Cr), and neodymium (Nd), or an alloy or compound material containing the above material as a main component. Alternatively, the first conductive film and the second conductive film may be formed of a semiconductor film typified by a polycrystalline silicon film doped with an impurity element such as phosphorus, or an AgPdCu alloy film. The conductive film is not limited to the two-layer structure, and, for example, may have a three-layer structure in which a tungsten film with a thickness of 50 nm, an aluminum-silicon alloy (Al—Si) film with a thickness of 500 nm, and a titanium nitride film with a thickness of 30 nm are sequentially stacked. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Alternatively, a single-layer structure may be adopted as well. In this embodiment, tantalum nitride is formed to a thickness of 30 nm for the first conductive film, and tungsten (W) is formed to a thickness of 370 nm for the second conductive film.

Figure 6B:
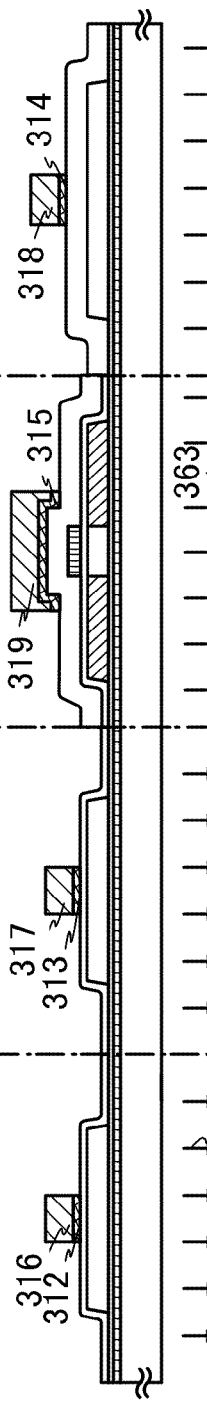
Figure 6C:
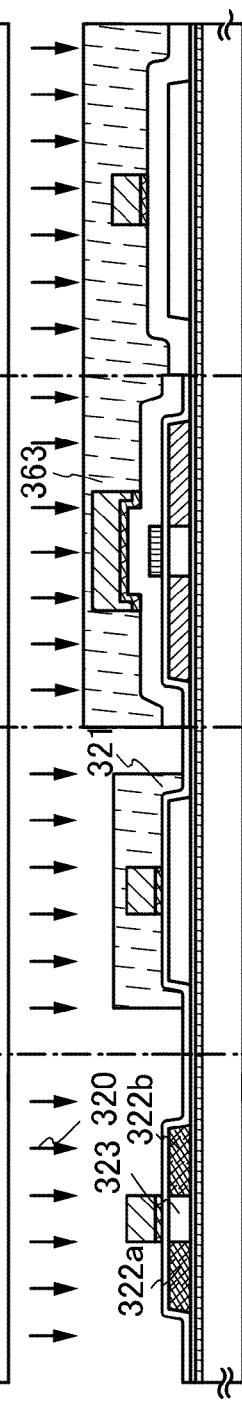
Figure 6D:
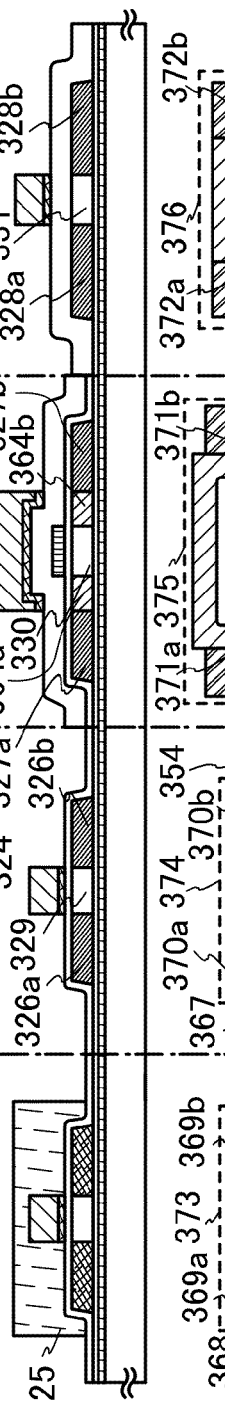

The first conductive film and the second conductive film are etched to form first gate electrode layers 312, 313, and 314; second gate electrode layers 316, 317, and 318; a first control gate electrode layer 315; and a second control gate electrode layer 319 (see FIG. 6B).

In this embodiment, an example in which the first gate electrode layer and the second gate electrode layer (the first control gate electrode layer and the second control gate electrode layer) are formed to have perpendicular side surfaces is shown; however, the present invention is not limited thereto. Both the first gate electrode layer and the second gate electrode layer (the first control gate electrode layer and the second control gate electrode layer) may have tapered shapes, or either the first gate electrode layer or the second gate electrode layer (the first control gate electrode layer or the second control gate electrode layer) may have tapered shapes while the other gate electrode layer may have perpendicular side surfaces by anisotropic etching. The taper angles may be different or equal among the stacked gate electrode layers. With the tapered shape, coverage of a film stacked thereover is improved and defects are reduced, which improves reliability.

The gate insulating layers 308 and 309 may be etched to some extent and thinned (so-called film reduction) by the etching step in forming the gate electrode layers (and the control gate electrode layers).

Next, a mask 321 covering the semiconductor layer 304 and a mask 363 covering the semiconductor layers 305 and 306 are formed. An impurity element 320 imparting p-type conductivity is added using the masks 321 and 363, the first gate electrode layer 312, and the second gate electrode layer 316 as masks to form a p-type impurity region 322a and a p-type impurity region 322b. In this embodiment, boron (B) is used as the impurity element. Here, doping is performed so that the p-type impurity region 322a and the p-type impurity region 322b contain the impurity element imparting p-type conductivity at a concentration of about $1 \times 10^{20}$ atoms/cm$^3$ to $5 \times 10^{21}$ atoms/cm$^3$. Further, a channel formation region 323 is formed in the semiconductor layer 303 (see FIG. 6C).

The p-type impurity region 322a and the p-type impurity region 322b are high concentration p-type impurity regions which serve as a source region and a drain region.

Next, a mask 325 covering the semiconductor layer 303 is formed. An impurity element 324 imparting n-type conductivity is added using the mask 325, the first gate electrode layer 313, the second gate electrode layer 317, the first gate electrode layer 314, the second gate electrode layer 318, the first control gate electrode layer 315, and the second control gate electrode layer 319 as masks to form n-type impurity regions 326a, 326b, 364a, 364b, 327a, 327b, 328a, and 328b. In this embodiment, phosphorus (P) is used as the impurity element. Here, the impurity element imparting n-type conductivity is added so that the n-type impurity regions 326a, 326b, 327a, 327b, 328a, and 328b contains the n-type impurity element at concentrations of approximately $5 \times 10^{19}$ atoms/cm$^3$ to $5 \times 10^{20}$ atoms/cm$^3$. Further, a channel formation region 329, a channel formation region 330, and a channel formation region 331 are formed in the semiconductor layer 304, the semiconductor layer 305, and the semiconductor layer 306, respectively (see FIG. 6D).

The n-type impurity regions 326a, 326b, 327a, 327b, 328a, and 328b are high concentration n-type impurity regions which serve as source regions and drain regions. On the other hand, the n-type impurity region 364a and the n-type impurity region 364b are low concentration impurity regions which become LDD regions.

The mask 325 is removed by $O_2$ ashing or with a resist stripper, and the oxide film is also removed. After that, an insulating film, namely a sidewall may be formed so as to cover sides of the gate electrode layers. The sidewall may be formed of an insulating film containing silicon by a plasma CVD method or a low pressure CVD (LPCVD) method.

In order to activate the impurity element, heat treatment, strong light irradiation, or laser light irradiation may be performed. At the same time as the activation, a plasma damage to the gate insulating layer and to an interface between the gate insulating layer and the semiconductor layer can be reduced.

Next, an interlayer insulating layer which covers the gate insulating layers and the gate electrode layers is formed. In this embodiment, a stacked-layer structure of an insulating film 367 and an insulating film 368 is employed. The insulating film 367 and the insulating film 368 each may be a silicon nitride film, a silicon nitride oxide film, a silicon oxynitride film, or a silicon oxide film formed by a sputtering method or a plasma CVD method. Further, another insulating film containing silicon may also be employed to have a single-layer structure or a stacked-layer structure including three or more layers.

Further, heat treatment is performed in a nitrogen atmosphere at 300° C. to 550° C. for 1 to 12 hours, whereby the semiconductor layer is hydrogenated. Preferably, this step is performed at 400° C. to 500° C. Through this step, dangling bonds in the semiconductor layer can be terminated by hydrogen contained in the insulating film 367 that is an interlayer insulating layer. In this embodiment, heat treatment is performed at 410° C. for one hour.

The insulating film 367 and the insulating film 368 can be formed using a material selected from inorganic insulating materials, such as aluminum nitride (AlN), aluminum oxynitride (AlON) containing a larger amount of oxygen than that of nitrogen, aluminum nitride oxide (AlNO) containing a larger amount of nitrogen than that of oxygen, aluminum oxide, diamond-like carbon (DLC), and nitrogen-containing carbon (CN). In addition, a siloxane resin may also be used. The siloxane resin corresponds to a resin including Si—O—Si bonding.

Next, using a resist mask, contact holes (openings) that reach the semiconductor layers are formed in the insulating films 367 and 368, and the gate insulating layers 308 and 309. Etching may be performed once or a plurality of times according to a selection ratio of the materials used for etching. The insulating films 367 and 368 and the gate insulating layers 308 and 309 are partly removed by etching to form openings which reach the p-type impurity regions 322a and 322b and the n-type impurity regions 326a, 326b, 327a, 327b, 328a, and 328b, which are source regions and drain regions. For the etching, wet etching, dry etching, or the both may be employed. A hydrofluoric acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas. As an inert element to be added, one or a plurality of elements selected from He, Ne, Ar, Kr, and Xe can be used.

A conductive film is formed so as to cover the openings, and the conductive film is etched to form wiring layers 369a, 369b, 370a, 370b, 371a, 371b, 372a, and 372b, which are source electrode layers and drain electrode layers electrically connected to parts of source regions and drain regions. The wiring layers can be formed by forming the conductive film by a PVD method, a CVD method, an evaporation method, or the like, and then, etching the conductive film into a desired shape. In addition, a conductive layer can be selectively formed in a predetermined position by a droplet discharge method, a printing method, an electrolytic plating method, or the like. Further, a reflow method and a damascene method may be used as well. As a material for the source and the drain electrode layers, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. Further, a layered structure of these may be used. In this embodiment, titanium (Ti) is formed to be 60 nm thick, titanium nitride is formed to be 40 nm thick, aluminum is formed to be 700 nm thick, and titanium (Ti) is formed to be 200 nm thick, and then, the stacked film is processed into a desired shape.

Figure 6E:
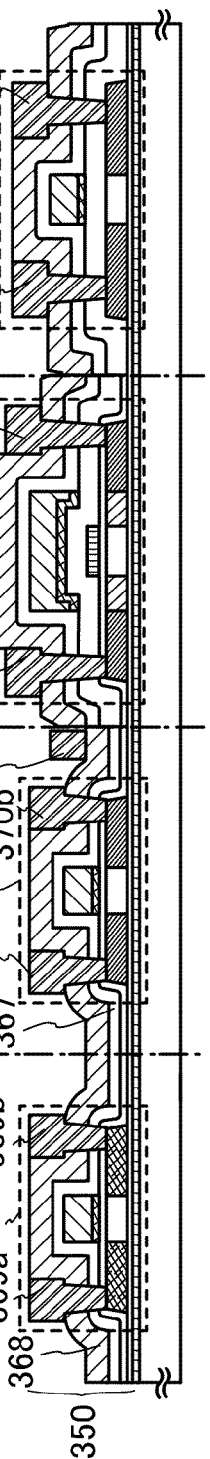

Through the above steps, a semiconductor integrated circuit 350 can be formed, which includes, in a driver circuit portion, a thin film transistor 373 which is a p-channel thin film transistor having p-type impurity regions and a thin film transistor 374 which is an n-channel thin film transistor having n-type impurity regions; and in a memory cell array, a memory element 375 having n-type impurity regions and a thin film transistor 376 which is an n-channel thin film transistor having n-type impurity regions (see FIG. 6E)

In this embodiment, an insulating layer 390 is formed over the semiconductor integrated circuit 350 (see FIG. 7A). Next, a conductive layer 380 serving as an antenna is formed over the insulating layer 390, and an inorganic insulating layer 381 is formed as a protective layer over the conductive layer 380 (see FIG. 7B).

As a first impact resistance layer 382, a structure body in which a fibrous body 383 is impregnated with an organic resin 384 is used. The structure body is heated and subjected to pressure bonding, so that the semiconductor integrated circuit 350, the first impact resistance layer 382, and a first impact diffusion layer 391 are bonded. Then, the semiconductor integrated circuit 350 is separated from the substrate 300 by using the separation layer 301. Thus, the semiconductor integrated circuit 350 is provided on the first impact resistance layer 382 side (see FIG. 7C).

As a second impact resistance layer 385, a structure body in which a fibrous body 386 is impregnated with an organic resin 387 is used, which is similar to the first impact resistance layer 382. The structure body is heated and subjected to pressure bonding, so that a second impact diffusion layer 388 and the second impact resistance layer 385 are bonded (see FIG. 8A). An adhesive layer 389 is provided on a surface, which is opposite to a surface where the second impact resistance layer 385 is provided, of the second diffusion layer 388.

Figures 8A, 8B:
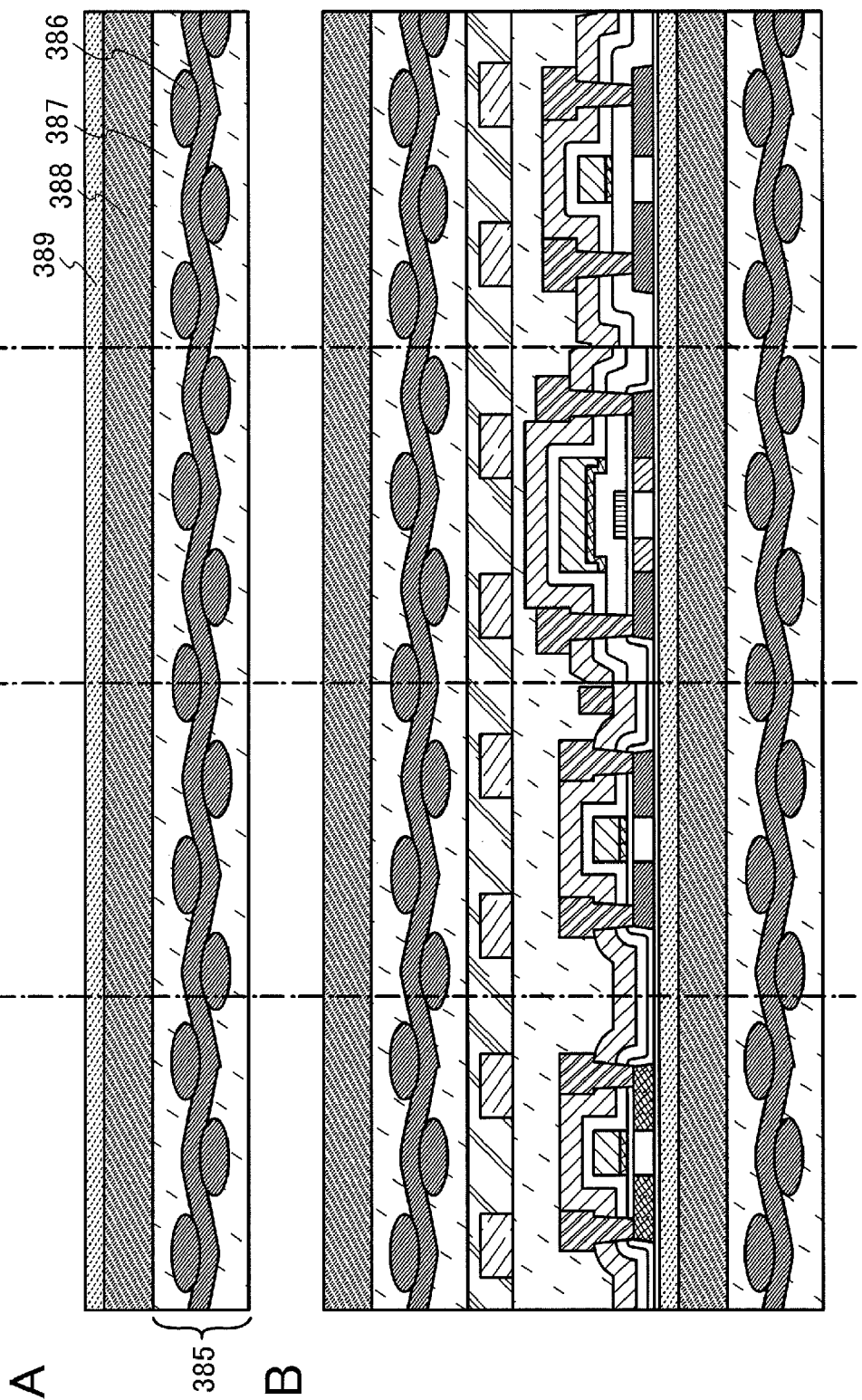
FIGS. 8A and 8B illustrate a method for manufacturing a semiconductor device.
Figure 9A:
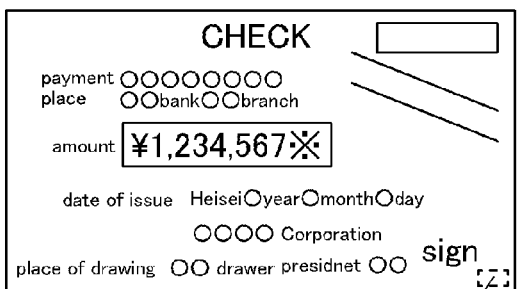
FIGS. 9A to 9G each illustrate an application example of a semiconductor device.
Figure 9B:
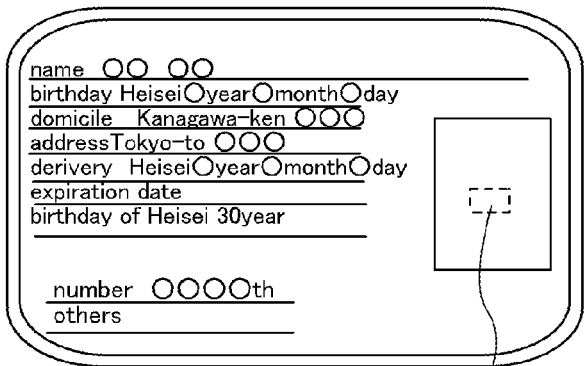
Figure 9C:
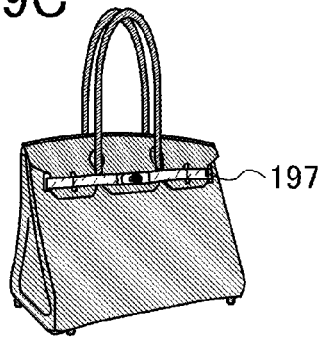
Figure 9D:
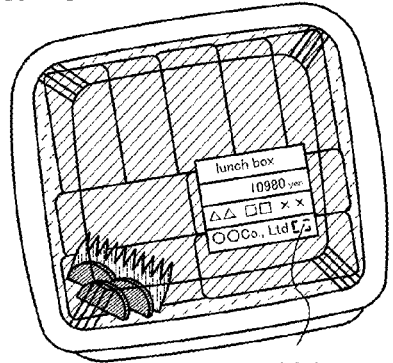
Figure 9E:
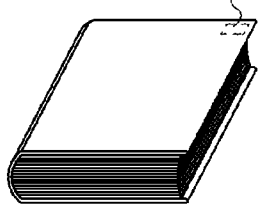
Figure 9F:
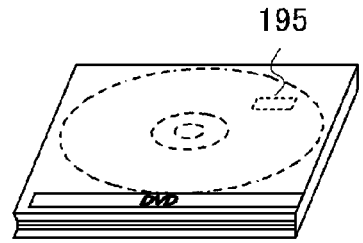
Figure 9G:
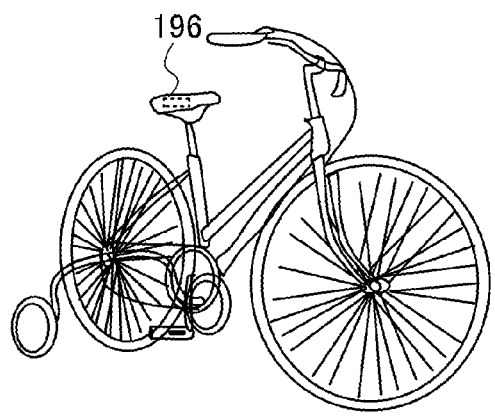

The adhesive layer 389 is bonded to an exposed separation surface of the semiconductor integrated circuit 350, so that a semiconductor device which has the semiconductor integrated circuit 350 sandwiched between the first impact resistance layer 382 and the second impact resistance layer 385, and the second impact diffusion layer 388 can be formed (see FIG. 8B). Through the above steps, a semiconductor device having a memory of this embodiment can be manufactured.

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers which sandwich the semiconductor integrated circuit, and a pair of the impact diffusion layers, a highly reliable semiconductor device which has strength while reduction in thickness and size is achieved can be provided.

Embodiment 4

In this embodiment, a highly reliable semiconductor device and a method for manufacturing a semiconductor device with a high yield will be described in detail with reference to FIGS. 17A to 17C, FIGS. 18A and 18B, and FIGS. 19A to 19D.

In a semiconductor device of this embodiment, a semiconductor integrated circuit is separated from a substrate used for formation of the semiconductor integrated circuit and sandwiched between flexible impact resistance layers. Note that a substrate over which a semiconductor integrated circuit is formed is also referred to as a formation substrate in this specification. Accordingly, the semiconductor integrated circuit is formed over the formation substrate with a separation layer interposed therebetween.

Figure 17A:
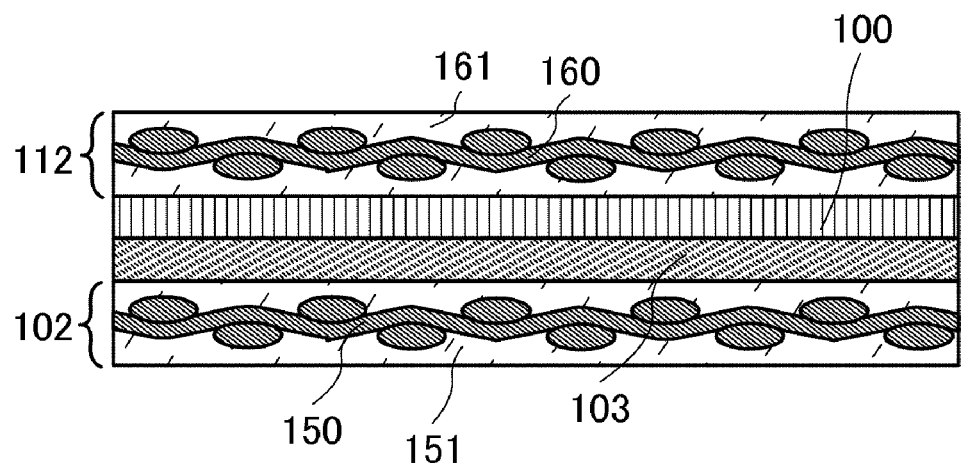
FIGS. 17A to 17C illustrate a semiconductor device.
Figure 17B:
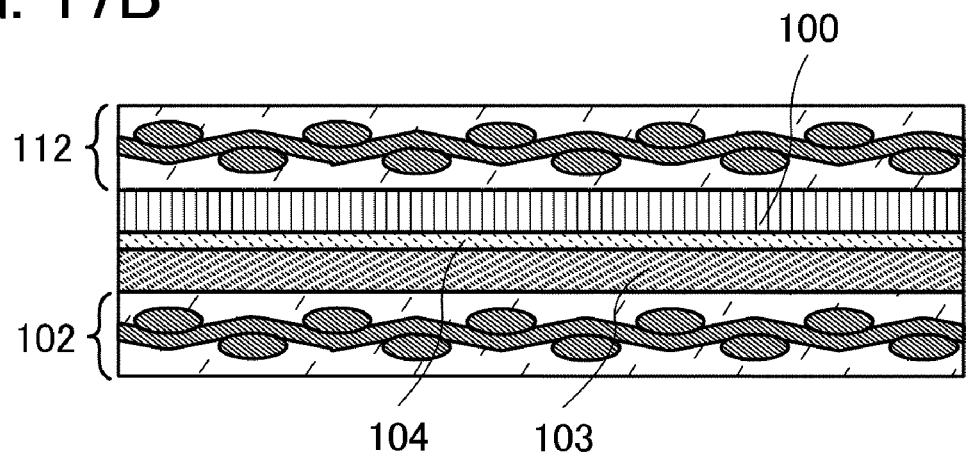

A semiconductor device of this embodiment is illustrated in FIGS. 17A and 17B. In FIG. 17A, the semiconductor integrated circuit 100 is sandwiched between the first impact resistance layer 112 and the second impact resistance layer 102, and an impact diffusion layer 103 is provided between the semiconductor integrated circuit 100 and the second impact resistance layer 102. The first impact resistance layer 112 and the second impact resistance layer 102 each have a structure body. In the structure body of first impact resistance layer 112, the fibrous body 160 is impregnated with the organic resin 161. In the structure body of the second impact resistance layer 102, the fibrous body 150 is impregnated with the organic resin 151.

Figure 17C:
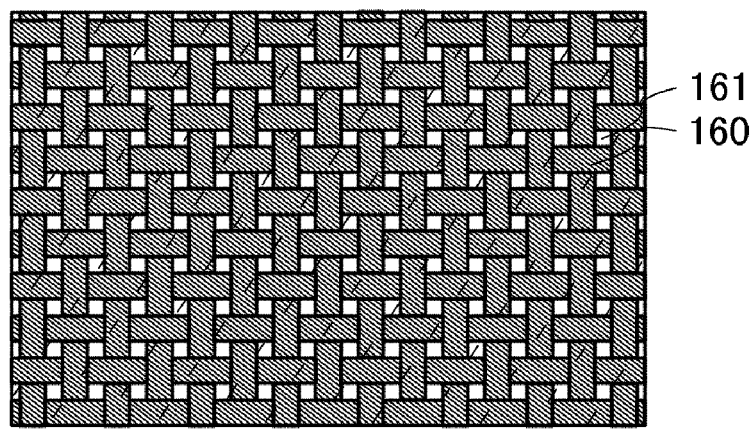

FIG. 17C illustrates a top view of a woven fabric as the fibrous body 160 which is woven using yarn bundles for warp yarns and weft yarns.

As illustrated in FIG. 17C, the fibrous body 160 is woven using warp yarns spaced at regular intervals and weft yarns spaced at regular intervals.

In drawings of this embodiment, the fibrous body 160 is illustrated as a woven fabric which is plain-woven using a yarn bundle having an elliptical shape in cross section.

In this embodiment, an aramid resin film (with a modulus of elasticity of 10 GPa and a breaking strength of 480 MPa) is used as the impact diffusion layer.

FIG. 17B illustrates an example in which the semiconductor integrated circuit 100 and the impact diffusion layer 103 are bonded to each other by using the adhesive layer 104. In this embodiment, an aramid film is used as the second impact diffusion layer 103 and an acrylic resin is used as an adhesive layer 104.

Figure 18A:
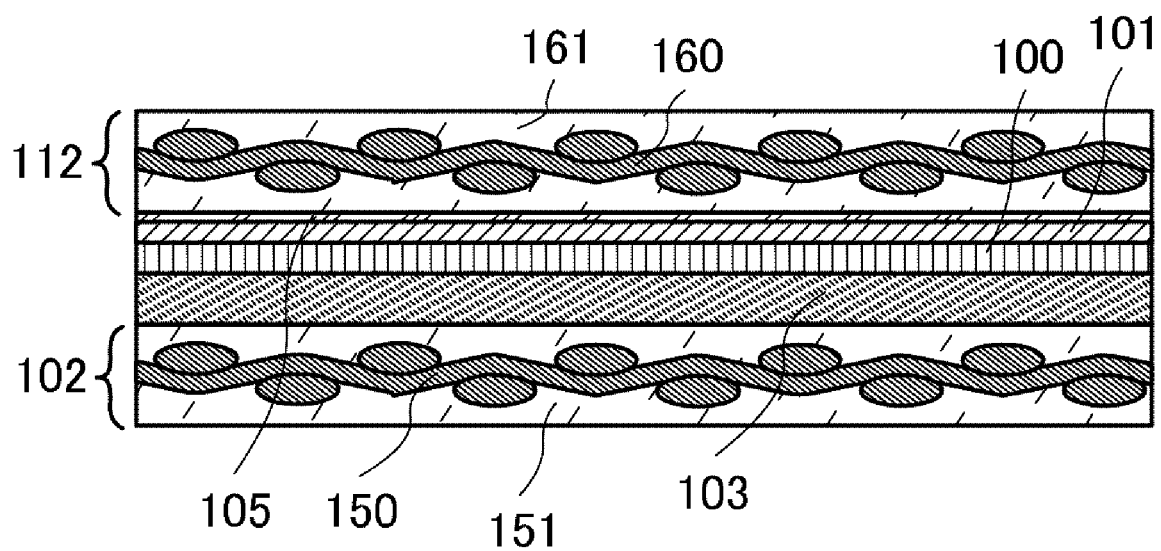
FIGS. 18A and 18B illustrate a semiconductor device.
Figure 18B:
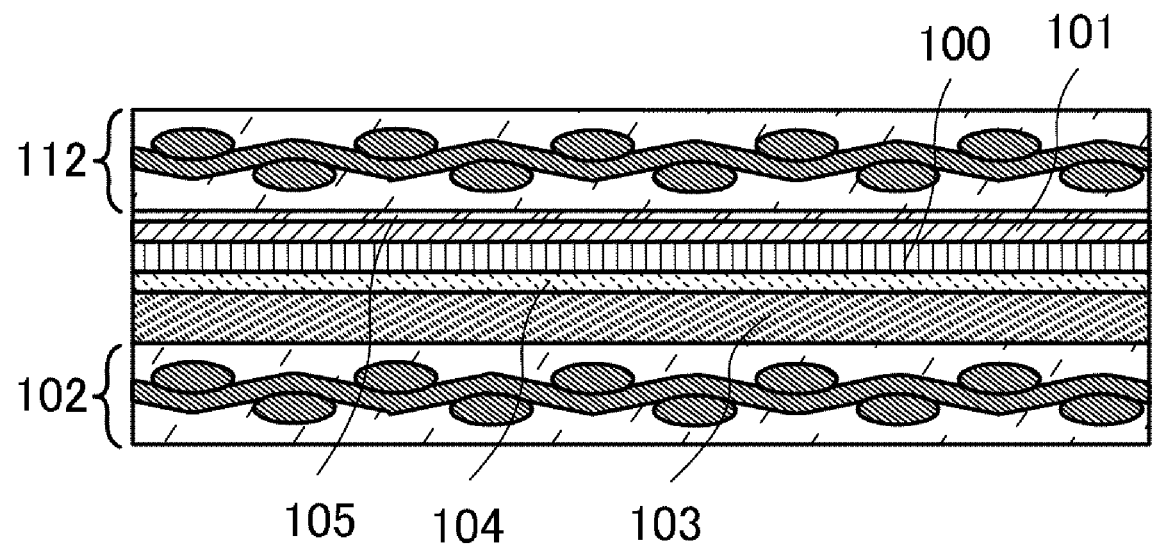

Alternatively, a protective layer may be formed over the semiconductor integrated circuit. FIGS. 18A and 18B each illustrate an example in which the inorganic insulating layer 105 is formed as a protective layer over the semiconductor integrated circuit 100. Further, in FIGS. 18A and 18B, the antenna 101 is formed over the semiconductor integrated circuit 100, and the inorganic insulating layer 105 is formed thereover. Since the antenna 101 is covered with the inorganic insulating layer 105, oxidation of a conductive layer serving as the antenna can be prevented.

A method for manufacturing a semiconductor device is illustrated with reference to FIGS. 19A to 19D. The semiconductor integrated circuit 100 is formed over the substrate 110 having an insulating surface, which is a formation substrate, with a separation layer 111 interposed therebetween (see FIG. 19A).

The semiconductor integrated circuit 100 and the first impact resistance layer 112 are bonded to each other, and then the semiconductor integrated circuit 100 is separated from the substrate 110 by using the separation layer 111. Thus, the semiconductor integrated circuit 100 is provided on the first impact resistance layer 112 side (see FIG. 19B).

In this embodiment, as the first impact resistance layer 112, a structure body in which the fibrous body 160 is impregnated with the organic resin 161 is used. The structure body is heated and subjected to pressure bonding, so that the organic resin of the structure body is plasticized or cured. In the case where the organic resin is an organic plastic resin, the organic resin which is plasticized is then cured by cooling to room temperature. By heating and pressure bonding, the organic resin is uniformly spread so as to be in close contact with the semiconductor integrated circuit, and is cured. A step in which the structure body is subjected to pressure bonding is performed under an atmospheric pressure or a reduced pressure.

The second impact resistance layer 102 also has a structure body in which the fibrous body 150 is impregnated with the organic resin 151, which is similar to the first impact resistance layer 112. The structure body is heated and subjected to pressure bonding, so that the impact diffusion layer 103 and the second impact resistance layer 102 are bonded (see FIG. 19C). The adhesive layer 104 is provided on a surface, which is opposite to a surface where the second impact resistance layer 102 is provided, of the impact diffusion layer 103.

Figure 19A:
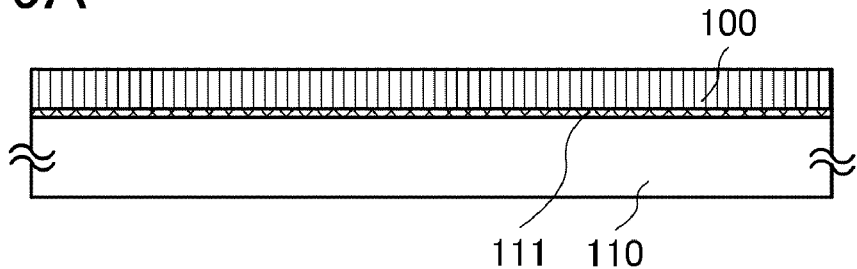
FIGS. 19A to 19D illustrate a method for manufacturing a semiconductor device.
Figure 19B:
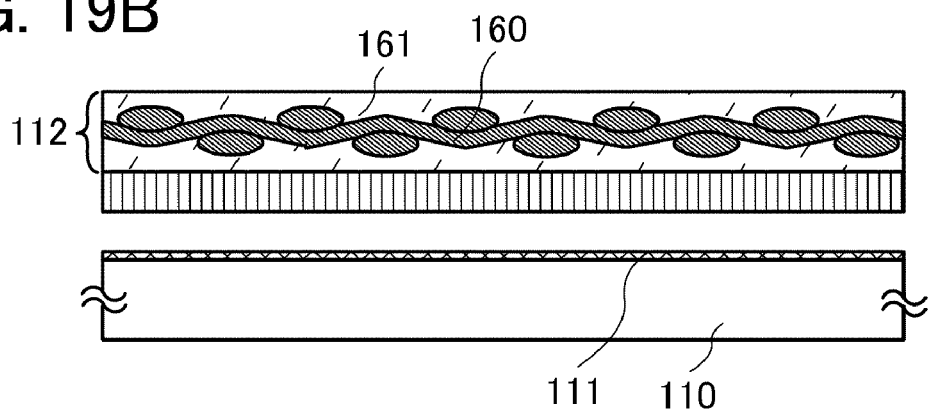
Figure 19C:
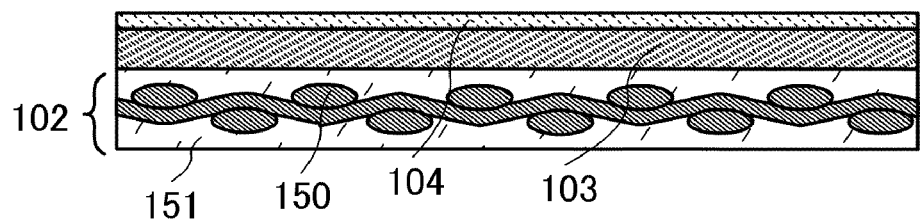
Figure 19D:
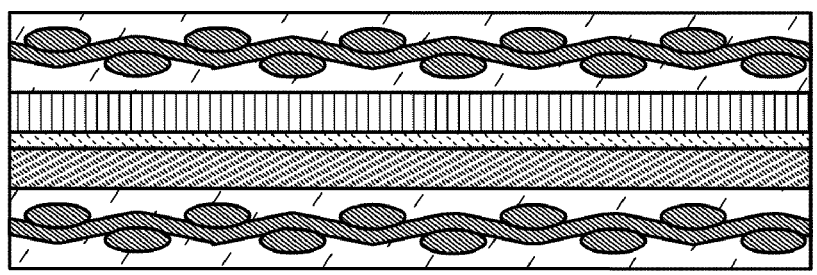

The adhesive layer 104 is bonded to an exposed separation surface of the semiconductor integrated circuit 100, so that a semiconductor device which has the semiconductor integrated circuit 100 sandwiched between the first impact resistance layer 112 and the second impact resistance layer 102, and the impact diffusion layer 103 can be formed (see FIG. 19D).

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers sandwiching the semiconductor integrated circuit and the impact diffusion layer provided to be stacked on the semiconductor integrated circuit, a highly reliable semiconductor device which has strength while reduction in thickness and size is achieved can be provided.

Embodiment 5

In this embodiment, a highly reliable semiconductor device and a method for manufacturing a semiconductor device with a high yield will be described with reference to FIGS. 4A to 4C and FIGS. 20A and 20B. In this embodiment, as an example of a semiconductor device, a CMOS will be described.

Figure 4B:
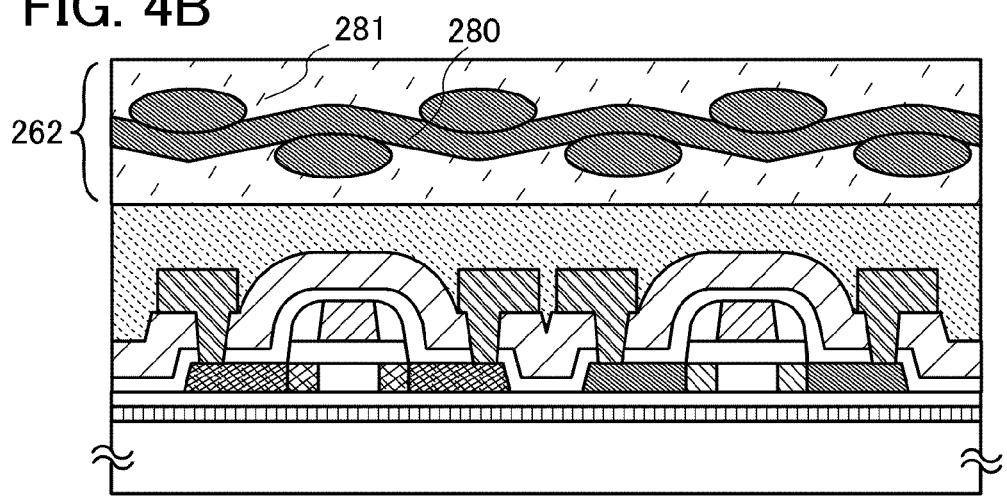
Figure 4C:
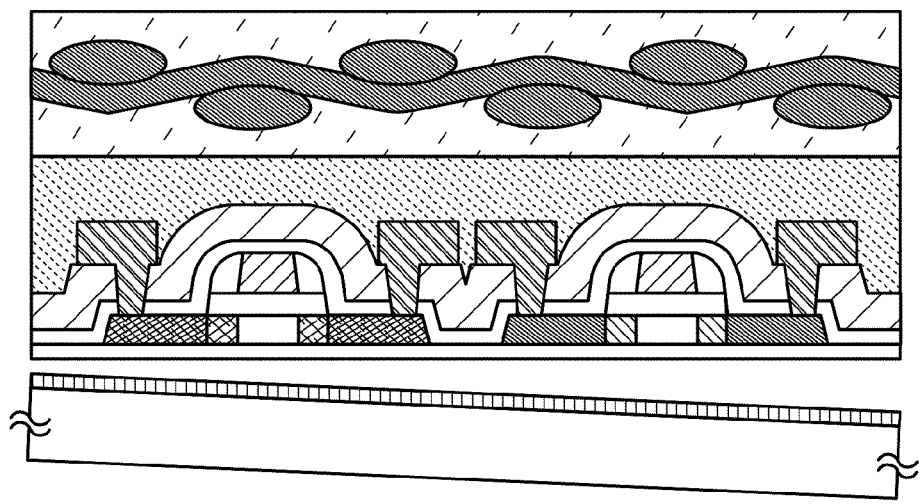
Figure 20A:
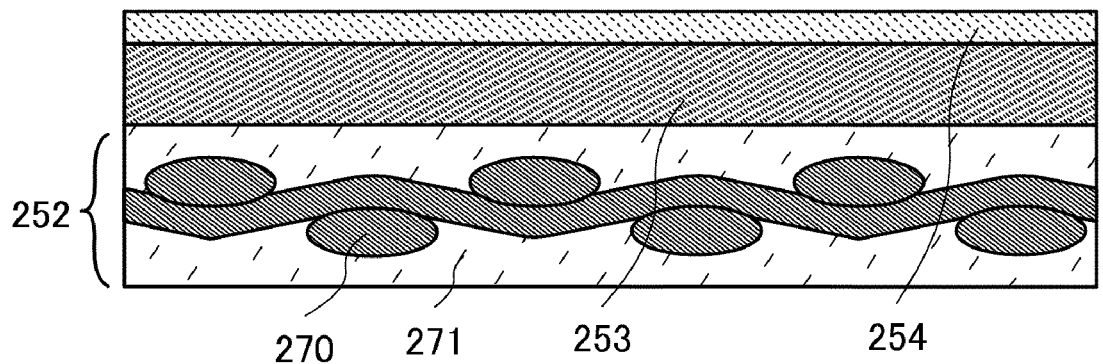
FIGS. 20A and 20B illustrate a method for manufacturing a semiconductor device.

FIG. 20A illustrates a step following the step illustrated in FIG. 4C in Embodiment 2. Thus, formation may be performed in a manner similar to that of Embodiment 2, and detailed description of steps illustrated in FIGS. 4A to 4C is omitted.

The second impact resistance layer 252 has a structure body in which the fibrous body 270 is impregnated with an organic resin 271, which is similar to the first impact resistance layer 262. The structure body is heated and subjected to pressure bonding, so that the impact diffusion layer 253 and the second impact resistance layer 252 are bonded to each other (see FIG. 20A).

The adhesive layer 254 is provided on a surface, which is opposite to a surface where the second impact resistance layer 252 is provided, of the impact diffusion layer 253.

Figure 20B:
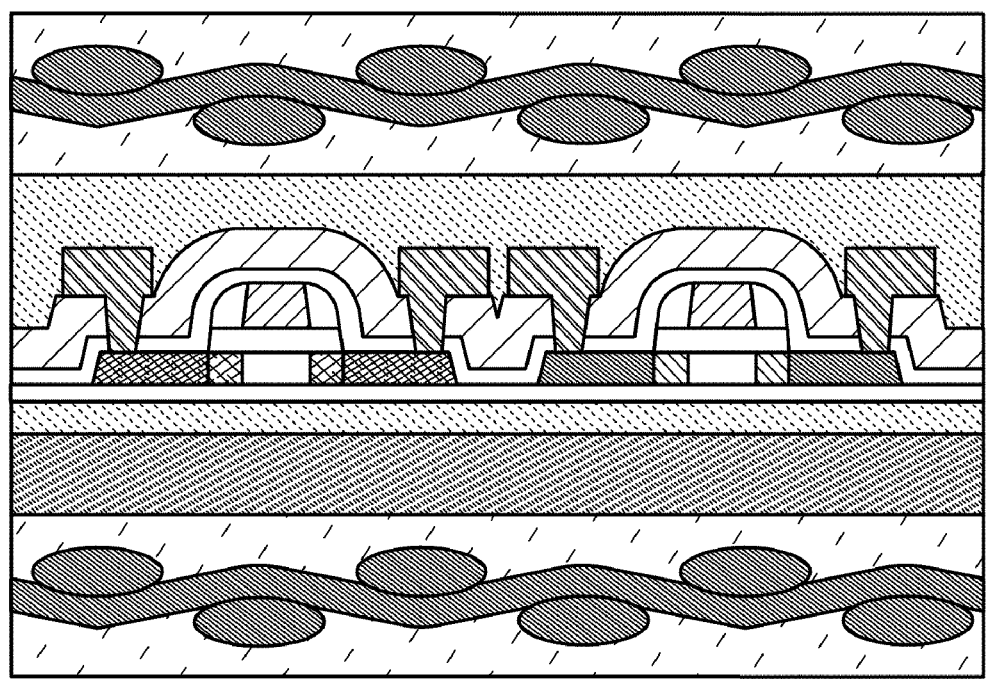

The adhesive layer 254 is bonded to an exposed separation surface of the semiconductor integrated circuit 250, so that a semiconductor device which has the semiconductor integrated circuit 250 sandwiched between the first impact resistance layer 262 and the second impact resistance layer 252 and the impact diffusion layer 253 can be formed (see FIG. 20B).

The semiconductor device manufactured in this embodiment can be a flexible semiconductor device by provision of flexible impact resistance layers and an impact diffusion layer.

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers which sandwich the semiconductor integrated circuit, and the impact diffusion layer which is provided to be stacked on the semiconductor integrated circuit, a highly reliable semiconductor device which has strength while reduction in thickness and size is achieved can be provided.

Embodiment 6

In this embodiment, an example of a semiconductor device having a memory, as a semiconductor device which achieves higher integration and further reduction in thickness and size, and a manufacturing method thereof will be described with reference to FIGS. 6A to 6E, FIGS. 21A to 21C, and FIGS. 22A and 22B.

A semiconductor device of this embodiment includes a memory including a memory cell array and a driver circuit portion which drives the memory cell array.

Figure 21A:
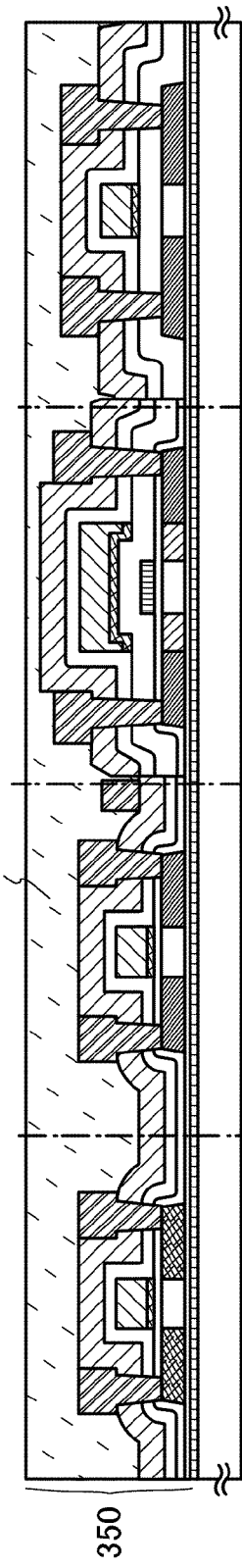
FIGS. 21A to 21C illustrate a method for manufacturing a semiconductor device.
Figure 21B:
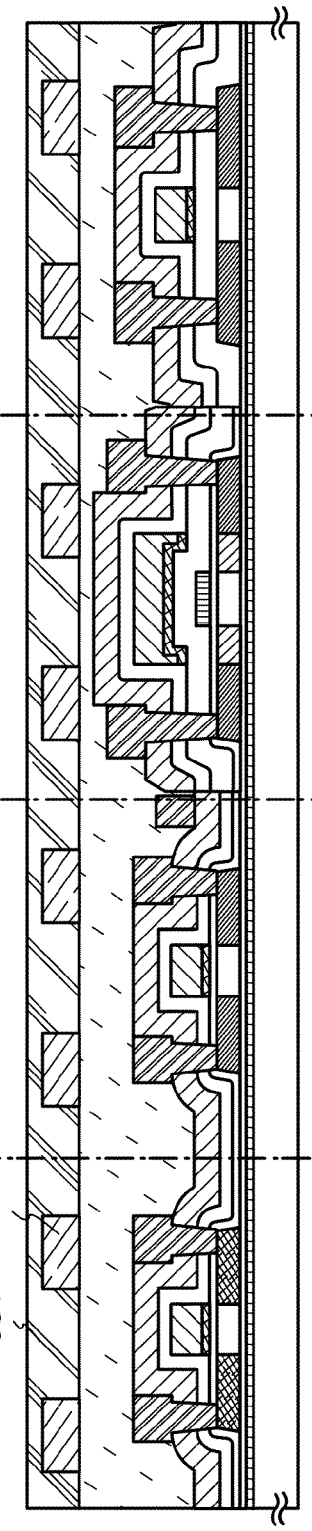
Figure 21C:
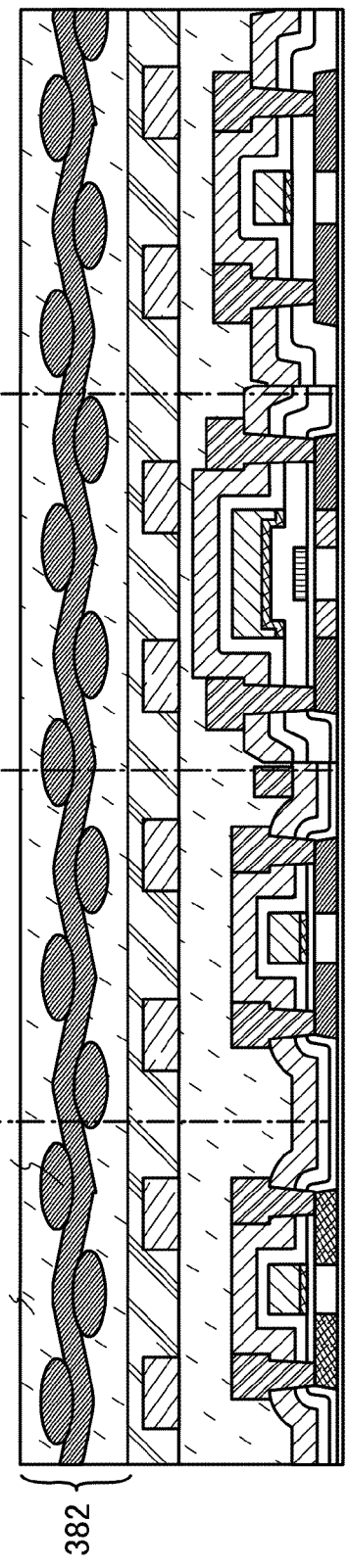

FIG. 21A illustrate a step following the step illustrated in FIG. 6E in Embodiment 3. Thus, formation may be performed in a manner similar to that of Embodiment 3, and detailed description of the steps illustrated in FIGS. 6A to 6E are omitted.

In this embodiment, the insulating layer 390 is formed over the semiconductor integrated circuit 350 (see FIG. 21A). Next, the conductive layer 380 serving as an antenna is formed over the insulating layer 390, and the inorganic insulating layer 381 is formed as a protective layer over the conductive layer 380 (see FIG. 21B).

As the first impact resistance layer 382, a structure body in which the fibrous body 383 is impregnated with the organic resin 384 is used. The semiconductor integrated circuit 350 and the first impact resistance layer 382 is bonded to each other, and then the semiconductor integrated circuit 350 is separated from the substrate 300 by using the separation layer 301. Thus, the semiconductor integrated circuit 350 is provided on the first impact resistance layer 382 side (see FIG. 21C).

The second impact resistance layer 385 has a structure body in which the fibrous body 386 is impregnated with the organic resin 387, which is similar to the first impact resistance layer 382. The structure body is heated and subjected to bonding pressure, so that the impact diffusion layer 388 and the second impact resistance layer 385 can be bonded (see FIG. 22A). The adhesive layer 389 is provided on a surface, which is opposite to a surface where the second impact resistance layer 385 is provided, of the impact diffusion layer 388.

Figure 22A:
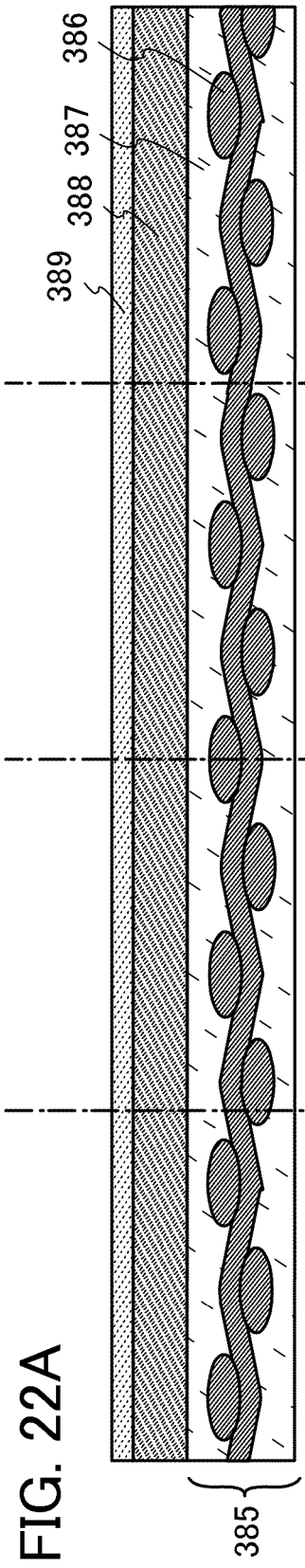
FIGS. 22A and 22B illustrate a method for manufacturing a semiconductor device.
Figure 22B:
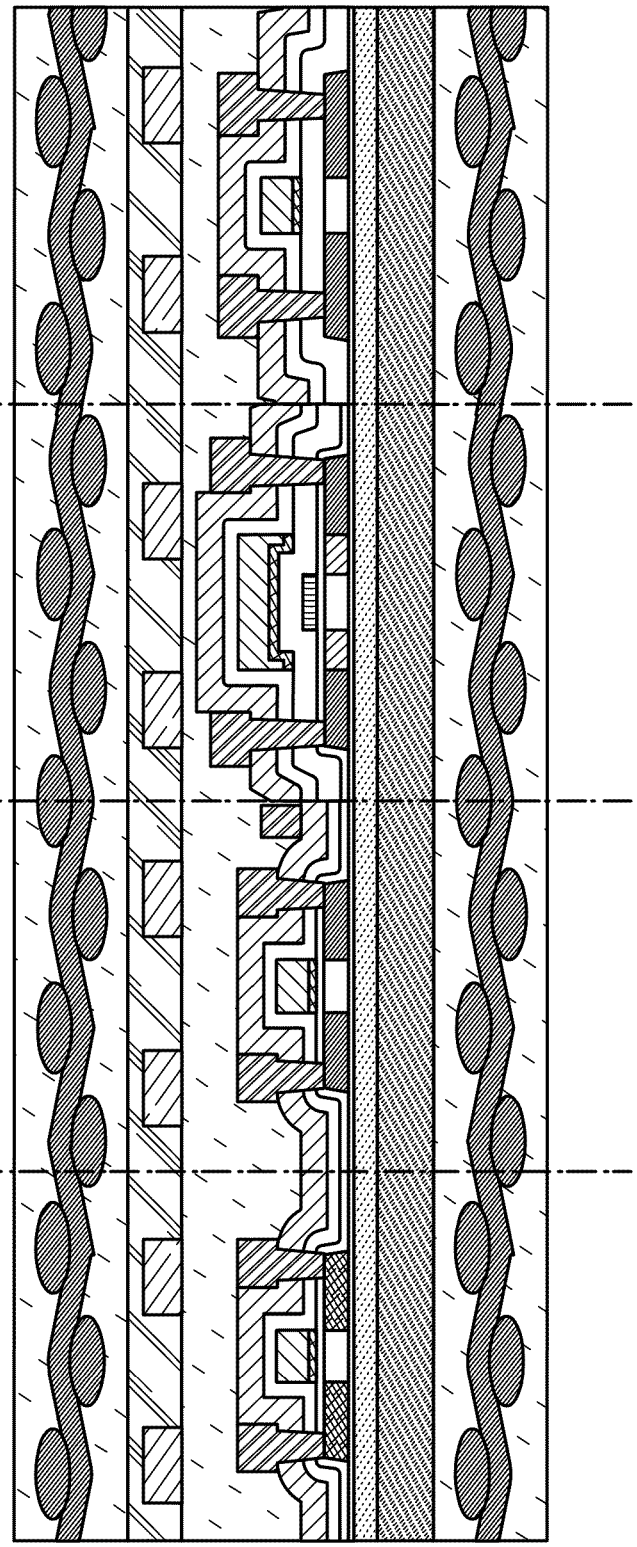

The adhesive layer 389 is bonded to an exposed separation surface of the semiconductor integrated circuit 350, so that a semiconductor device which has the semiconductor integrated circuit 350 sandwiched between the first impact resistance layer 382 and the second impact resistance layer 385 and the impact diffusion layer 388 can be manufactured (see FIG. 22B). Through the above steps, a semiconductor device having a memory of this embodiment can be manufactured.

Adverse influences such as damage or deterioration in characteristics are not given to the semiconductor integrated circuit even if pressure treatment is performed in the manufacture process because the impact diffusion layer is provided in contact with the semiconductor integrated circuit. Thus, the semiconductor device can be manufactured with a high yield.

With a pair of the impact resistance layers which sandwich the semiconductor integrated circuit, and the impact diffusion layer which is provided to be stacked on the semiconductor integrated circuit, a highly reliable semiconductor device which has strength while reduction in thickness and size is achieved can be provided.

Embodiment 7

In a semiconductor device, a variety of types of field effect transistors can be used as semiconductor elements included in a semiconductor integrated circuit. In this embodiment, as a semiconductor element applied to the present invention, a field effect transistor including a single crystal semiconductor layer will be described in detail.

A method is described below with reference to FIGS. 14A to 14D and FIGS. 15A to 15C, in which a single crystal semiconductor layer made from a single crystal semiconductor substrate is provided over a formation substrate which is a substrate having an insulating surface and a semiconductor element included in a semiconductor integrated circuit portion is formed.

Figure 14A:
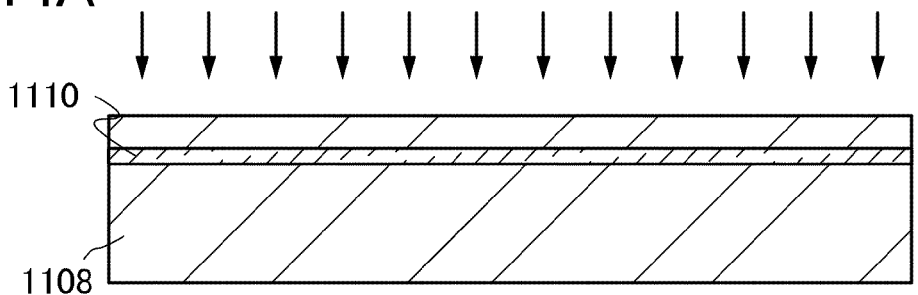
FIGS. 14A to 14D illustrate a method for manufacturing a semiconductor device.

A single crystal semiconductor substrate 1108 illustrated in FIG. 14A is cleaned, and ions accelerated by an electric field are added to reach a predetermined depth from the surface of the single crystal semiconductor substrate 1108 to form a weakened layer 1110. Ion irradiation is performed taking a thickness of the single crystal semiconductor layer which is transferred to the formation substrate into consideration. The accelerating voltage at irradiation with ions is set in consideration of such a thickness, and then the single crystal semiconductor substrate 1108 is irradiated with the ions. A region which is weakened so as to include microvoids made by the action of ions by irradiation of a single crystal semiconductor substrate with ions is referred to as a weakened layer.

As the single crystal semiconductor substrate 1108, a commercial single crystal semiconductor substrate can be used. For example, a single crystal semiconductor substrate formed of a group IV element, such as a single crystal silicon substrate, a single crystal germanium substrate, or a single crystal silicon germanium substrate can be used. Alternatively, a compound semiconductor substrate formed of gallium arsenide, indium phosphide, or the like may be used. As the semiconductor substrate, a polycrystalline semiconductor substrate may be used. Needless to say, the single crystal semiconductor substrate is not limited to a circular wafer, and single crystal semiconductor substrates having various shapes can be used. For example, a polygonal substrate such as a rectangular substrate, a pentagonal substrate, a hexagonal substrate, or the like can be used. Needless to say, a commercial circular single crystal semiconductor wafer can be used as the single crystal semiconductor substrate. As a circular single crystal semiconductor wafer, a semiconductor wafer of silicon, germanium, or the like; a compound semiconductor wafer of gallium arsenide, indium phosphide, or the like can be used. A typical example of the single crystal semiconductor wafer is a single crystal silicon wafer, and a circular wafer which is 5 inches (125 mm) in diameter, 6 inches (150 mm) in diameter, 8 inches (200 mm) in diameter, 12 inches (300 mm) in diameter, 400 mm in diameter, or 450 mm in diameter can be used. In addition, a rectangular single crystal semiconductor substrate can be formed by cutting a commercial circular single crystal semiconductor wafer. The substrate can be cut with a cutting apparatus such as a dicer or a wire saw; laser cutting; plasma cutting; electron beam cutting; or any other cutting means. In addition, a rectangular single crystal semiconductor substrate can be formed in such a way that an ingot for manufacturing a semiconductor substrate before being sliced into a substrate is processed into a rectangular solid so as to have a rectangular shape in a cross section and this rectangular solid ingot is sliced. In addition, although there is no particular limitation on the thickness of the single crystal semiconductor substrate, a thick single crystal semiconductor substrate is preferred because many single crystal semiconductor layers can be formed from one piece of thick material wafer, in consideration of reuse of the single crystal semiconductor substrate. The thickness of single crystal silicon wafers circulating in the market conforms to SEMI standards, which specify that, for example, a wafer of 6 inches in diameter has a thickness of 625 μm, a wafer of 8 inches in diameter has a thickness of 725 μm, and a wafer of 12 inches in diameter has a thickness of 775 μm. Note that the thickness of a wafer conforming to SEMI standards has a tolerance of ±25 μm. Needless to say, the thickness of the single crystal semiconductor substrate which is used as a material is not limited to SEMI standards, the thickness can be adjusted as appropriate when an ingot is sliced. Naturally, when a single crystal semiconductor substrate 1108 which has been used is used again, the thickness of the substrate is thinner than that of SEMI standards. A single crystal semiconductor layer obtained over a formation substrate can be determined by selecting a semiconductor substrate to serve as a base.

Further, the crystal plane orientation of the single crystal semiconductor substrate 1108 may be selected depending on a semiconductor element to be manufactured (a field effect transistor in this embodiment). For example, a single crystal semiconductor substrate having a crystal plane {100}, a crystal plane {110}, or the like can be used.

In this embodiment, an ion irradiation separation method in which hydrogen, helium, or fluorine ions are added to a single crystal semiconductor substrate at a predetermined depth, heat treatment is then conducted, and a single crystal semiconductor layer, which is an outer layer, is separated can be used. Alternatively, a method in which single crystal silicon is epitaxially grown over porous silicon and the porous silicon layer is separated by cleavage caused by water jetting may also be employed.

A single crystal silicon substrate is used as the single crystal semiconductor substrate 1108, the surface thereof is processed with dilute hydrofluoric acid, a native oxide film is removed and a contaminant such as dust which is attached to the surface is also removed, and the surface of the single crystal semiconductor substrate 1108 is purified.

Ions may be added (introduced) to form the weakened layer 1110 by an ion doping method (abbreviated as an ID method) or an ion implantation method (abbreviated as an II method). The weakened layer 1110 is formed by addition of ions of hydrogen, helium, or halogen typified by fluorine. In the case of adding fluorine ions as the halogen element, $BF_3$ may be used as a source gas. Note that ion implantation is a method in which ionized gas is mass separated and added to a semiconductor substrate.

For example, in the case of employing an ion implantation method, an ionized hydrogen gas is mass separated so that only $H^+$ (or $H_2^+$) can be selectively accelerated and added to the single crystal semiconductor substrate.

In accordance with an ion doping method, plural kinds of ion species are formed in plasma without mass separation of an ionized gas and accelerated, and a single crystal semiconductor substrate is doped with the accelerated ion species. For example, of hydrogen ions including $H^+$, $H_2^+$, and $H_3^+$ ions, $H_3^+$ ions typically account for 50% or higher of ions which are to be used for doping; generally, $H_3^+$ ions account for 80% and the other ions (H+ and $H_2^+$ ions) account for 20% of the ions which are to be used for doping. Here, to add only an ion species of $H_3^+$ is also referred to as ion doping.

In addition, irradiation may be performed using a single kind of ions or plural kinds of ions of the same atom which have different masses. For example, in the case of irradiation with hydrogen ions, it is preferable that $H^+$, $H_2^+$, and $H_3^+$ ions be contained and the proportion of $H_3^+$ ions be made higher. In the case of irradiation with hydrogen ions, irradiation efficiency can be increased and thus an irradiation time can be shortened by increasing the proportion of an $H_3^+$ ion and containing $H^+$, $H_2^+$, and $H_3^+$ ions as well. With such a structure, separation can be easily performed.

Hereinafter, an ion doping method and an ion implantation method will be described in detail. In an ion doping apparatus (also referred to as an ID apparatus) used in an ion doping method, a plasma space is large, so that the single crystal semiconductor substrate can be irradiated with a large amount of ions. On the other hand, an ion implantation apparatus (also referred to as an II apparatus) used in an ion implantation method has a characteristic that ions extracted from plasma are mass analyzed and only specific ion species can be implanted into a semiconductor substrate. In the ion implantation method, basically, processing is performed by scanning with a point beam.

For generating plasma, for example, both apparatuses form a plasma state by thermoelectrons generated by heating a filament. However, the proportion of hydrogen ion species when irradiation of a semiconductor substrate with generated hydrogen ions ($H^+$, $H_2^+$, and $H_3^+$) is largely different between an ion doping method and an ion implantation method.

In terms of irradiation with a larger amount of $H_3^+$, it can be said that the ion doping apparatus is preferred to the ion implantation apparatus.

When the single crystal silicon substrate is irradiated with halogen ions such as hydrogen ions or fluorine ions, hydrogen or fluorine which is added knocks out (expels) silicon atoms in silicon crystal lattice, so that blank portions are created effectively and microvoids are made in a weakened layer. In this case, a change occurs in the volume of the microvoids formed in the weakened layer by heat treatment at a relatively low temperature to cause cleavage along the weakened layer, whereby a thin single crystal semiconductor layer can be formed. After the irradiation with fluorine ions, the silicon substrate may be irradiated with hydrogen ions so that hydrogen may be contained in the voids. Since the weakened layer which is formed to separate the thin single crystal semiconductor layer from the single crystal semiconductor substrate cleaves using a change in the volume of the microvoids formed in the weakened layer, it is preferable to make effective use of fluorine ions or hydrogen ions in this manner.

In addition, a protective layer may be formed between the single crystal semiconductor substrate and an insulating layer that is bonded to the single crystal semiconductor layer. The protective layer can be formed of a single layer or a layered structure of a plurality of layers selected from a silicon nitride layer, a silicon oxide layer, a silicon nitride oxide layer, and a silicon oxynitride layer. These layers can be formed over the single crystal semiconductor substrate before the weakened layer is formed in the single crystal semiconductor substrate. Alternatively, such a layer may be formed over the single crystal semiconductor substrate after the weakened layer is formed in the single crystal semiconductor substrate.

Note that a silicon oxynitride film means a film that contains a larger amount of oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains a larger amount of nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

It is necessary to add ions under a high dose condition in the formation of the weakened layer, and the surface of the single crystal semiconductor substrate 1108 becomes rough in some cases. Therefore, a protective layer against irradiation with ions may be provided on a surface which is irradiated with ions by using a silicon nitride film, a silicon nitride oxide film, a silicon oxide film, or the like with a thickness of 50 to 200 nm.

For example, a stacked layer including a silicon oxynitride film (a thickness of 5 nm to 300 nm, desirably 30 nm to 150 nm (e.g., 50 nm)) and a silicon nitride oxide film (a thickness of 5 nm to 150 nm, desirably 10 nm to 100 nm (e.g., 50 nm)) are formed as the protective layer over the single crystal semiconductor substrate 1108 by a plasma CVD method. As an example, a silicon oxynitride film is formed to a thickness of 50 nm over the single crystal semiconductor substrate 1108, and a silicon nitride oxide film is stacked to a thickness of 50 nm over the silicon oxynitride film. A silicon oxynitride film may be a silicon oxide film formed by a chemical vapor deposition method using an organosilane gas.

In addition, the single crystal semiconductor substrate 1108 may be degreased and washed, the oxide film on the surface thereof may be removed, and thermal oxidation may be performed. As thermal oxidation, general dry oxidation may be performed; however, oxidation in an oxidizing atmosphere to which halogen is added is preferably performed. For example, heat treatment is performed at a temperature of 700° C. or higher in an atmosphere containing HCl at 0.5 volume % to 10 volume % (preferably 3 volume %) with respect to oxygen. The thermal oxidation is preferably performed at a temperature of 950° C. to 1100° C. Processing time may be 0.1 to 6 hours, preferably 0.5 to 3.5 hours. The thickness of the oxide film to be formed is 10 nm to 1000 nm (preferably, 50 nm to 200 nm), and for example, the thickness is 100 nm.

As the one that contains halogen, besides HCl, one or more selected from HF, $NF_3$, HBr, $Cl_2$, $ClF_3$, $BCl_3$, $F_2$, $Br_2$, and dichloroethylene can be applied.

By performing heat treatment in such a temperature range, a gettering effect by a halogen element can be obtained. Gettering particularly has an effect of removing a metal impurity. That is, an impurity such as metal changes into a volatile chloride and is diffused into the air to be removed by an action of chlorine. The gettering is effective in one in which the surface of the single crystal semiconductor substrate 1108 is subjected to chemical mechanical polishing (CMP) treatment. In addition, hydrogen has a function of compensating a defect at the interface between the single crystal semiconductor substrate 1108 and the insulating layer and reducing a localized state density at the interface. Thus the interface between the single crystal semiconductor substrate 1108 and the insulating layer is inactivated, so that electric characteristics are stabilized.

Halogen can be contained in the oxide film formed by this heat treatment. A halogen element is contained at a concentration of $1\times10^{17}$ atoms/cm³ to $5\times10^{20}$ atoms/cm³, whereby the oxide film can function as a protective layer which captures an impurity such as metal and prevents contamination of the single crystal semiconductor substrate 1108.

When the weakened layer 1110 is formed, accelerating voltage and the total number of ions can be adjusted in accordance with the thickness of a film deposited over the single crystal semiconductor layer, the thickness of the targeted single crystal semiconductor layer which is to be separated from the single crystal semiconductor substrate and transferred to the formation substrate, and ion species which are added.

For example, a hydrogen gas is used as a material, and the single crystal semiconductor substrate is irradiated with ions whose total number is $2\times10^{16}$ ions/cm² at an accelerating voltage of 40 kV by an ion doping method, so that the weakened layer can be formed. If the protective layer is formed to have a large thickness, when ions are added under the same condition and the weakened layer is formed, a thin single crystal semiconductor layer can be formed as a targeted single crystal semiconductor layer which is separated from the single crystal semiconductor substrate and transferred (transposed) to the formation substrate. For example, although it depends on the proportion of ion species ($H^+$, $H_2^+$, and $H_3^+$ ions), in the case where the weakened layer is formed under the above conditions and a silicon oxynitride film (a thickness of 50 nm) and a silicon nitride oxide film (a thickness of 50 nm) are stacked as a protective layer over the single crystal semiconductor substrate, the thickness of the single crystal semiconductor layer to be transferred to the formation substrate is approximately 120 nm; or in the case where a silicon oxynitride film (a thickness of 100 nm) and a silicon nitride oxide film (a thickness of 50 nm) are stacked as a protective layer over the single crystal semiconductor substrate under the above conditions, the thickness of the single crystal semiconductor layer to be transferred to the formation substrate is approximately 70 nm.

In the case where helium (He) or hydrogen is used as a source gas, ions are added with an accelerating voltage in the range of 10 kV to 200 kV and with a dose in the range of $1\times10^{16}$ ions/cm² to $6\times10^{16}$ ions/cm² so that the weakened layer can be formed. In the case where helium is used as a source gas, $He^+$ ions can be added as main ions without mass separation. In addition, in the case where hydrogen is used as a source gas, $H_3^+$ ions and $H_2^+$ ions can be added as main ions. Ion species changes depending on a plasma generation method, pressure, the supply quantity of a source gas, or accelerating voltage.

As another example of formation of the weakened layer, a silicon oxynitride film (a thickness of 50 nm), a silicon nitride oxide film (a thickness of 50 nm), and a silicon oxide film (a thickness of 50 nm) are stacked as a protective layer over the single crystal semiconductor substrate, and hydrogen is added at an accelerating voltage of 40 kV and a dose of $2\times10^{16}$ ions/cm² to form the weakened layer in the single crystal semiconductor substrate. Then, a silicon oxide film (a thickness of 50 nm) is formed as an insulating layer having a bonding surface over the silicon oxide film, which is a top layer of the protective layer. As another example of the formation of the weakened layer, a silicon oxide film (a thickness of 100 nm) and a silicon nitride oxide film (a thickness of 50 nm) are stacked as a protective layer over the single crystal semiconductor substrate, and hydrogen is added at an accelerating voltage of 40 kV and a dose of $2\times10^{16}$ ions/cm² to form the weakened layer in the single crystal semiconductor substrate. Then, a silicon oxide film (a thickness of 50 nm) is formed as an insulating layer having a bonding surface over the silicon nitride oxide film, which is a top layer of the protective layer. Note that the silicon oxynitride film or the silicon nitride oxide film may be formed by a plasma CVD method, and the silicon oxide film may be formed by a CVD method using an organosilane gas.

Alternatively, an insulating layer may be formed between the formation substrate and the single crystal semiconductor substrate. The insulating layer may be formed on one of the formation substrate side and the single crystal semiconductor substrate side or the both. The insulating layer which is formed on a surface to be bonded has a smooth surface and forms a hydrophilic surface. As the insulating layer, a silicon oxide film can be used. As the silicon oxide film, a silicon oxide film formed by a chemical vapor deposition method using an organosilane gas is preferred. Alternatively, a silicon oxide film formed by a chemical vapor deposition method using a silane gas may be used.

Examples of organosilane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, in the case where a silicon oxide layer is formed by a chemical vapor deposition method using organosilane as a source gas, it is preferable to mix a gas which provides oxygen. For a gas which provides oxygen, oxygen, nitrous oxide, nitrogen dioxide, or the like can be used. Further, an inert gas such as argon, helium, nitrogen, hydrogen, or the like may be mixed.

In addition, as the insulating layer which is formed on the surface to be bonded, a silicon oxide film formed by a chemical vapor deposition method using silane such as monosilane, disilane, or trisilane as a source gas can also be used. Also in this case, it is preferable to mix an inert gas, a gas which provides oxygen, or the like. In addition, the silicon oxide film which serves as an insulating layer and is bonded to the single crystal semiconductor layer may contain chlorine. Note that a chemical vapor deposition (CVD) method herein includes a plasma CVD method, a thermal CVD method, and a photo-CVD method in its category.

Alternatively, as the insulating layer which is formed on the surface to be bonded, silicon oxide formed by heat treatment under an oxidizing atmosphere, silicon oxide which grows by reaction of an oxygen radical, chemical oxide formed using an oxidative chemical solution, or the like may be used. As the insulating layer, an insulating layer including siloxane (Si—O—Si) bond may be used. Alternatively, the organosilane gas may react with an oxygen radical or a nitrogen radical to form the insulating layer.

Alternatively, as the insulating layer which is formed on the surface to be bonded, an oxide film containing aluminum oxide as its main component may be used. The oxide film containing aluminum oxide as its main component refers to an oxide film in which aluminum oxide is contained at least 10 wt. % where the total amount of all components in the oxide film is 100 wt. %. Alternatively, as the insulating layer, a film which contains aluminum oxide as its main component and also contains one of magnesium oxide and strontium oxide or the both can be used. Moreover, aluminum oxide containing nitrogen may be used.

The insulating layer can be formed by a sputtering method. As a target used in a sputtering method, metal including aluminum or metal oxide such as aluminum oxide can be used, for example. Note that a material of the target may be selected as appropriate depending on the film to be formed.

When metal is used as the target, the insulating layer is formed in such a manner that sputtering is performed while a reactive gas (e.g., oxygen) is introduced (by a reactive sputtering method). As the metal, magnesium (Mg); an alloy containing aluminum and magnesium; an alloy containing aluminum and strontium (Sr); or an alloy containing aluminum, magnesium, and strontium can be used other than aluminum. In this case, sputtering can be performed using a direct current (DC) power supply or a high-frequency (RF) power supply.

When metal oxide is used as the target, the insulating layer is formed by sputtering with a radio frequency (RF) power supply (by an RF sputtering method). As the metal oxide, magnesium oxide; strontium oxide; oxide containing aluminum and magnesium; oxide containing aluminum and strontium; or oxide containing aluminum, magnesium, and strontium can be used other than aluminum oxide.

Alternatively, the insulating layer may be formed by a bias sputtering method. When a bias sputtering method is used, the film can be deposited and a surface of the film can be planarized.

The oxide film containing aluminum as its main component can prevent impurities such as moisture and mobile ions contained in the formation substrate from diffusing into a single crystal semiconductor layer to be formed over the formation substrate later.

The surface of the insulating layer, which is to be bonded, is preferably set as follows: arithmetic mean roughness Ra is less than 0.8 nm and root-mean-square roughness Rms is less than 0.9 nm; more preferably, Ra is equal to or less than 0.4 nm and Rms is equal to or less than 0.5 nm; still preferably, Ra is equal to or less than 0.3 nm and Rms is equal to or less than 0.4 nm. For example, Ra is 0.27 nm and Rms is 0.34 nm. In this specification, Ra is arithmetic mean roughness, Rms is root-mean-square roughness, and the measurement range is 2 $\mu m^2$ or 10 $\mu m^2$.

When the formation substrate and the single crystal semiconductor substrate are bonded to each other, a strong bond can be formed by providing an insulating layer which is formed of a silicon oxide film preferably using organosilane as a material on one or both of surfaces which are to be bonded to each other.

Figure 14B:
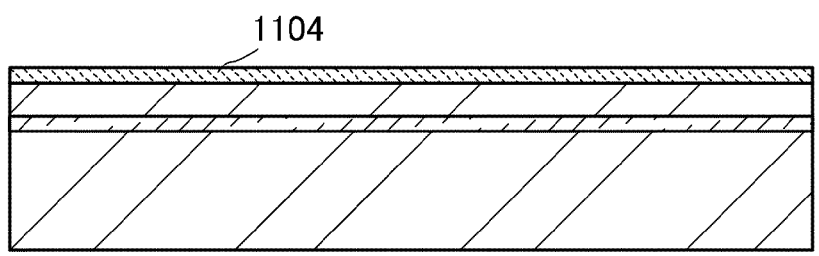

In this embodiment, as illustrated in FIG. 14B, a silicon oxide film is formed as an insulating layer 1104 on the surface which is bonded to the formation substrate. As the silicon oxide film, a silicon oxide film formed by a chemical vapor deposition method using an organosilane gas is preferred. Alternatively, a silicon oxide film formed by a chemical vapor deposition method with use of a silane gas can be used. In film formation by a chemical vapor deposition method, a film formation temperature of, for example, 350° C. or lower (300° C. as a specific example) is applied as the temperature at which degasification does not occur from the weakened layer 1110, which is formed in the single crystal semiconductor substrate. In addition, heat treatment temperature which is higher than the film formation temperature is applied for heat treatment by which the single crystal semiconductor layer is separated from the single crystal semiconductor substrate.

In this embodiment, after a semiconductor element layer is formed over a formation substrate, a separation layer is provided between the formation substrate and the semiconductor element layer to separate the semiconductor element layer from the formation substrate. Accordingly, the single crystal semiconductor layer separated from the single crystal semiconductor substrate and bonded is formed over the separation layer (and the inorganic insulating film) provided over the formation substrate. If the surface of the separation layer is uneven, in a process in which the single crystal semiconductor substrate and the formation substrate are bonded to each other, an area in contact with the bonded surface becomes small, whereby it is difficult to obtain adequate bonding strength. Thus, it is necessary for the separation layer to be planarized.

The separation layer may be formed on the formation substrate side or the single crystal semiconductor substrate side as long as it is provided between the formation substrate and the single crystal semiconductor layer. The separation layer formed on the formation substrate side or the single crystal semiconductor substrate side is subjected to planarization treatment.

The insulating layer may be formed on the formation substrate side or the single crystal semiconductor substrate side. Alternatively, the insulating layer may be provided on the separation layer side, and the insulating layer may be formed on both the formation substrate side and the single crystal semiconductor substrate side. In a case where the formation substrate or the single crystal semiconductor substrate can be bonded to the separation layer directly, the insulating layer is not necessarily provided.

In this embodiment, a separation layer 1125 is formed on the formation substrate 1101 side, and a blocking layer 1109 is formed over the separation layer 1125.

As planarization treatment, polishing treatment or etching treatment may be performed. It is needless to say that both polishing treatment and etching treatment may be performed. As polishing treatment, a chemical mechanical polishing (CMP) method or a liquid jet polishing method can be employed. As etching treatment, wet etching or dry etching, or both of them can be employed as appropriate.

Alternatively, plasma treatment may be performed as planarization treatment. For example, a reverse sputtering method can be employed. By performing planarization treatment by a reverse sputtering method, a procedure from formation of the insulating layer to planarization can be done in the same apparatus, whereby throughput is improved, which is preferable.

A reverse sputtering method is performed by, for example, introducing an inert gas such as an Ar gas to a high vacuum chamber and generating a plasma state by applying an electric field to a surface to be processed. The plasma contains electrons and positive ions of Ar, and the positive ions of Ar are accelerated in the direction of cathode. The surface which is to be processed is sputtered by the positive ions of Ar accelerated. At that time, a projected portion of the surface which is to be processed is preferentially sputtered. Particles ejected from the surface which is to be processed adhere to a different spot in the surface which is to be processed. At that time, the particles preferentially adhere to a depressed portion of the surface which is to be processed. In this manner, by reducing the projected portion and filling the depressed portion, the planarity of the surface which is to be processed can be thought to be improved.

In this embodiment, the separation layer is formed by a sputtering method and subjected to planarization treatment by a reverse sputtering method.

A silicon nitride film or a silicon nitride oxide film which prevents diffusion of an impurity element may be provided as a blocking layer (also referred to as a barrier layer) between the formation substrate and the separation layer. Further, a silicon oxynitride film may be combined as an insulating film having a function of reducing stress.

Figure 14C:
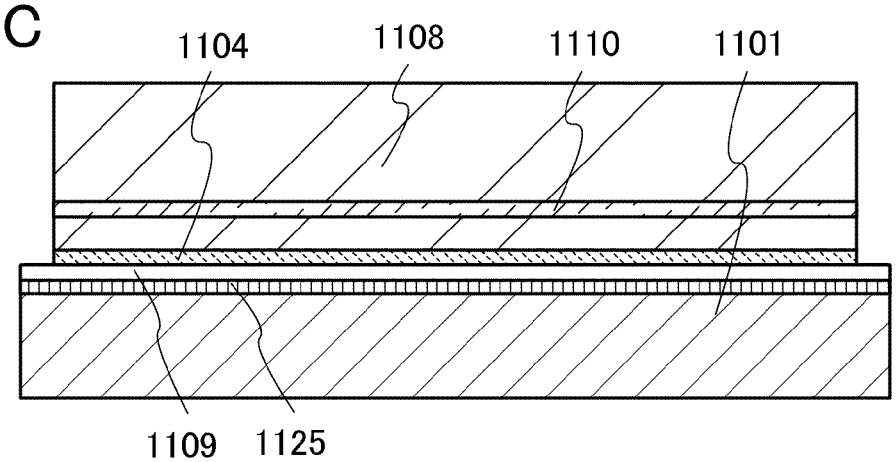

FIG. 14C illustrates a state in which the blocking layer 1109 provided over the formation substrate 1101 and a surface of the single crystal semiconductor substrate 1108, on which the insulating layer 1104 is formed, are disposed in close contact with each other and bonded to each other. Since the blocking layer 1109 is provided over the separation layer 1125 whose surface is planarized, a surface of the blocking layer 1109 has high planarity. A surface which is to form a bond is cleaned sufficiently. The surface of the blocking layer 1109 provided over the formation substrate 1101 and the surface of the single crystal semiconductor substrate 1108, on which the insulating layer 1104 is formed, may be cleaned by megasonic cleaning or the like. In addition, the surfaces may be cleaned with ozone water after megasonic cleaning, an organic substance may be removed, and the hydrophilicity of the surfaces may be improved.

By making the blocking layer 1109 over the formation substrate 1101 and the insulating layer 1104 face each other and applying pressure to one portion from the outside, the blocking layer 1109 and the insulating layer 1104 attract each other by increase in van der Waals forces or influence of hydrogen bonding due to reduction in distance between the bonded surfaces locally. Further, since the distance between the blocking layer 1109 over the formation substrate 1101 and the insulating layer 1104 which also face each other in an adjacent region is reduced, a region in which van der Waals forces strongly act or a region which is influenced by hydrogen bonding is expanded, whereby bonding proceeds to the whole bonded surface.

In applying pressure, pressure at 100 kPa to 5000 kPa is applied to one of the four corners of the substrates, whereby the bonded surfaces become close to each other, and the bonding can shift from Van der Waals force to hydrogen bonding. When the bonded surfaces at the one portion in the substrate comes close, the adjacent bonded surfaces also come close and the bonding shifts to hydrogen bonding; thus, the whole bonded surfaces can have hydrogen bonding.

In order to form a favorable bond, the surface may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such surface treatment makes it easy to form a bond between different kinds of materials even at a temperature of 200° C. to 400° C.

In order to improve bonding strength of a bond interface between the formation substrate and the insulating layer, heat treatment is preferably performed. For example, heat treatment is performed in a temperature condition of 70° C. to 350° C. (e.g., at 200° C. for 2 hours) in an oven, a furnace, or the like.

Figure 14D:
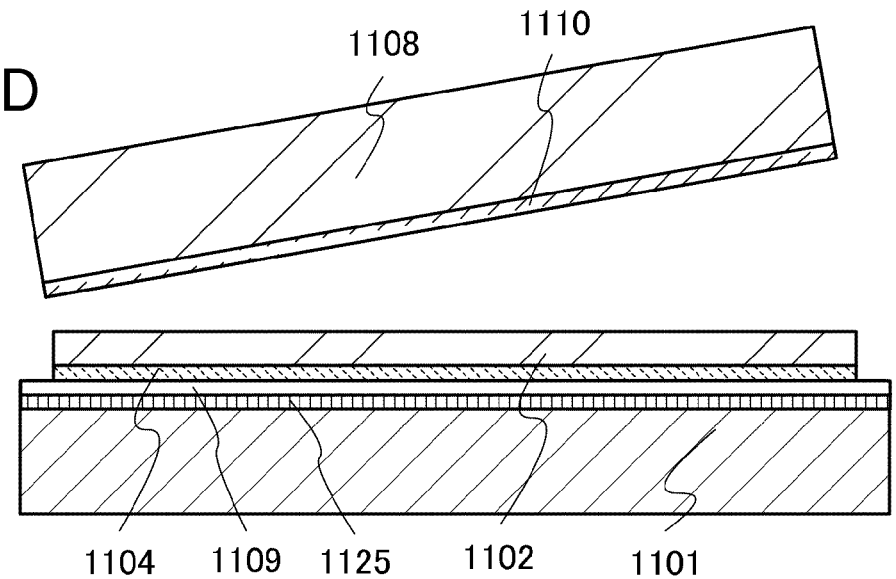

After the formation substrate 1101 and the single crystal semiconductor substrate 1108 are bonded to each other, in FIG. 14D, heat treatment is performed, and the single crystal semiconductor substrate 1108 is separated from the formation substrate 1101 using the weakened layer 1110 serving as a cleavage plane. When heat treatment is performed at, for example, 400° C. to 700° C., a change occurs in the volume of microvoids formed in the weakened layer 1110, which enables cleavage to occur along the weakened layer 1110. Since the insulating layer 1104 is bonded to the formation substrate 1101 with the blocking layer 1109 interposed therebetween, a single crystal semiconductor layer 1102 having the same crystallinity as the single crystal semiconductor substrate 1108 remains on the formation substrate 1101.

Heat treatment in a temperature range of 400° C. to 700° C. may be continuously performed in the same apparatus that is used for the above heat treatment for improving the bonding strength or may be performed in another device. For example, after heat treatment in a furnace at 200° C. for 2 hours, a temperature is increased to near 600° C. and held for 2 hours, a temperature is decreased to a temperature ranging from room temperature to 400° C., and then the substrate is taken out of the furnace. Alternatively, heat treatment may be performed with a temperature increasing from room temperature. Further, after heat treatment in a furnace at 200° C. for 2 hours, heat treatment may be performed at a temperature range of 600° C. to 700° C. for 1 minute to 30 minutes (e.g., at 600° C. for 7 minutes, or at 650° C. for 7 minutes) with a rapid thermal annealing (RTA) apparatus.

By heat treatment in a temperature range of 400° C. to 700° C., the bond between the insulating layer and the formation substrate shifts from hydrogen bonding to covalent bonding, and an element added to the weakened layer is separated out and pressure rises, whereby the single crystal semiconductor layer can be separated from the single crystal semiconductor substrate. After the heat treatment, the formation substrate and the single crystal semiconductor substrate are in a state where one of them is put over the other, and the formation substrate and the single crystal semiconductor substrate can be separated from each other without application of large force. For example, one substrate put over the other substrate is lifted by a vacuum chuck, so that the substrates can be easily separated. At this time, if a substrate on a lower side is fixed with a vacuum chuck or a mechanical chuck, both the formation substrate and the single crystal semiconductor substrate can be separated from each other without horizontal misalignment.

Note that in FIGS. 14A to 14D and FIGS. 15A to 15C, an example is shown in which the single crystal semiconductor substrate 1108 is smaller than the formation substrate 1101;

however, the present invention is not limited thereto, and the single crystal semiconductor substrate 1108 and the formation substrate 1101 may be the same size or the semiconductor substrate 1108 may be larger than the formation substrate 1101.

Figure 15A:
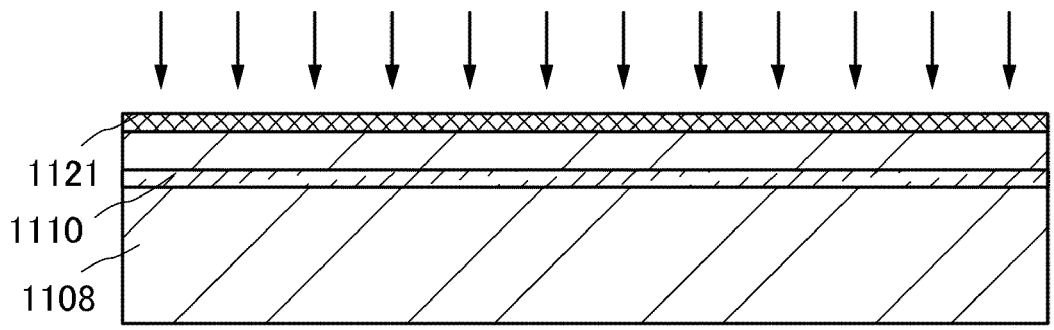
FIGS. 15A to 15C illustrate a method for manufacturing a semiconductor device.
Figure 15B:
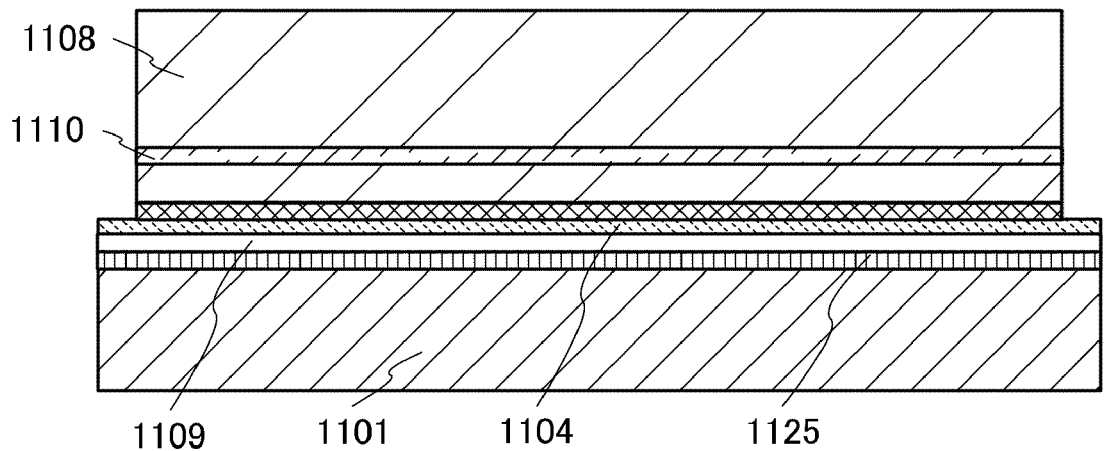
Figure 15C:
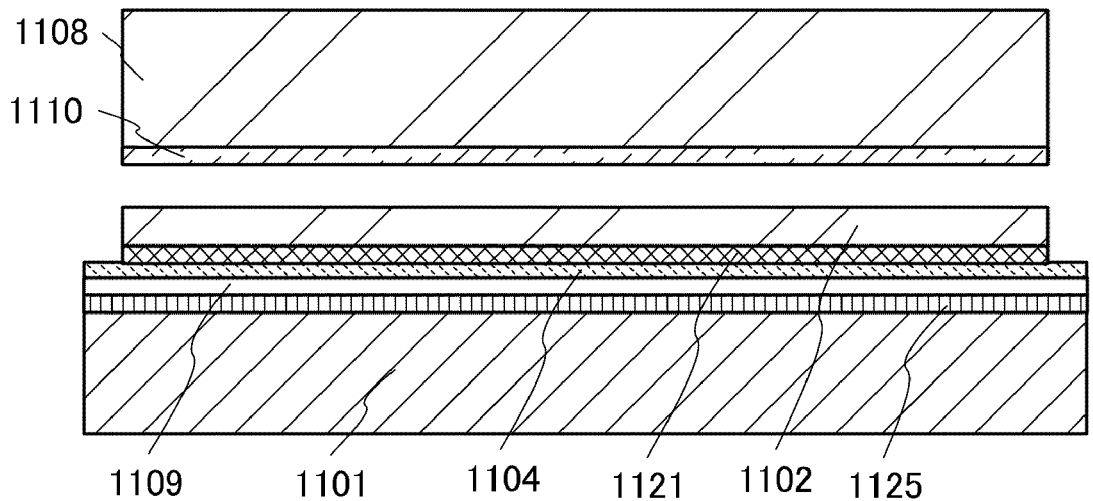

FIGS. 15A to 15C illustrate a process in which an insulating layer is provided on a formation substrate side and a single crystal semiconductor layer is formed. FIG. 15A illustrates a step in which the single crystal semiconductor substrate 1108 provided with a silicon oxide film as a protective layer 1121 is irradiated with ions accelerated by an electric field to form the weakened layer 1110 at a predetermined depth. Irradiation with ions are conducted similarly to the case of FIG. 14A. The protective layer 1121 is formed on the surface of the single crystal semiconductor substrate 1108, so that the surface can be prevented from being damaged by irradiation with the ions and thus impairing planarity. In addition, the protective layer 1121 has an effect of preventing diffusion of impurities with respect to the single crystal semiconductor layer 1102 that is formed from the single crystal semiconductor substrate 1108.

FIG. 15B illustrates a step in which the formation substrate 1101 provided with the blocking layer 1109 and the insulating layer 1104, and the protective layer 1121 of the single crystal semiconductor substrate 1108 are made to be in close contact with and bonded to each other. By arranging the insulating layer 1104 over the formation substrate 1101 in close contact with the protective layer 1121 of the single crystal semiconductor substrate 1108, they are bonded to each other.

After that, the single crystal semiconductor substrate 1108 is separated as illustrated in FIG. 15C. Heat treatment for separating the single crystal semiconductor layer is performed similarly to the case illustrated in FIG. 14D. In such a manner, a semiconductor substrate having an SOI structure in which a single crystal semiconductor layer is provided over the substrate with the insulating layer interposed therebetween illustrated in FIG. 15C can be obtained.

In addition, in the single crystal semiconductor layer separated from the single crystal semiconductor substrate and transferred to the formation substrate, a crystal defect is caused due to the separation step and the ion irradiation step and unevenness may be produced due to impairment of planarity on the surface of the single crystal semiconductor layer in some cases. When a transistor is formed as a semiconductor element using the single crystal semiconductor layer, it is difficult to form a thin gate insulating layer with high withstand voltage over the top surface of the single crystal semiconductor layer with such unevenness. In addition, if the single crystal semiconductor layer has a crystal defect, performance and reliability of the transistor are adversely affected; for example, a localized interface state density with the gate insulating layer is increased.

Therefore, the crystal defect is preferably reduced by irradiation of the single crystal semiconductor layer with an electromagnetic wave such as a laser beam. At least part of a region of the single crystal semiconductor layer is melted by irradiation with electromagnetic waves, and a crystal defect in the single crystal semiconductor layer can be reduced. Note that an oxide film (a native oxide film or a chemical oxide film) formed on the surface of the single crystal semiconductor layer is preferably removed using dilute hydrofluoric acid before irradiation with electromagnetic waves.

Any electromagnetic wave may be used as long as it supplies high energy to the single crystal semiconductor layer, and laser light can be preferably used.

The energy can be supplied mainly by heat conduction which is caused by colliding particles having high energy with the single crystal semiconductor layer by irradiation or the like. As a heat source for supplying the particles having high energy, plasma can be used; normal-pressure plasma, high-pressure plasma, a thermal plasma jet, or a flame of a gas burner or the like can be used. Further, as another example of the heat source, an electron beam or the like can be given.

A wavelength of the electromagnetic wave is set so that it can be absorbed by the single crystal semiconductor layer. The wavelengths can be determined by considering the skin depth of electromagnetic waves or the like. For example, the wavelengths of electromagnetic waves can be 190 nm to 600 nm. In addition, electromagnetic wave energy can be determined in consideration of the wavelengths of electromagnetic waves, the skin depth of electromagnetic waves, the thickness of the single crystal semiconductor layer to be irradiated, or the like.

A laser emitting the laser light can be a continuous wave laser, a pseudo continuous wave laser, or a pulsed laser. A pulsed laser is preferred for partial melting. For example, an excimer laser such as a KrF laser, or a gas laser such as an Ar laser or a Kr laser can be used. In addition, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, and the like can be given. An excimer laser is a pulsed laser, and some solid lasers such as a YAG laser can be used as a continuous laser, a pseudo continuous laser, and a pulsed laser. Note that in a solid-state laser, the second to fifth harmonics of a fundamental wave can be preferably used. In addition, a semiconductor laser such as GaN, GaAs, GaAlAs, InGaAsP, or the like can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. A flash annealing with use of the above lamp light may be used. Since a flash annealing which is performed by preferably using a halogen lamp, a xenon lamp, or the like takes very short treatment time, heating up of the formation substrate can be suppressed.

An optical system including a shutter, a reflector such as a mirror or a half mirror, a cylindrical lens, a convex lens, or the like may be provided to adjust the shape or path of electromagnetic waves.

Note that, as for an irradiation method of electromagnetic waves, electromagnetic waves may be selectively emitted, or light (electromagnetic waves) is scanned in the XY directions so that light (electromagnetic waves) can be emitted. In this case, a polygon mirror or a galvanometer mirror is preferably used in the optical system.

Irradiation with electromagnetic waves can be performed in an atmosphere which contains oxygen such as an atmospheric atmosphere or in an inert atmosphere such as a nitrogen atmosphere. To perform irradiation with electromagnetic waves in an inert atmosphere, irradiation with electromagnetic waves may be performed in an airtight chamber, and an atmosphere in this chamber may be controlled. In the case where a chamber is not used, a nitrogen atmosphere can be formed by spraying an inert gas such as a nitrogen gas or the like on a surface to be irradiated with electromagnetic waves.

Further, polishing treatment may be performed on the surface of the single crystal semiconductor layer which is supplied with high energy such as irradiation of an electromagnetic wave to reduce a crystal defect. By the polishing treatment, the planarity of the surface of the single crystal semiconductor layer can be increased.

As the polishing treatment, a chemical mechanical polishing (CMP) method or a liquid jet polishing method can be employed. Note that the surface of the single crystal semiconductor layer is cleaned and purified before polishing treatment. The cleaning may be performed by megasonic cleaning, two-fluid jet cleaning, or the like; and dust or the like of the surface of the single crystal semiconductor layer is removed by cleaning. In addition, it is preferable to remove a native oxide film or the like on the surface of the single crystal semiconductor layer by using dilute hydrofluoric acid to expose the single crystal semiconductor layer.

In addition, polishing treatment (or etching treatment) may be performed on the surface of the single crystal semiconductor layer before irradiation with electromagnetic waves.

Further, performance of a step (a semiconductor substrate reprocessing process) of using the separated single crystal semiconductor substrate repeatedly can make the cost to be reduced.

Further, when a single crystal semiconductor layer is transferred from a single crystal semiconductor substrate, the single crystal semiconductor substrate may be selectively etched, and a plurality of single crystal semiconductor layers whose shapes are processed may be transferred to a formation substrate. Thus, a plurality of island-shaped single crystal semiconductor layers can be formed over the formation substrate. Since the single crystal semiconductor layers whose shapes are processed in advance are transferred, there is no particularly limitation on the size and shape of the single crystal semiconductor substrate. Accordingly, the single crystal semiconductor layers can be more efficiently transferred to a large-sized formation substrate.

Furthermore, the single crystal semiconductor layer bonded to the formation substrate is etched to process and modify the shape of the single crystal semiconductor layer, so that the single crystal semiconductor layer is precisely controlled. Accordingly, the single crystal semiconductor layer can be processed into the shape of a semiconductor element, and error in a formation position and a defect in the shape of the single crystal semiconductor layer due to pattern misalignment caused by light going around a resist mask in light exposure for forming the resist mask, positional misalignment caused by a bonding step in transferring the single crystal semiconductor layer, or the like can be modified.

Alternatively, after the single crystal semiconductor layer is separated from the single crystal semiconductor substrate, the single crystal semiconductor layer may be bonded to the formation substrate. Bonding may be performed in such a manner that a surface of the single crystal semiconductor layer, which is exposed by cleavage, faces the formation substrate side, or the single crystal semiconductor layer may be bonded over the formation substrate so that a surface of the single crystal semiconductor layer, which is exposed by cleavage, is in contact with a gate insulating film.

In this embodiment, when a single crystal silicon substrate is used as the single crystal semiconductor substrate 1108, a single crystal silicon layer can be obtained as the single crystal semiconductor layer 1102. Further, in the method for manufacturing a semiconductor device of this embodiment, the process temperature can be set to 700° C. or lower; therefore, a glass substrate can be used as the formation substrate 1101. That is, as is the case of conventional thin film transistors, a transistor can be formed over a glass substrate and a single crystal silicon layer can be used for the semiconductor layer. These make it possible to form a transistor with high performance and high reliability, which can operate at high speed with a low consumption voltage and have a low sub-threshold value and a high field-effect mobility can be formed over a formation substrate such as a glass substrate.

This embodiment can be freely combined with any of Embodiments 1 to 6 as appropriate.

Embodiment 8

In this embodiment, an example of a semiconductor device having higher reliability will be described. Specifically, as examples of the semiconductor device, examples of a microprocessor and a semiconductor device which has an arithmetic function and can transmit and receive data without contact are described.

Figure 12:
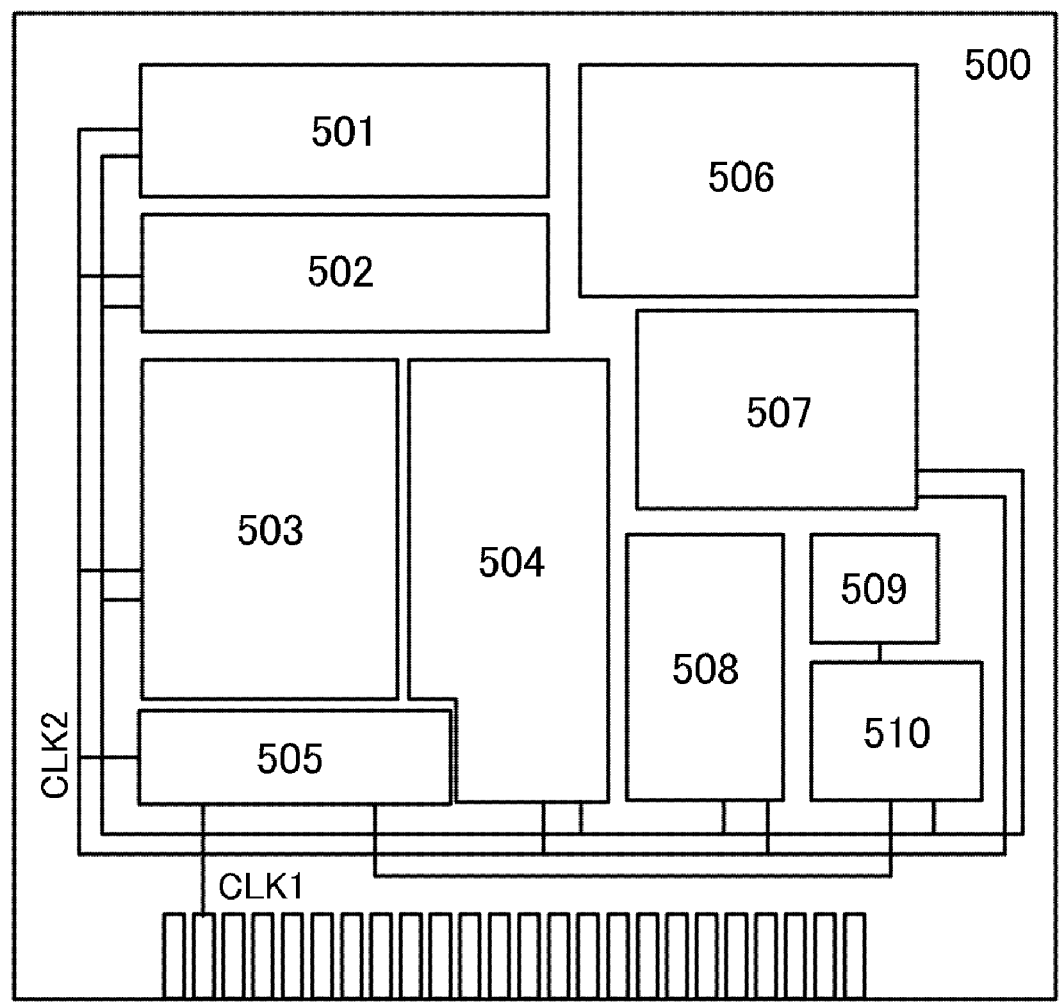
FIG. 12 is a block diagram illustrating a structure of a microprocessor which can be obtained using a semiconductor device.

FIG. 12 illustrates an example of a microprocessor 500 as a structure of a semiconductor device. This microprocessor 500 is formed using a semiconductor device formed in accordance with the above embodiments. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform respective controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 illustrated in FIG. 12 is just an example of the simplified structure, and practical microprocessors have a variety of structures depending on usage.

Figure 13:
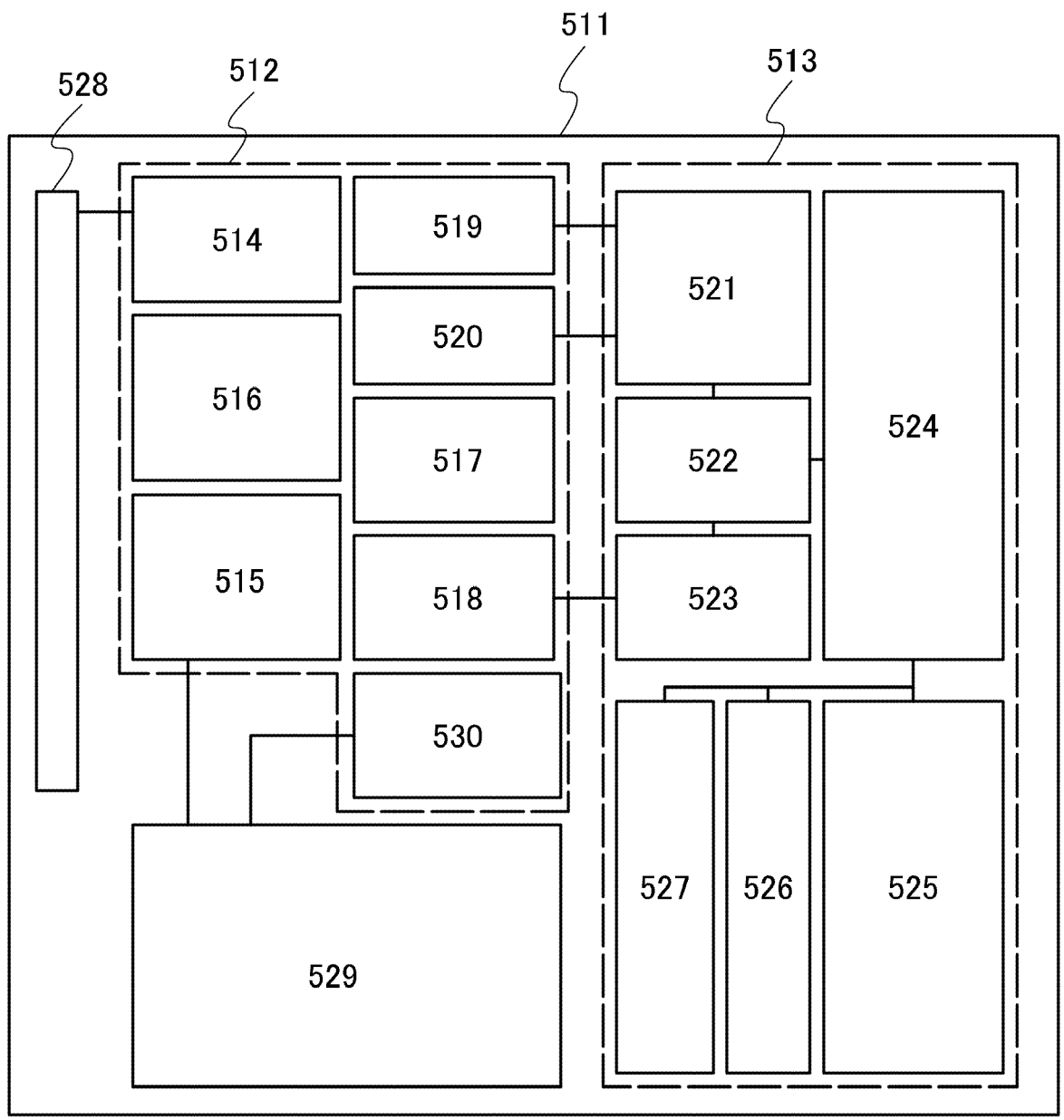
FIG. 13 is a block diagram illustrating a structure of an RFCPU which can be obtained using a semiconductor device.

Next, an example of a semiconductor device which has an arithmetic function and can transmit and receive data without contact is described with reference to FIG. 13. FIG. 13 illustrates an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially constitutes the RFCPU 511.

The reset circuit 517 generates a signal that resets the digital circuit portion 513 to be initialized. For example, a signal which rises with a delay to a rise of the power supply voltage is generated as a reset signal. The oscillator circuit 518 changes the frequency and the duty ratio of a clock signal in accordance with a control signal generated by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, a method can be employed in which a part of process is conducted in the circuit dedicated to arithmetic and the other part of the arithmetic process is conducted by the central processing unit 525 using a program.

In the microprocessor of this embodiment, a highly reliable semiconductor device which has strength while reduction in thickness and size is achieved can be provided with use of a pair of impact resistance layers which sandwiches a semiconductor integrated circuit, and an impact diffusion layer which is stacked on the semiconductor integrated circuit.

Embodiment 9

In this embodiment, an example of usage modes of the semiconductor device described in the above embodiments will be described. Specifically, an application example of a semiconductor device to/from which data can be input/output without contact is described with reference to drawings. The semiconductor device capable of inputting and outputting data without contact is also referred to as an RFID tag, an ID tag, an IC tag, an IC chip, an RF tag, a wireless tag, an electronic tag, or a wireless chip.

Figure 10:
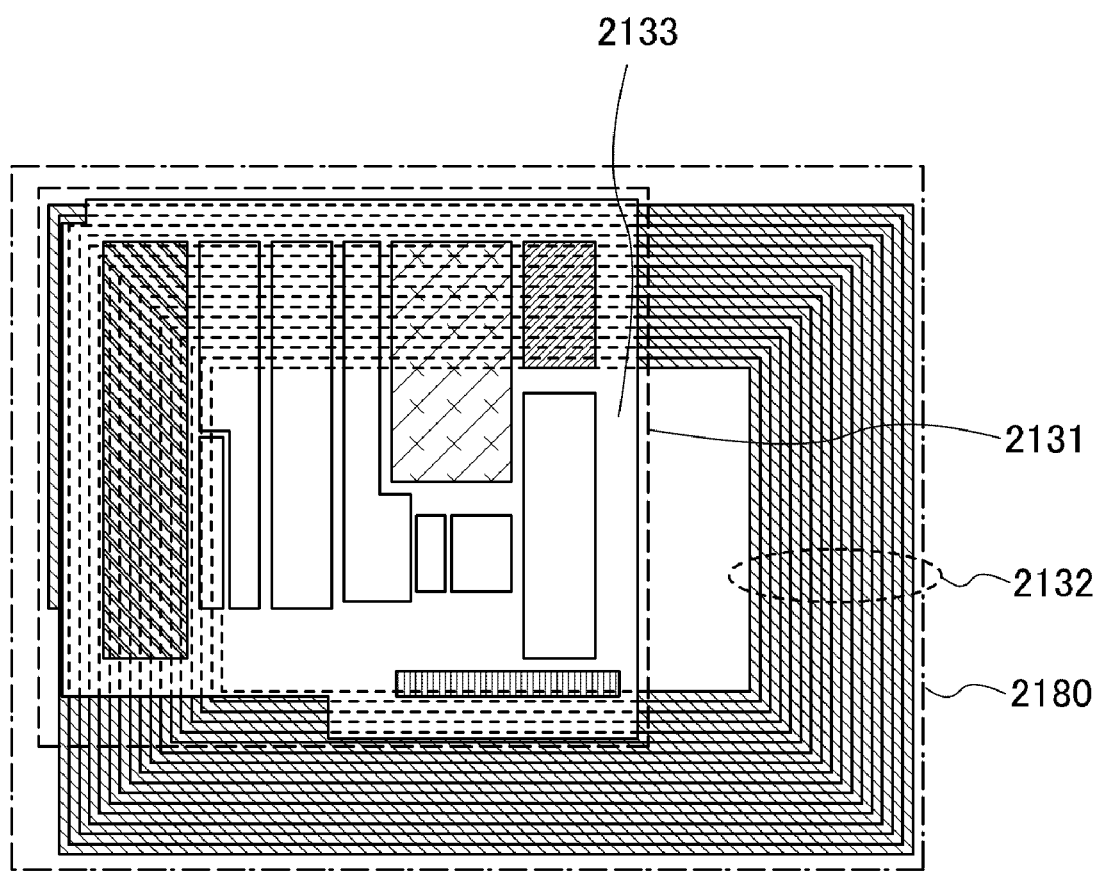
FIG. 10 illustrates a semiconductor device.

An example of a top surface structure of a semiconductor device illustrated in this embodiment is described with reference to FIG. 10. A semiconductor device 2180 illustrated in FIG. 10 includes a thin film integrated circuit 2131 including a plurality of elements such as transistors that constitute a memory portion and a logic portion, and a conductive layer 2132 serving as an antenna. The conductive layer 2132 serving as an antenna is electrically connected to the thin film integrated circuit 2131. The transistor described in Embodiment 2 can be applied to the thin film integrated circuit 2131. The conductive layer serving as an antenna may be formed above or below the thin film integrated circuit. The conductive layer serving as an antenna may be provided on an outer side of an impact resistance layer. Alternatively, the conductive layer 2132 serving as an antenna may be provided for a substrate 2133 and then the substrate 2133 and the thin film integrated circuit 2131 may be attached to each other so as to interpose the conductive layer 2132 therebetween. A connection terminal of the thin film integrated circuit 2131 and the conductive layer serving as an antenna may be electrically connected to each other through conductive particles contained in an adhesive resin. Alternatively, the present invention can be applied to a semiconductor device provided with a booster antenna which can convert a frequency of a radio wave without contact between an antenna electrically connected to the thin film integrated circuit and an interrogator.

As a semiconductor element, not to mention a field-effect transistor, a memory element which uses a semiconductor layer can be employed; accordingly, a semiconductor device which can meet functions required for diverse applications can be manufactured and provided.

Note that although the example in which the conductive layer 2132 serving as an antenna is provided in the shape of a coil and either an electromagnetic induction method or an electromagnetic coupling method is employed is described in this embodiment, the semiconductor device of the present invention is not limited thereto, and a microwave method may also be employed. In the case of a microwave method, the shape of the conductive layer 2132 serving as an antenna may be decided as appropriate depending on the wavelength of an electromagnetic wave.

For example, when the microwave method (e.g., with an UHF band (in the range of 860 MHz to 960 MHz), a frequency band of 2.45 GHz, or the like) is employed as the signal transmission method of the semiconductor device, the shape, e.g., the length, of the conductive layer serving as an antenna may be set as appropriate in consideration of the wavelength of an electromagnetic wave used in transmitting a signal. For example, the conductive layer serving as an antenna can be formed into a linear shape (e.g., a dipole antenna) or a flat shape (e.g., a patch antenna or an antenna having a ribbon shape). Further, the shape of the conductive layer 2132 serving as an antenna is not limited to a line, and the conductive layer in the shape of a curved line, in an S-shape, or in a shape combining them may be provided as well in consideration of the wavelength of the electromagnetic wave.

The conductive layer serving as an antenna is formed using a conductive material by a CVD method, a sputtering method, a printing method such as screen printing or gravure printing, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material mainly including the aforementioned element, and a single-layer structure or a layered structure may be employed.

For example, when the conductive layer 2132 serving as an antenna is formed by a screen printing method, it can be provided by selective printing with a conductive paste in which conductive particles with a grain diameter of several nm to several tens of μm are dissolved or dispersed in an organic resin. As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin contained in the conductive paste, one or more selected from organic resins serving as a binder of metal particles, a solvent, a dispersing agent and a coating material can be used. Typically, an organic resin such as an epoxy resin, a silicone resin, and the like can be given. Further, in forming the conductive layer, it is preferable to bake the conductive paste after being provided. For example, in the case of using fine particles (e.g., with a grain diameter of from 1 nm through 100 nm) mainly containing silver as a material of the conductive paste, the conductive layer can be formed by baking the conductive paste at a temperature in the range of 150° C. to 300° C. to be hardened. Also, fine particles containing solder, or lead-free solder as their main component may be used, and in this case, fine particles, the size of which is 20 μm or less is preferably used. Solder and lead-free solder have an advantage of being low cost.

The semiconductor device to which the present invention is applied can be a high reliable semiconductor device which has strength while reduction in thickness and size is achieved can be provided with use of a pair of impact resistance layers which sandwich a semiconductor integrated circuit, and an impact diffusion layer which is stacked on the semiconductor integrated circuit. Therefore, the semiconductor device to which the present invention is applied is effective in the case of forming a small semiconductor device to/from which data can be input/output without contact as described in this embodiment.

Embodiment 10

In this embodiment, an application example of the above-described semiconductor device capable of inputting/outputting data without contact, which is formed in accordance with the present invention, will be described. The semiconductor device which can input and output data without contact is also referred to as an RFID tag, an ID tag, an IC tag, an IC chip, an RF tag, a wireless tag, an electronic tag, or a wireless chip depending on application modes.

Figure 11A:
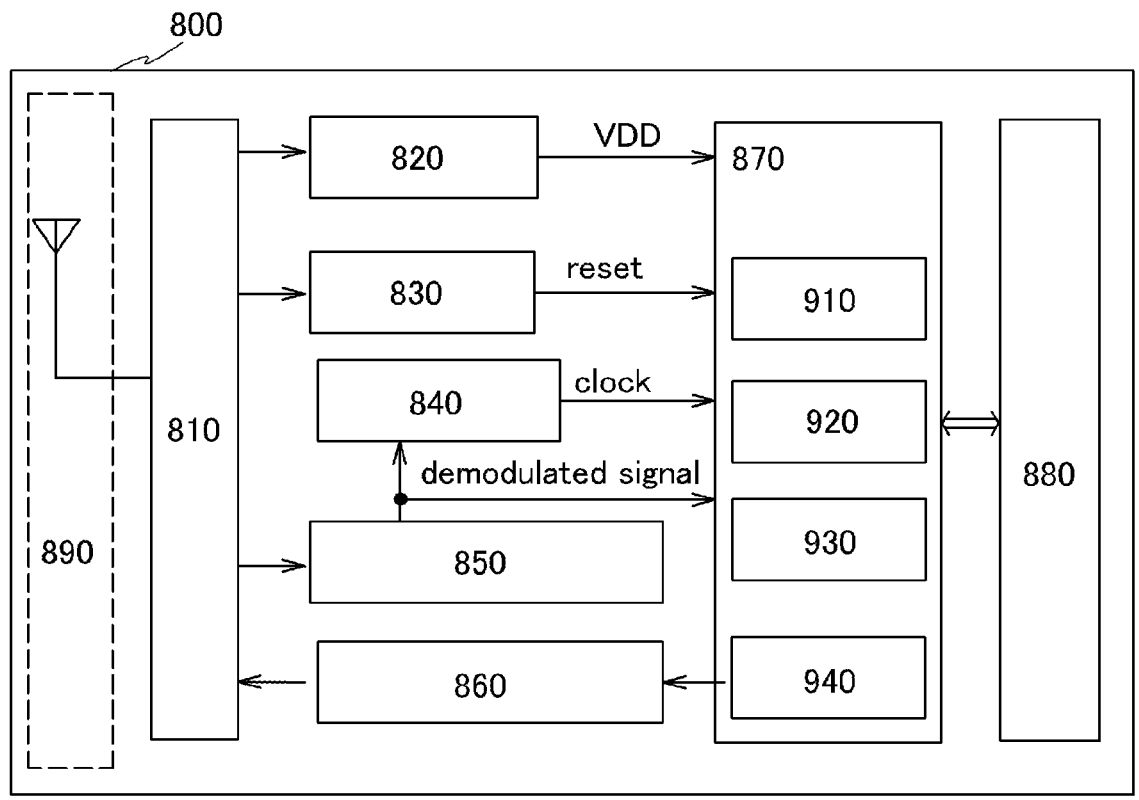
FIGS. 11A to 11C illustrate a semiconductor device.

A semiconductor device 800, which has a function of exchanging data wirelessly, includes a high frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (see FIG. 11A). The high-frequency circuit 810 receives a signal from the antenna 890 and outputs a signal, which is received from the data modulation circuit 860, with the antenna 890. The power supply circuit 820 generates power supply potential from a received signal. The reset circuit 830 generates a reset signal. The clock generator circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. As the control circuit 870, for example, a code extracting circuit 910, a code judging circuit 920, a CRC judging circuit 930, and an output unit circuit 940 are provided. Note that the code extracting circuit 910 extracts each of a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit in the semiconductor device 800. A signal transmitted to the data demodulation circuit 850 through the high-frequency circuit 810 is demodulated (hereinafter, this signal is referred to as a demodulated signal). Moreover, signals and the demodulated signal passed through the reset circuit 830 and the clock generation circuit 840 through the high-frequency circuit 810 are transmitted to the control circuit 870. The signals transmitted to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulating circuit 860 and then is transmitted by the antenna 890 as a wireless signal. Note that low power supply potential (hereinafter referred to as VSS) is common in the plurality of circuits included in the semiconductor device 800 and VSS can be GND.

In this manner, data in the semiconductor device 800 can be read by transmitting a signal to the semiconductor device 800 from a communication device and by receiving a signal which is transmitted from the semiconductor device 800 by the communication device.

Moreover, in the semiconductor device 800, power supply voltage may be supplied to each circuit by electromagnetic waves without mounting a power supply (battery), or a power supply (battery) may be mounted so that power supply voltage is supplied to each circuit by both electromagnetic waves and the power supply (battery).

Figure 11B:
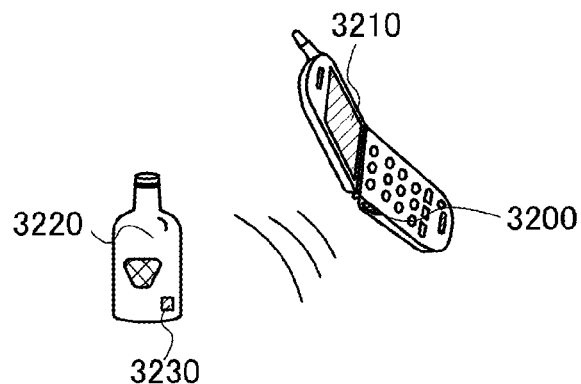
Figure 11C:
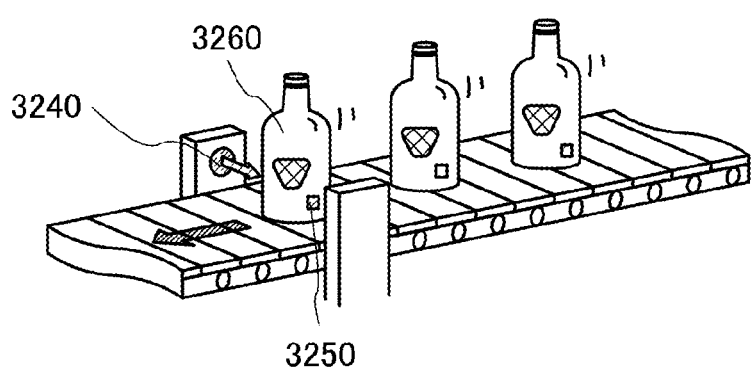

Next, an example of usage of a semiconductor device in which data can be inputted/outputted without contact is described. A communication device 3200 is provided for a side surface of a mobile terminal which includes a display portion 3210. A semiconductor device 3230 is provided for a side surface of a product 3220 (FIG. 11B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 which is provided for the product 3260 (FIG. 11C). In this manner, information can be easily obtained, and high functions and high added values are realized by utilizing a semiconductor device for a system.

As described above, a highly reliable semiconductor device of the present invention has a very wide range of application and can be used in electronic devices in all kinds of fields.

Embodiment 11

According to the present invention, a semiconductor device serving as a chip having a processor circuit (hereinafter also called a processor chip, a wireless chip, a wireless processor, a wireless memory, or a wireless tag) can be formed. The application range of the semiconductor device of the present invention is so wide that it may be applied to any object in order that the history thereof is revealed wirelessly and utilized in production, management, and the like. For example, the semiconductor device of the present invention may be incorporated in bills, coins, securities, certificates, bearer bonds, containers for packages, books, recording media, personal belongings, vehicles, foods, clothes, healthcare items, livingware, medicals, and electronic apparatuses. These examples will be described with reference to FIGS. 9A to 9G.

The bills and coins are money that circulates in the market, and includes one that can be used in the same way as money in a specific area (cash voucher), a commemorative coin, and the like. The securities include checks, certificates, promissory notes, and the like, and can be provided with a chip 190 including a processor circuit (see FIG. 9A). The certificates refer to driver's licenses, certificates of residence, and the like, and can be provided with a chip 191 including a processor circuit (see FIG. 9B). The personal belongings include bags, a pair of glasses, and the like, and can be provided with a chip 197 including a processor circuit (see FIG. 9C). Bearer bonds refer to stamps, rice coupons, various merchandise coupons, and the like. Packing containers refer to wrapping paper for food containers, plastic bottles, and the like and can be provided with a chip 193 having a processor circuit (see FIG. 9D). The books refer to hardbacks, paperbacks, and the like, and can be provided with a chip 194 including a processor circuit (see FIG. 9E). The recording media refer to DVD software, video tapes, and the like, and can be provided with a chip 195 including a processor circuit (see FIG. 9F). Vehicles refer to wheeled vehicles such as bicycles, ships, and the like, and can be provided with a chip 196 having a processor circuit (see FIG. 9G). The groceries indicate foods, beverages, and the like. The garments indicate clothes, shoes, and the like. The health products indicate a medical apparatus, a health appliance, and the like. The daily commodities indicate furniture, lighting apparatus, and the like. The medicines indicate a drug, an agricultural chemical, and the like. The electronic devices indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belonging, the food, the clothing, the commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Note that this embodiment can be implemented in combination with any of Embodiments 1 to 10 as appropriate.

This application is based on Japanese Patent Application serial no. 2008-114882 filed with Japan Patent Office on Apr. 25, 2008 and Japanese Patent Application serial no. 2008-114883 filed in Japan Patent Office on Apr. 25, 2008, the entire contents of which are hereby incorporated by reference.

EXPLANATION OF REFERENCE

100: semiconductor integrated circuit, 101: antenna, 102: second impact resistance layer, 103: second impact diffusion layer, 104: adhesive layer, 105: inorganic insulating layer, 110: substrate, 111: separation layer, 112: first impact resistance layer, 113: first impact diffusion layer, 114: adhesive layer, 150: fibrous body, 151: organic resin, 160: fibrous body, 161: organic resin, 190: chip, 191: chip, 193: chip, 194: chip, 195: chip, 196: chip, 197: chip, 200: substrate, 201: separation layer, 205: gate insulating layer, 206: channel formation region, 207: gate insulating layer, 208: gate electrode layer, 210: transistor, 211: transistor, 212: insulating film, 213: insulating film, 214: insulating layer, 226: channel formation region, 227: gate insulating layer, 228: gate electrode layer, 250: semiconductor integrated circuit, 252: second impact resistance layer, 253: second impact diffusion layer, 254: adhesive layer, 262: first impact resistance layer, 263: first impact diffusion layer, 264: adhesive layer, 270: fibrous body, 271: organic resin, 280: fibrous body, 281: organic resin, 300: substrate, 301: separation layer, 302: insulating film, 303: semiconductor layer, 304: semiconductor layer, 305: semiconductor layer, 306: semiconductor layer, 308: gate insulating layer, 309: gate insulating layer, 310: insulating film, 311: charge accumulation layer, 312: gate electrode layer, 313: gate electrode layer, 315: control gate electrode layer, 316: gate electrode layer, 317: gate electrode layer, 318: gate electrode layer, 319: control gate electrode layer, 320: impurity element, 321: mask, 323: channel formation region, 324: impurity element, 325: mask, 329: channel formation region, 330: channel formation region, 331: channel formation region, 350: semiconductor integrated circuit, 367: insulating film, 368: insulating film, 373: thin film transistor, 374: thin film transistor, 375: memory element, 376: thin film transistor, 380: conductive layer, 381: inorganic insulating layer, 382: first impact resistance layer, 383: fibrous body, 384: organic resin, 385: second impact resistance layer, 386: fibrous body, 387: organic resin, 388: second impact diffusion layer, 389: adhesive layer, 390: insulating layer, 391: first impact diffusion layer, 500: microprocessor, 501: arithmetic logic unit, 502: ALU controller, 503: instruction decoder, 504: interrupt controller, 505: a timing controller, 506: register, 507: register controller, 508: bus interface, 509: read only memory, 510: memory interface, 511: RFCPU, 512: analog circuit portion, 513: digital circuit portion, 514: resonance circuit, 515: rectifier circuit, 516: constant voltage circuit, 517: reset circuit, 518: oscillator circuit, 519: demodulation circuit, 520: modulation circuit, 521: RF interface, 522: control register, 523: clock controller, 524: CPU interface, 525: central processing unit, 526: random access memory, 527: read only memory, 528: antenna, 529: capacitor portion, 530: power supply control circuit, 800: semiconductor device, 810: high-frequency circuit, 820: power supply circuit, 830: reset circuit, 840: clock generator circuit, 850: data demodulation circuit, 860: data modulation circuit, 870: control circuit, 880: memory circuit, 890: antenna, 910: code extracting circuit, 920: code judging circuit, 930: CRC judging circuit, 940: output unit circuit, 1101: formation substrate, 1102: single crystal semiconductor layer, 1104: insulating layer, 1108: single crystal semiconductor substrate, 1109: blocking layer, 1110: weakened layer, 1121: protective layer, 1125: separation layer, 204*a*: source and drain region, 205*a*: impurity region, 205*b*: impurity region, 209*a*: insulating layer, 209*b*: insulating layer, 210*a*: wiring layer, 210*b*: wiring layer, 2131: thin film integrated circuit, 2132: conductive layer, 2133: substrate, 2180: semiconductor device, 224*a*: source or drain region, 224*b*: source or drain region, 225*a*: impurity region, 225*b*: impurity region, 229*a*: insulating layer, 229*b*: insulating layer, 230*a*: wiring layer, 230*b*: wiring layer, 3200: communication device, 3210: display portion, 3220: product, 322*a*: p-type impurity region, 322*b*: p-type impurity region, 3230: semiconductor device, 3240: communication device, 3250: semiconductor device, 3260: product, 326*a*: n-type impurity region, 326*b*: n-type impurity region, 362*a*: n-type impurity region, 362*b*: n-type impurity region, 364*a*: n-type impurity region, 364*b*: n-type impurity region, 369*a*: wiring layer, 369*b*: wiring layer, 370*a*: wiring layer, 370*b*: wiring layer, 371*a*: wiring layer, 371*b*: wiring layer, 372*a*: wiring layer, 372*b*: wiring layer

The invention claimed is:

1. A semiconductor device comprising:
a semiconductor integrated circuit between a first layer and a second layer;
a first organic layer between the semiconductor integrated circuit and the first layer; and
an antenna between the semiconductor integrated circuit and the second layer,
wherein the first layer comprises a fibrous body and an organic resin,
wherein the second layer comprises a fibrous body and an organic resin, and
wherein the first organic layer has a lower modulus of elasticity and higher breaking strength than the first layer and the second layer.

2. The semiconductor device according to claim 1, further comprising:
an adhesive layer between the semiconductor integrated circuit and a second organic layer.

3. The semiconductor device according to claim 1, further comprising:
a second organic layer on a side opposite to a side where the semiconductor integrated circuit is provided, of the second layer,
wherein the second organic layer has a lower modulus of elasticity and higher breaking strength than the first layer and the second layer.

4. The semiconductor device according to claim 1, wherein the first organic layer is a film having rubber elasticity.

5. The semiconductor device according to claim 1, wherein the first organic layer is an aramid film.

6. The semiconductor device according to claim 1, wherein a thickness of the first organic layer is from 5 μm to 20 μm.

7. The semiconductor device according to claim 1, further comprising an inorganic insulating layer provided between the antenna and the second layer.

8. The semiconductor device according to claim 1,
wherein the first layer has a structure body in which the fibrous body is impregnated with the organic resin, and
wherein the second layer has a structure body in which the fibrous body is impregnated with the organic resin.

9. A semiconductor device comprising:
a semiconductor integrated circuit between a first impact resistance layer and a second impact resistance layer;
a first impact diffusion layer between the semiconductor integrated circuit and the second impact resistance layer; and
an antenna between the semiconductor integrated circuit and the second impact resistance layer,
wherein the first impact diffusion layer has a lower modulus of elasticity and higher breaking strength than the first impact resistance layer and the second impact resistance layer.

10. The semiconductor device according to claim 9, further comprising:
an adhesive layer between the semiconductor integrated circuit and the second impact diffusion layer.

11. The semiconductor device according to claim 9, further comprising:
a second impact diffusion layer on a side opposite to a side where the semiconductor integrated circuit is provided, of the second impact resistance layer,
wherein the second impact diffusion layer has a lower modulus of elasticity and higher breaking strength than the first impact resistance layer and the second impact resistance layer.

12. The semiconductor device according to claim 9, wherein the first impact diffusion layer is a film having rubber elasticity.

13. The semiconductor device according to claim 9, wherein the first impact diffusion layer is an aramid film.

14. The semiconductor device according to claim 9, wherein a thickness of the first impact diffusion layer is from 5 μm to 20 μm.

15. The semiconductor device according to claim 9, wherein an inorganic insulating layer is provided between the antenna and the second impact resistance layer.

16. The semiconductor device according to claim 9, wherein the first impact resistance layer has a structure body in which a fibrous body is impregnated with an organic resin, and
wherein the second impact resistance layer has a structure body in which a fibrous body is impregnated with an organic resin.

17. The semiconductor device according to claim 16, wherein the fibrous body is a woven fabric or a nonwoven fabric.

18. The semiconductor device according to claim 16, wherein the fibrous body is formed using one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

19. The semiconductor device according to claim 16, wherein the organic resin comprises a thermosetting resin or a thermoplastic resin.

20. The semiconductor device according to claim 19, the thermosetting resin is at least one from the group consisting of an epoxy resin, an unsaturated polyester resin, a polyimide resin, a bismaleimide-triazine resin, and a cyanate resin.

21. The semiconductor device according to claim 19, wherein the thermoplastic resin is at least one from the group consisting of a polyphenylene oxide resin, a polyetherimide resin, and a fluorine resin.

22. The semiconductor device according to claim 15, the inorganic insulating layer is a silicon nitride film.

23. A method for manufacturing a semiconductor device comprising the steps of:
forming a semiconductor integrated circuit over a substrate with a separation layer interposed between the substrate and the semiconductor integrated circuit;
forming an antenna over the semiconductor integrated circuit;
bonding a first impact resistance layer to the antenna circuit;
separating the semiconductor integrated circuit from the substrate;
bonding a second impact resistance layer and a first impact diffusion layer; and
bonding the first impact diffusion layer to the semiconductor integrated circuit,
wherein the first impact diffusion layer has a lower modulus of elasticity and higher breaking strength than the first impact resistance layer and the second impact resistance layer.

24. The method for manufacturing a semiconductor device according to claim 23,
wherein the first impact resistance layer is bonded to the antenna by a heat and pressure treatment, and
wherein the second impact resistance layer is bonded to the first impact diffusion layer by a heat and pressure treatment.

25. The method for manufacturing a semiconductor device according to claim 23, wherein a film having rubber elasticity is used as the first impact diffusion layer.

26. The method for manufacturing a semiconductor device according to claim 23, further comprising:
bonding a second impact diffusion layer to the first impact resistance layer after bonding the first impact resistance layer to the antenna,
wherein the second impact diffusion layer has a lower modulus of elasticity and higher breaking strength than the first impact resistance layer and the second impact resistance layer.

27. The method for manufacturing a semiconductor device according to claim 23, wherein an inorganic insulating layer is formed over the antenna, and the second impact resistance layer is bonded over the inorganic insulating layer.

28. The method for manufacturing a semiconductor device according to claim 23,
wherein a structure body in which a fibrous body is impregnated with an organic resin is used for the first impact resistance layer, and
wherein a structure body in which a fibrous body is impregnated with an organic resin is used for the second impact resistance layer.

29. The method for manufacturing a semiconductor device according to claim 27, wherein a silicon nitride film is formed as the inorganic insulating layer.

30. A method for manufacturing a semiconductor device comprising the steps of:
forming a semiconductor integrated circuit over a substrate with a separation layer interposed between the substrate and the semiconductor integrated circuit;
forming an antenna over the semiconductor integrated circuit;
forming a first impact resistance layer over the antenna;
forming a first impact diffusion layer over the first impact resistance layer;
bonding the semiconductor integrated circuit, the first impact resistance layer, and the first impact diffusion layer to each other by a heat treatment and pressure treatment;
separating the semiconductor integrated circuit from the substrate;
bonding a second impact resistance layer and a second impact diffusion layer by a heat and pressure treatment; and
bonding the second impact diffusion layer to the semiconductor integrated circuit,
wherein the first impact diffusion layer and the second impact diffusion layer have a lower modulus of elasticity and higher breaking strength than the first impact resistance layer and the second impact resistance layer.

31. A method for manufacturing a semiconductor device comprising the steps of:
forming a semiconductor integrated circuit over a substrate with a separation layer interposed between the substrate and the semiconductor integrated circuit;
forming an antenna over the semiconductor integrated circuit;
bonding a first layer to the antenna wherein the first layer has a structure body in which a fibrous body is impregnated with an organic resin;
separating the semiconductor integrated circuit from the substrate;
bonding a second layer and an organic layer wherein the second layer has a structure body in which a fibrous body is impregnated with an organic resin; and
bonding the organic layer to the semiconductor integrated circuit,
wherein the organic layer has a lower modulus of elasticity and higher breaking strength than the first layer and the second layer.

32. The semiconductor device according to claim 1, wherein each of the fibrous body in the first layer and the fibrous body in the second layer comprises an inorganic compound.

33. The semiconductor device according to claim 9, wherein the first impact resistance layer comprises an organic resin and a fibrous body comprising an inorganic compound,
wherein the second impact resistance layer comprises an organic resin and a fibrous body comprising an inorganic compound.

34. The method for manufacturing a semiconductor device according to claim 23, wherein the first impact resistance layer comprises an organic resin and a fibrous body comprising an inorganic compound,
wherein the second impact resistance layer comprises an organic resin and a fibrous body comprising an inorganic compound.

35. The method for manufacturing a semiconductor device according to claim 30, wherein the first impact resistance layer comprises an organic resin and a fibrous body comprising an inorganic compound,
wherein the second impact resistance layer comprises an organic resin and a fibrous body comprising an inorganic compound.

36. The method for manufacturing a semiconductor device according to claim 31, wherein each of the fibrous body in the first layer and the fibrous body in the second layer comprises an inorganic compound.

37. The semiconductor device according to claim 1, wherein the semiconductor integrated circuit comprises a thin film transistor.

38. The semiconductor device according to claim 9, wherein the semiconductor integrated circuit comprises a thin film transistor.

39. The method for manufacturing a semiconductor device according to claim 23, wherein the semiconductor integrated circuit comprises a thin film transistor.

40. The method for manufacturing a semiconductor device according to claim 30, wherein the semiconductor integrated circuit comprises a thin film transistor.

41. The method for manufacturing a semiconductor device according to claim 31, wherein the semiconductor integrated circuit comprises a thin film transistor.

* * * * *